United States Patent
Lin et al.

(10) Patent No.: US 8,519,552 B2
(45) Date of Patent: Aug. 27, 2013

(54) CHIP STRUCTURE

(75) Inventors: Mou-Shiung Lin, Hsin-Chu (TW); Chiu-Ming Chou, Kao-hsiung (TW)

(73) Assignee: Megica Corporation, Hsinchu (TW)

( * ) Notice: Subject to any disclaimer, the term of this patent is extended or adjusted under 35 U.S.C. 154(b) by 216 days.

(21) Appl. No.: 13/207,346

(22) Filed: Aug. 10, 2011

(65) Prior Publication Data
US 2011/0291272 A1   Dec. 1, 2011

Related U.S. Application Data

(63) Continuation of application No. 11/178,753, filed on Jul. 11, 2005, now Pat. No. 8,022,544.

(60) Provisional application No. 60/586,840, filed on Jul. 9, 2004.

(30) Foreign Application Priority Data

Aug. 12, 2004 (TW) ............... 93124492 A
Dec. 10, 2004 (TW) ............... 93138329 A

(51) Int. Cl.
*H01L 23/50* (2006.01)

(52) U.S. Cl.
USPC ............ 257/786; 257/E23.145; 257/E23.151

(58) Field of Classification Search
None
See application file for complete search history.

(56) References Cited

U.S. PATENT DOCUMENTS

| | | |
|---|---|---|
| 3,668,484 A | 6/1972 | Greig et al. |
| 4,051,508 A | 9/1977 | Sato |
| 4,685,998 A | 8/1987 | Quinn |
| 4,789,647 A | 12/1988 | Peters |
| 4,825,276 A | 4/1989 | Kobayashi |
| 5,046,161 A | 9/1991 | Takada |
| 5,061,985 A | 10/1991 | Meguro et al. |
| 5,083,187 A | 1/1992 | Lamson et al. |
| 5,226,232 A | 7/1993 | Boyd |
| 5,244,833 A | 9/1993 | Gansauge et al. |
| 5,293,071 A | 3/1994 | Erdos |
| 5,310,699 A | 5/1994 | Chikawa |
| 5,384,488 A | 1/1995 | Golshan |
| 5,468,984 A | 11/1995 | Efland et al. |
| 5,508,561 A | 4/1996 | Tago |

(Continued)

FOREIGN PATENT DOCUMENTS

| | | |
|---|---|---|
| EP | 1536469 | 6/2005 |
| JP | 02213147 A | 8/1990 |

(Continued)

OTHER PUBLICATIONS

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

(Continued)

*Primary Examiner* — Wensing Kuo

(74) *Attorney, Agent, or Firm* — Seyfarth Shaw LLP

(57) ABSTRACT

A chip structure includes a semiconductor substrate, an interconnecting metallization structure, a passivation layer, a circuit layer and a bump. The interconnecting metallization structure is over the semiconductor substrate. The passivation layer is over the interconnecting metallization structure. The circuit layer is over the passivation layer. The bump is on the circuit layer, and the bump is unsuited for being processed using a reflow process.

21 Claims, 36 Drawing Sheets

(56) References Cited

U.S. PATENT DOCUMENTS

| | | |
|---|---|---|
| 5,532,512 A | 7/1996 | Fillion |
| 5,534,465 A | 7/1996 | Frye |
| 5,631,499 A | 5/1997 | Hosomi |
| 5,659,201 A * | 8/1997 | Wollesen .................. 257/758 |
| 5,665,989 A | 9/1997 | Dangelo |
| 5,691,248 A | 11/1997 | Cronin |
| 5,726,502 A | 3/1998 | Beddingfield |
| 5,767,010 A | 6/1998 | Mis et al. |
| 5,792,594 A | 8/1998 | Brown |
| 5,795,818 A | 8/1998 | Marrs |
| 5,834,844 A | 11/1998 | Akagawa |
| 5,838,067 A | 11/1998 | Baek |
| 5,854,513 A | 12/1998 | Kim |
| 5,883,435 A | 3/1999 | Geffken |
| 5,892,273 A | 4/1999 | Iwasaki |
| 5,952,726 A | 9/1999 | Liang |
| 5,994,766 A | 11/1999 | Shenoy |
| 6,011,314 A | 1/2000 | Leibovitz |
| 6,013,571 A | 1/2000 | Morrell |
| 6,016,013 A | 1/2000 | Baba |
| 6,022,792 A | 2/2000 | Ishii |
| 6,075,290 A | 6/2000 | Schaefer et al. |
| 6,077,726 A | 6/2000 | Mistry |
| 6,107,180 A | 8/2000 | Munroe et al. |
| 6,144,100 A | 11/2000 | Shen |
| 6,177,731 B1 | 1/2001 | Ishida |
| 6,181,569 B1 | 1/2001 | Chakravorty |
| 6,184,143 B1 | 2/2001 | Ohashi |
| 6,187,680 B1 | 2/2001 | Costrini |
| 6,229,711 B1 | 5/2001 | Yoneda |
| 6,251,501 B1 | 6/2001 | Higdon et al. |
| 6,281,452 B1 | 8/2001 | Prasad et al. |
| 6,287,893 B1 | 9/2001 | Elenius et al. |
| 6,288,447 B1 | 9/2001 | Amishiro |
| 6,300,250 B1 | 10/2001 | Tsai |
| 6,359,328 B1 | 3/2002 | Dubin |
| 6,362,087 B1 | 3/2002 | Wang |
| 6,375,062 B1 | 4/2002 | Higdon et al. |
| 6,380,061 B1 | 4/2002 | Kobayashi et al. |
| 6,383,916 B1 | 5/2002 | Lin |
| 6,426,281 B1 | 7/2002 | Lin |
| 6,429,120 B1 | 8/2002 | Ahn |
| 6,472,745 B1 | 10/2002 | Iizuka |
| 6,479,900 B1 | 11/2002 | Shinogi |
| 6,495,442 B1 | 12/2002 | Lin |
| 6,518,092 B2 | 2/2003 | Kikuchi |
| 6,578,754 B1 | 6/2003 | Tung |
| 6,605,528 B1 | 8/2003 | Lin |
| 6,613,663 B2 | 9/2003 | Furuya |
| 6,614,091 B1 | 9/2003 | Downey |
| 6,639,299 B2 | 10/2003 | Aoki |
| 6,642,136 B1 | 11/2003 | Lee et al. |
| 6,646,347 B2 | 11/2003 | Mercado |
| 6,653,563 B2 | 11/2003 | Bohr |
| 6,680,544 B2 | 1/2004 | Lu |
| 6,683,380 B2 | 1/2004 | Efland |
| 6,706,554 B2 | 3/2004 | Ogura |
| 6,707,124 B2 | 3/2004 | Wachtler |
| 6,707,159 B1 | 3/2004 | Kumamoto |
| 6,756,295 B2 | 6/2004 | Lin |
| 6,756,664 B2 | 6/2004 | Yang |
| 6,762,115 B2 | 7/2004 | Lin |
| 6,762,122 B2 | 7/2004 | Mis |
| 6,780,748 B2 | 8/2004 | Yamaguchi |
| 6,791,178 B2 | 9/2004 | Yamaguchi |
| 6,802,945 B2 | 10/2004 | Liu |
| 6,853,076 B2 | 2/2005 | Datta |
| 6,853,078 B2 | 2/2005 | Yamaya et al. |
| 6,861,740 B2 | 3/2005 | Hsu |
| 6,940,169 B2 | 9/2005 | Jin |
| 6,943,440 B2 | 9/2005 | Kim |
| 6,963,136 B2 | 11/2005 | Shinozaki et al. |
| 6,977,435 B2 | 12/2005 | Kim et al. |
| 7,045,899 B2 | 5/2006 | Yamane |
| 7,078,822 B2 | 7/2006 | Dias |
| 7,220,657 B2 | 5/2007 | Ihara |
| 7,239,028 B2 | 7/2007 | Anzai |
| 7,420,276 B2 | 9/2008 | Lin |
| 7,452,803 B2 | 11/2008 | Lin |
| 7,465,654 B2 | 12/2008 | Chou |
| 7,470,997 B2 | 12/2008 | Lin |
| 7,547,969 B2 | 6/2009 | Chou |
| 8,022,544 B2 | 9/2011 | Lin et al. |
| 2001/0026954 A1 | 10/2001 | Takao |
| 2001/0040290 A1 | 11/2001 | Sakurai |
| 2001/0051426 A1 | 12/2001 | Pozder |
| 2002/0016079 A1 | 2/2002 | Dykstra et al. |
| 2002/0043723 A1 | 4/2002 | Shimizu |
| 2002/0079576 A1 | 6/2002 | Seshan |
| 2002/0100975 A1 | 8/2002 | Kanda |
| 2002/0158334 A1 | 10/2002 | Vu |
| 2003/0006062 A1 | 1/2003 | Stone |
| 2003/0008133 A1 | 1/2003 | Paik et al. |
| 2003/0020163 A1 | 1/2003 | Hung et al. |
| 2003/0052409 A1 | 3/2003 | Matsuo et al. |
| 2003/0080416 A1 | 5/2003 | Jorger et al. |
| 2003/0102551 A1 | 6/2003 | Kikuchi |
| 2003/0127730 A1 | 7/2003 | Weng |
| 2003/0168733 A1 | 9/2003 | Hashimoto |
| 2003/0218246 A1 | 11/2003 | Abe |
| 2004/0007779 A1 | 1/2004 | Arbuthnot |
| 2004/0023450 A1 | 2/2004 | Katagiri |
| 2004/0040855 A1 | 3/2004 | Batinovich |
| 2004/0048202 A1 | 3/2004 | Lay et al. |
| 2004/0070042 A1 | 4/2004 | Lee et al. |
| 2004/0089951 A1 * | 5/2004 | Lin .................. 257/773 |
| 2004/0130020 A1 | 7/2004 | Kuwabara et al. |
| 2004/0145052 A1 | 7/2004 | Ueno et al. |
| 2004/0188839 A1 | 9/2004 | Ohtsuka et al. |
| 2006/0076678 A1 | 4/2006 | Kim et al. |
| 2008/0284037 A1 | 11/2008 | Andry |

FOREIGN PATENT DOCUMENTS

| | | |
|---|---|---|
| JP | 10-275811 | 10/1998 |
| JP | 11274200 A | 10/1999 |
| JP | 11354579 A | 12/1999 |
| JP | 2000036515 A | 2/2000 |
| JP | 2000-183090 | 6/2000 |
| JP | 2000-228420 | 8/2000 |
| JP | 2000-228423 | 8/2000 |
| JP | 2003031727 A | 1/2003 |
| JP | 2003229451 A | 8/2003 |
| JP | 2004193301 A | 7/2004 |
| TW | 419765 B | 1/2001 |
| TW | 483045 B | 4/2002 |
| TW | 490803 B | 6/2002 |
| TW | 498529 B | 8/2002 |
| TW | 506025 B | 10/2002 |
| TW | 511243 B | 11/2002 |
| TW | 515016 B | 12/2002 |
| TW | 517334 B | 1/2003 |
| TW | 518700 B | 1/2003 |
| TW | 519707 | 2/2003 |

OTHER PUBLICATIONS

Edelstein, D.C., "Advantages of Copper Interconnects," Proceedings of the 12th International IEEE VLSI Multilevel Interconnection Conference (1995) pp. 301-307.

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High Volume Manufacturing," Electronic Components and Technology Conference (2006) pp. 1611-1615.

Hu, C-K. et al. "Copper-Polyimide Wiring Technology for VLSI Circuits," Materials Research Society Symposium Proceedings VLSI V (1990) pp. 369-373.

Roesch, W. et al. "Cycling copper flip chip interconnects," Microelectronics Reliability, 44 (2004) pp. 1047-1054.

Lee, Y-H. et al. "Effect of ESD Layout on the Assembly Yield and Reliability," International Electron Devices Meeting (2006) pp. 1-4.

Yeoh, T-S. "ESD Effects on Power Supply Clamps," Proceedings of the 6th International Symposium on Physical & Failure Analysis of Integrated Circuits (1997) pp. 121-124.

Edelstein, D. et al. "Full Copper Wiring in a Sub-0.25 pm CMOS ULSI Technology," Technical Digest IEEE International Electron Devices Meeting (1997) pp. 773-776.

Venkatesan, S. et al. "A High Performance 1.8V, 0.20 pm CMOS Technology with Copper Metallization," Technical Digest IEEE International Electron Devices Meeting (1997) pp. 769-772.

Jenei, S. et al. "High Q Inductor Add-on Module in Thick Cu/SiLK™ single damascene," Proceedings from the IEEE International Interconnect Technology Conference (2001) pp. 107-109.

Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.

Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.

Kumar, R. et al. "A Family of 45nm IA Processors," IEEE International Solid-State Circuits Conference, Session 3, Microprocessor Technologies, 3.2 (2009) pp. 58-59.

Bohr, M. "The New Era of Scaling in an SoC World," International Solid-State Circuits Conference (2009) Presentation Slides 1-66.

Bohr, M. "The New Era of Scaling in an SoC World," International Solid-State Circuits Conference (2009) pp. 23-28.

Ingerly, D. et al. "Low-K Interconnect Stack with Thick Metal 9 Redistribution Layer and Cu Die Bump for 45nm High Volume Manfacturing," International Interconnect Technology Conference (2008) pp. 216-218.

Kurd, N. et al. "Next Generation Intel® Micro-architecture (Nehalem) Clocking Architecture," Symposium on VLSI Circuits Digest of Technical Papers (2008) pp. 62-63.

Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.

Geffken, R. M. "An Overview of Polyimide Use in Integrated Circuits and Packaging," Proceedings of the Third International Symposium on Ultra Large Scale Integration Science and Technology (1991) pp. 667-677.

Luther, B. et al. "Planar Copper-Polyimide Back End of the Line Interconnections for ULSI Devices," Proceedings of the 10th International IEEE VLSI Multilevel Interconnection Conference (1993) pp. 15-21.

Master, R. et al. "Ceramic Mini-Ball Grid Array Package for High Speed Device," Proceedings from the 45th Electronic Components and Technology Conference (1995) pp. 46-50.

Maloney, T. et al. "Stacked PMOS Clamps for High Voltage Power Supply Protection," Electrical Overstress/Electrostatic Discharge Symposium Proceedings (1999) pp. 70-77.

Lin, M.S. et al. "A New System-on-a-Chip (SOC) Technology—High Q Post Passivation Inductors," Proceedings from the 53rd Electronic Components and Technology Conference (May 30, 2003) pp. 1503-1509.

MEGIC Corp. "MEGIC way to system solutions through bumping and redistribution," (Brochure) (Feb. 6, 2004) pp. 1-3.

Lin, M.S. "Post Passivation Technology™—MEGIC® Way to System Solutions," Presentation given at TSMC Technology Symposium, Japan (Oct. 1, 2003) pp. 1-32.

Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

* cited by examiner

CHIP STRUCTURE

This application is a continuation of U.S. application Ser. No. 11/178,753, filed Jul. 11, 2005, now U.S. Pat. No. 8,022,544, which claims priority to U.S. Provisional Patent Application No. 60/586,840, filed on Jul. 9, 2004, which claims the benefit of earlier filing date and right of priority to Taiwanese Application Nos. 093138329, filed on Dec. 10, 2004, and 093124492, filed on Aug. 12, 2004.

RELATED PATENT APPLICATION

This application is related to U.S. patent application Ser. No. 11/178,541, filed on Jul. 11, 2005, now U.S. Pat. No. 7,465,654, assigned to a common assignee, which is herein incorporated by reference in its entirety.

BACKGROUND OF THE INVENTION

1. Field of the Invention

This invention relates to a semiconductor chip. More particularly, this invention relates to a semiconductor chip with metal circuit layers and bumps.

2. Description of the Related Art

Due to the advances that have been made in the information technology industry, it is no longer difficult to get quickly the information faraway. To achieve this goal, information technology companies with great competition produce more efficient products. With the evolution of the information industry, the latest generation of IC chips has, overall, a greater number of functions than before. Due to the improvements in the semi-conductor technology, the improvement in the production capacity of copper manufacturing process and to innovative circuitry designs, the majority of signal transmissions can be made within a single IC chip. However, this development has led to decreased functional efficiency in such chips.

Regarding the package for the liquid crystal display panel, multiple gold bumps are generally formed on the driver IC chip, and then multiple inner leads of a flexible TAB substrate is connected to the gold bumps. The method for bonding the inner leads to the gold bumps may include Gold-to-Gold eutectic bonding or Gold-to-Tin solder bonding. The gold bumps on the driver IC chip can be bonded to the gold layer or tin layer formed on the inner leads.

Alternatively, the gold bump can be pressed into the anisotropic conductive paste (ACP) or the anisotropic conductive film (ACF) after the anisotropic conductive paste (ACP) or the anisotropic conductive film (ACF) is formed over a glass substrate or thin film substrate. The driver IC chip can be electrically connected to the glass substrate or thin film substrate via the metal particles gathered in the anisotropic conductive paste (ACP) or the anisotropic conductive film (ACF).

In the prior art, there is no circuit lines formed over a passivation layer of the driver chip for the above-mentioned electronic package.

SUMMARY OF THE INVENTION

The objective of the invention is to provide a chip structure with a metal circuit layer formed over the passivation layer and functioning as signal transmission, power plane or ground plane, which makes the space employment over the passivation layer more efficiently.

In order to reach the above objectives, the present invention provides a chip structure comprising a semiconductor substrate, an interconnecting metallization structure, a passivation layer, a circuit layer and a bump. The interconnecting metallization structure is over the semiconductor substrate. The passivation layer is over the interconnecting metallization structure. The circuit layer is over the passivation layer. The bump is on the circuit layer, and the bump is unsuited for being processed using a reflow process.

In order to reach the above objectives, the present invention provides a chip structure comprising a semiconductor substrate, an interconnecting metallization structure, a passivation layer, a circuit layer and a bump. The interconnecting metallization structure is over the semiconductor substrate. The passivation layer is over the interconnecting metallization structure, wherein an opening is in the passivation layer and exposes a contact point of the interconnecting metallization structure. The circuit layer is over the passivation layer. The bump is on the contact point.

The accompanying drawings are included to provide a further understanding of the invention, and are incorporated as a part of this specification. The drawings illustrate embodiments of the invention and, together with the description, serve to explain the principles of the invention.

DESCRIPTION OF THE PREFERRED EMBODIMENTS

The following paragraph discloses a chip structure with a metal circuit layer formed over the passivation layer and functioning as signal transmission, power plane or ground plane, which makes the space employment over the passivation layer more efficiently.

First Embodiment

In the first embodiment, the metal circuit layer is placed over the passivation layer and the bump is placed over the metal circuit layer. This embodiment has several applications, as is illustrated in the following.

1. Application to Intra-Chip Signal Transmission

Figure 1:
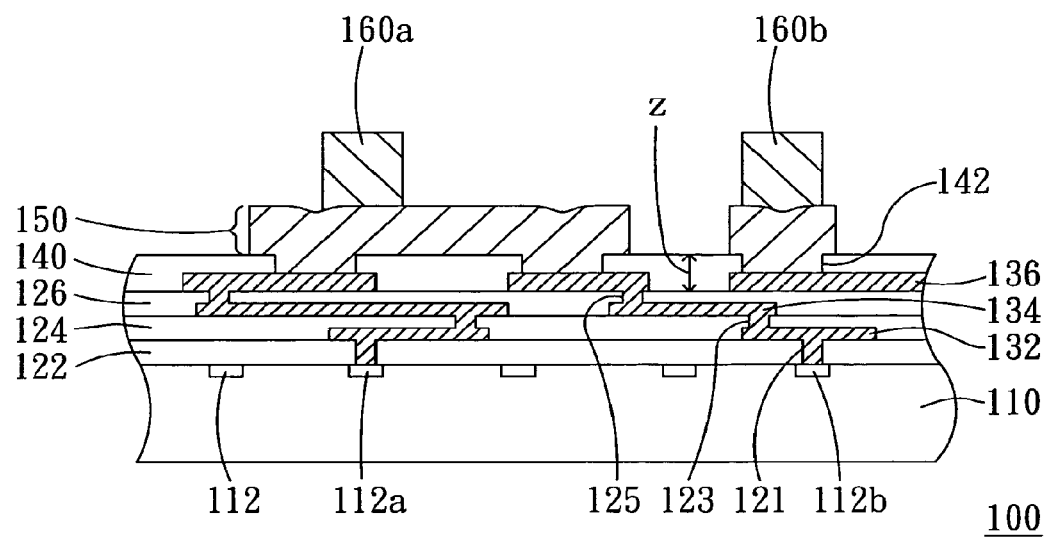
FIGS. 1 and 2 are schematic cross-sectional figures showing chip structures or wafer structures according to a first embodiment, wherein the metal circuit layer is used for intra-chip signal transmission.
Figure 2:
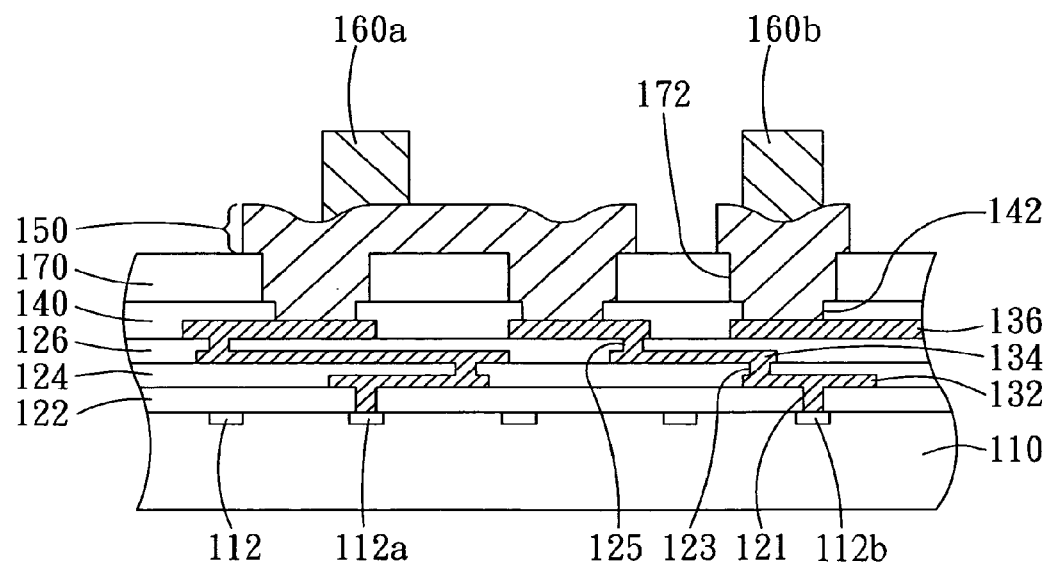

FIGS. 1-2 are schematic cross-sectional figure showing the chip structures or wafer structures according to a first embodiment of the present invention. The metal circuit layer 150, for example, is used for intra-chip signal transmission. The chip structure or wafer structure 100 comprises a semiconductor substrate 110, a plurality of thin film dielectric layers 122, 124 and 126, a plurality of thin film fine line metal layers 132, 134 and 136, and a passivation layer 140. The chip structure is obtained after sawing the wafer structure.

The semiconductor substrate 110 comprises a plurality of electronic devices 112 formed in or on the semiconductor substrate 110. The semiconductor substrate 110, for example, is a silicon substrate or GaAs substrate. A plurality of electronic devices 112, such as transistors, MOS devices or passive devices, are formed in or on the semiconductor substrate 110 by doping the dopant with either penta-valence or tri-valence ions, for example, boron ions or phosphorous ions.

The thin film dielectric layers 122, 124 and 126 is formed over the semiconductor substrate 100. The thin film dielectric layer is composed of materials, for example, silicon oxide, silicon nitride, or oxynitride. The thin film fine line metal layers 132, 134 and 136 are respectively formed on one of the thin film dielectric layers 122, 124 and 126. The thin film fine line metal layers 132, 134 and 136 may include aluminum, an aluminum-copper alloy or an aluminum-silicon alloy formed by a sputter process. Alternatively, the thin film fine line metal layers 132, 134 and 136 may include copper formed by a damascene process. The thin film dielectric layers 122, 124 and 126 comprise a plurality of conductive via holes 121, 123 and 125. The thin film fine line metal layers 132, 134 and 136 are connected to each other and to the electronic devices 112 via the conductive via holes 121, 123 and 125 in the thin film dielectric layers 122, 124 and 126.

The passivation layer 140 is formed over the thin film dielectric layers 122, 124 and 126 and the thin film fine line metal layers 132, 134 and 136. The passivation layer 140 has a thickness, preferably, thicker than about 0.3 µm. The passivation layer 140 is composed of a silicon-oxide layer, a silicon-nitride layer, a phosphosilicate glass (PSG) layer, or a composite structure comprising the above-mentioned layers. The passivation layer 140 comprises one or more insulating layers, such as silicon-nitride layer or silicon-oxide layer, formed by CVD processes. In a case, a silicon-nitride layer with a thickness of between 0.2 and 1.2 µm is formed over a silicon-oxide layer with a thickness of between 0.1 and 0.8 µm. Generally, the passivation layer 140 comprises a topmost silicon-nitride layer or a topmost silicon-nitride layer in the finished chip structure. The passivation layer 140 comprises a topmost CVD insulating layer in the finished chip structure. Multiple openings 142 in the passivation layer 140 expose the topmost thin film fine line metal layer 136. The passivation layer 140 prevents the penetration of mobile ions, such as sodium ions, moisture, transition metals, such as gold, silver, copper, and so on, and other contaminations. The passivation layer 140 is used to protect the underlying devices, such as transistors, MOS devices, polysilicon resistors, poly-to-poly capacitors, and fine-line metal interconnections.

A metal circuit layer 150 is formed over the passivation layer 140 and electrically connected to the thin film fine line metal layer 136 through the opening 142 in the passivation layer 140. The metal circuit layer 150 includes a circuit line (at left side) connecting multiple pads of the thin film fine line metal layer 136. A signal may be transmitted from one of the electronic devices, such as 112a, to the circuit line of the metal circuit layer 150 sequentially through the thin film fine line metal layers 132, 134 and 136 and then through one of the openings 142 in the passivation layer 140. Next, the signal may be transmitted from the circuit line of the metal circuit layer 150 to the other one of the electronic devices, such as 112b, through another one of the openings 142 in the passivation layer 140 and then sequentially through the thin film fine line metal layers 136, 134 and 132. As mentioned above, the circuit line at the left side of the metal circuit layer 150 can be used for intra-chip signal transmission.

Multiple bumps 160a and 160b are built over the metal circuit layer 150. The bumps 160a and 160b may comprise a principal material, such as gold, not suitable for being processed using a reflow process. Alternatively, the bumps 160a and 160b may comprise a principal material, such as a tin-lead alloy, a tin-silver-copper alloy, a tin-silver alloy or other soldering materials, suitable for being processed using a reflow process. Via the bump 160a, a signal, such as address signal, data signal, clock signal, logic signal or analog signal, output from the electronic device 112a can be transmitted to an external circuit component. Via the bump 160b, the chip structure 100 can transmit or receive a signal to or from the external circuit component. The external circuit component is a flexible or hard printed circuit board, a glass substrate, a thin film substrate or a TAB substrate, for example.

In FIG. 1, the metal circuit layer 150 is formed over and in touch with the passivation layer 140. Alternatively, the metal circuit layer 150 can be formed over and separate from the passivation layer 140, with a polymer layer 170 formed between the passivation layer 140 and the metal circuit layer 150, as showed in FIG. 2. Multiple openings 172, substantially aiming at the openings 142 in the passivation layer 140, are formed in the polymer layer 170. The metal circuit layer 150 formed over the polymer layer 170 is connected to the thin film fine line metal layer 136 through the openings 172 in the polymer layer 170 and the openings 142 in the passivation layer 140. The polymer layer 170 can be made of polyimide (PI), benzocyclobutene (BCB), parylene, porous dielectric material, or elastomer, for example.

2. Application to Redistribution Layout

Figure 3:
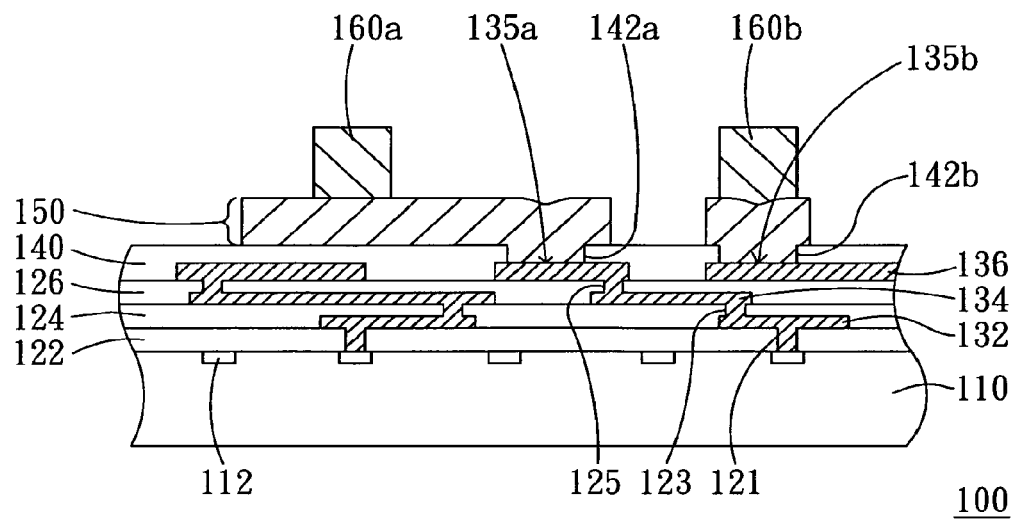
FIGS. 3 and 4 are schematic cross-sectional figures showing chip structures or wafer structures according to a first embodiment, wherein the metal circuit layer is used for a redistribution layout.
Figure 4:
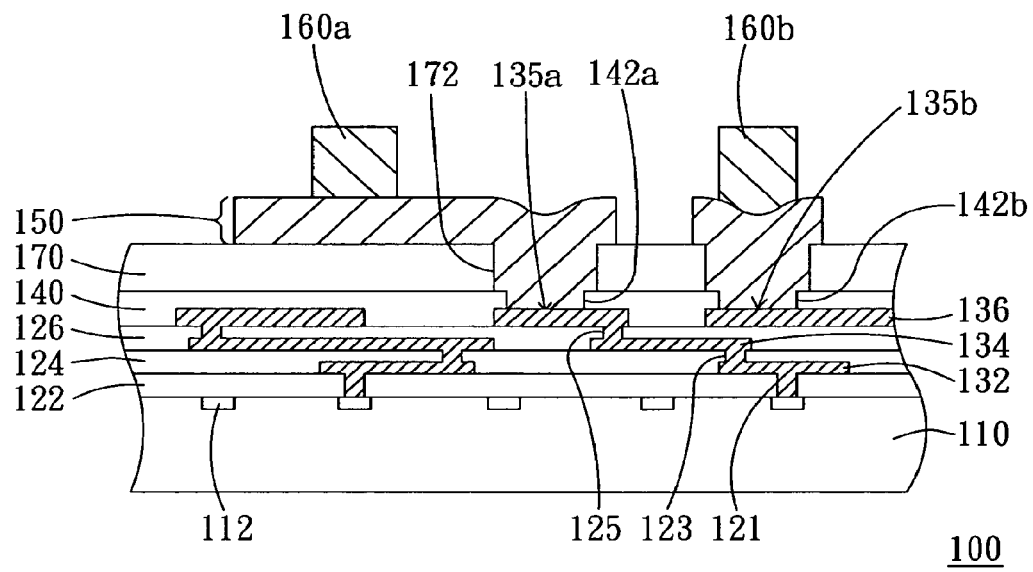

FIGS. 3-4 are schematic cross-sectional figures showing chip structures according to a first embodiment of the present invention, wherein a circuit line of the metal circuit layer 150 is used for redistribution layout. The components below the passivation layer 140 of the chip structure 100 of FIGS. 3-4 are similar to those in FIGS. 1-2. The identical reference numbers in FIGS. 1-4 represent same or similar elements. The elements shown in FIGS. 3-4 with the same reference numbers as those shown in FIGS. 1-2 can refer to the above explanation for the corresponding same ones in FIGS. 1-2. A circuit line at the left side of the metal circuit layer 150 is formed for the purpose of the redistribution layout, different from the above-mentioned in FIGS. 1-2.

Referring to FIGS. 3-4, multiple openings 142*a* and 142*b* in the passivation layer 140 expose the contact points 135*a* and 135*b* of the topmost thin film fine line metal layer 136. The metal circuit layer 150 is formed over the passivation layer 140 and connected to the contact points 135*a*, 135*b* of the thin film fine line metal layer 136. The layout position of the bump 160*a* from a top view is different from that of the contact point 135*a* of the thin film fine line metal layer 136, and the layout position of the bump 160*b* from a top view is the same as that of the contact point 135*b* of the thin film fine line metal layer 136. As mentioned above, the metal circuit layer 150 functions as a redistribution layout. The layout position of the bumps 160*a* and 160*b* can be relocated for adjusting the pin assignment of the bump 160*a* and 160*b* or for adapting various different packages due to the formation of the metal circuit layer 150. The bumps 160*a* and 160*b* may comprise a principal material, such as gold, not suitable for being processed using a reflow process. Alternatively, the bumps 160*a* and 160*b* may comprise a principal material, such as a tin-lead alloy, a tin-silver-copper alloy, a tin-silver alloy or other soldering materials, suitable for being processed using a reflow process. The chip structure 100 is suited for being connected to an external circuit component (unshown) via the bumps 160*a* and 160*b*. The external circuit component is, for example, a flexible or hard printed circuit board, a glass substrate, a thin film substrate or a TAB substrate.

In FIG. 3, the metal circuit layer 150 is formed over and in touch with the passivation layer 140. Alternatively, the metal circuit layer 150 can be formed over and separate from the passivation layer 140, with a polymer layer 170 formed between the passivation layer 140 and the metal circuit layer 150, as showed in FIG. 4. Multiple openings 172, substantially aiming at the openings 142 in the passivation layer 140, are formed in the polymer layer 170. The metal circuit layer 150 formed over the polymer layer 170 is connected to the thin film fine line metal layer 136 through the openings 172 in the polymer layer 170 and the openings 142*a* and 142*b* in the passivation layer 140. The polymer layer 170 can be made of polyimide (PI), benzocyclobutene (BCB), parylene, porous dielectric material, or elastomer, for example.

3. Application to Power Plane or Bus

Figure 5:
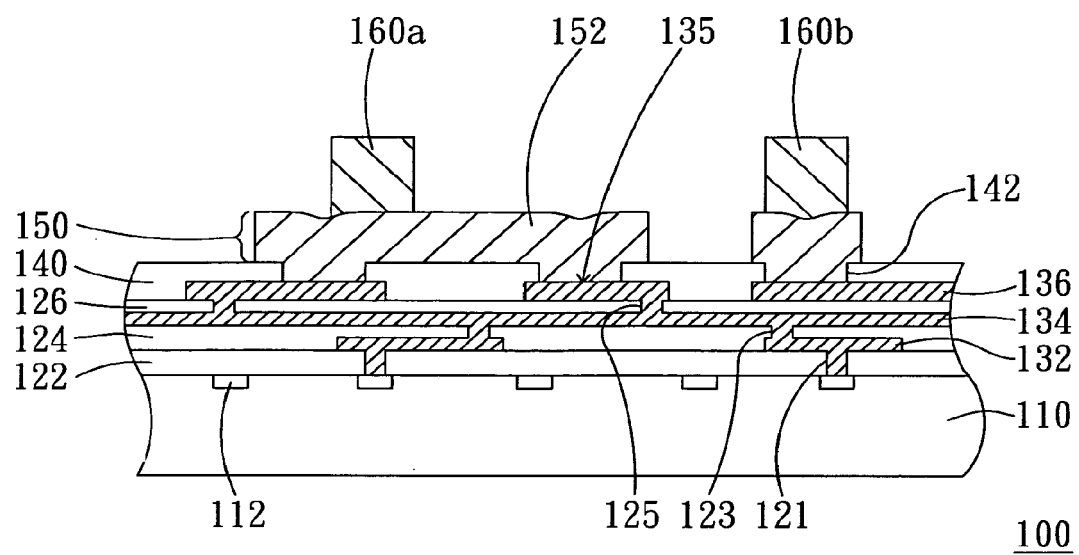
FIGS. 5 and 6 are schematic cross-sectional figures showing chip structures or wafer structures according to a first embodiment, wherein the metal circuit layer is used for a power plane
Figure 6:
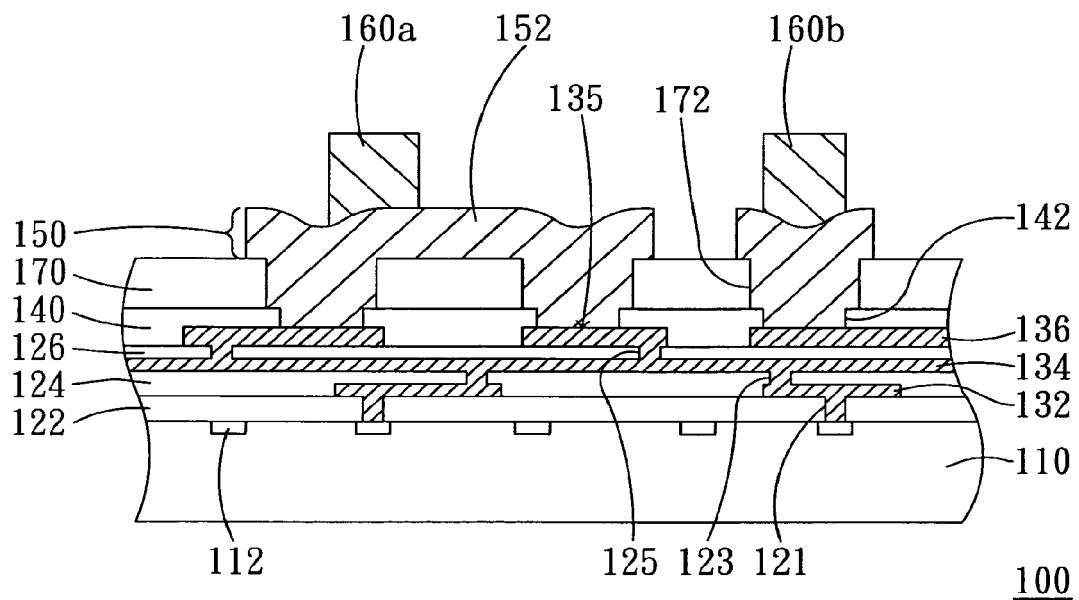

FIGS. 5-6 are schematic cross-sectional figures showing the chip structures according to a first embodiment of the present invention. The metal circuit layer 150, for example, is used for power plane. The components below the passivation layer 140 of the chip structure 100 in FIGS. 5-6 are similar to those in FIGS. 1-2. The identical reference numbers in FIGS. 1-6 represent same or similar elements. The elements shown in FIGS. 5-6 with the same reference numbers as those shown in FIGS. 1-2 can refer to the above explanation for the corresponding same ones in FIGS. 1-2. A metal circuit 152 of the metal circuit layer 150 is formed for the purpose of a power plane or power bus, different from the above-mentioned in FIGS. 1-4.

Referring to FIGS. 5-6, multiple openings 142 in the passivation layer 140 expose the contact points 135 of the topmost thin film fine line metal layer 136. The metal circuit layer 150, includes a power plane or power bus 152 connected to the topmost thin film fine line metal layer 136 via the openings in the passivation layer 140. The power plane or power bus 152 is connected to a thin film power plane or power bus 134 that is one of the multiple thin film fine line metal layers under the passivation layer 140. Multiple bumps 160*a* and 160*b* are built over the metal circuit layer 150. The bumps 160*a* and 160*b* comprises a principal material, such as gold, not suitable for being processed using a reflow process. Alternatively, the bumps 160*a* and 160*b* may comprise a principal material, such as a tin-lead alloy, a tin-silver-copper alloy, a tin-silver alloy or other soldering materials, suitable for being processed using a reflow process. The chip structure 100 can be connected to an external circuit component via the bumps 160*a* and 160*b*. The external circuit component is, for example, a flexible or hard printed circuit board, a glass substrate, a thin film substrate or a TAB substrate. Via the bump 160*a*, the power plane 152 can be connected to a power plane in the external circuit component. Via the bump 160*b*, the chip structure 100 can transmit or receive a signal to or from the external circuit component.

In FIG. 5, the metal circuit layer 150 is formed over and in touch with the passivation layer 140. Alternatively, the metal circuit layer 150 can be formed over and separate from the passivation layer 140, with a polymer layer 170 formed between the passivation layer 140 and the metal circuit layer 150, as showed in FIG. 6. Multiple openings 172, substantially aiming at the openings 142 in the passivation layer 140, are formed in the polymer layer 170. The metal circuit layer 150 formed over the polymer layer 170 is connected to the thin film fine line metal layer 136 through the openings 172 in the polymer layer 170 and the openings 142 in the passivation layer 140. The polymer layer 170 can be made of polyimide (PI), benzocyclobutene (BCB), parylene, porous dielectric material, or elastomer, for example.

4. Application to Ground Plane

Figure 7:
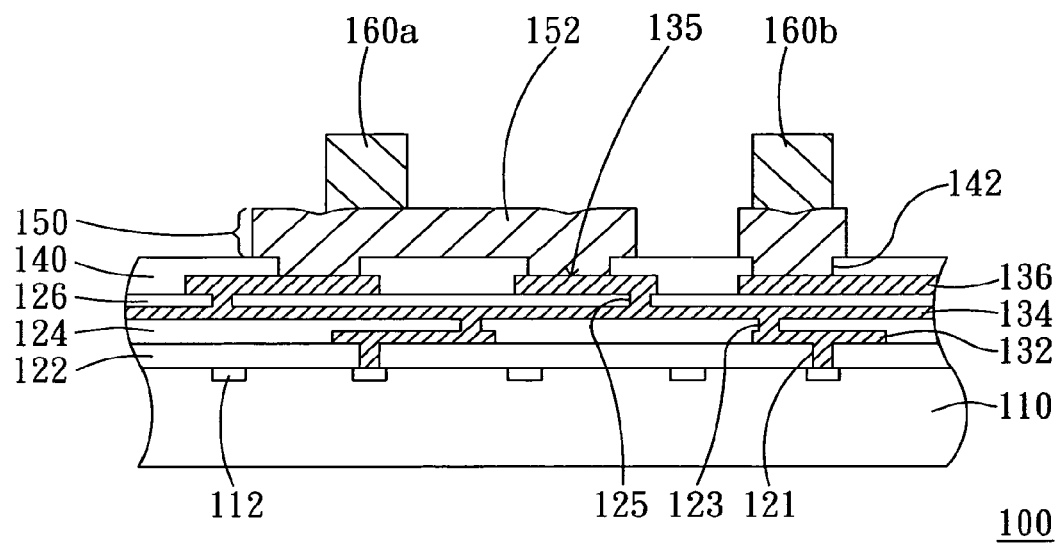
FIGS. 7 and 8 are schematic cross-sectional figures showing chip structures or wafer structures according to a first embodiment, wherein the metal circuit layer is used for a ground plane.
Figure 8:
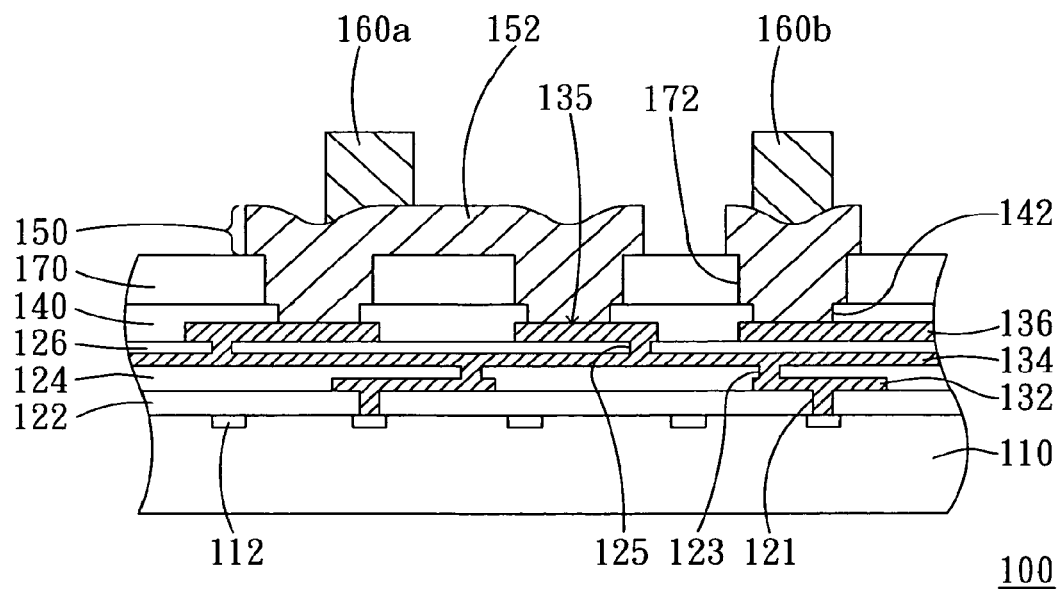

FIGS. 7-8 are schematic cross-sectional figures showing the chip structures according to a first embodiment of the present invention. A left portion of the metal circuit layer 150 is a circuit line functioning as a ground plane, for example. The components below the passivation layer 140 of the chip structure 100 in FIGS. 7-8 are similar to those in FIGS. 1-2. The identical reference numbers in FIGS. 1-8 represent same or similar elements. The elements shown in FIGS. 7-8 with the same reference numbers as those shown in FIGS. 1-2 can refer to the above explanation for the corresponding same ones in FIGS. 1-2. A circuit line at the left side of the metal circuit layer 150 in FIGS. 7-8 is formed for the purpose of the ground plane, different from FIGS. 1-2.

Referring to FIGS. 7-8, multiple openings 142 in the passivation layer 140 expose the contact points 135 of the topmost thin film fine line metal layer 136. The metal circuit layer 150 includes a ground plane 152 connected to the topmost thin film fine line metal layer 136 via the openings in the passivation layer 140. The ground plane 152 is connected to a thin film ground plane .134 that is one of the multiple thin film fine line metal layers under the passivation layer 140. Multiple bumps 160a and 160b are built over the metal circuit layer 150. The bumps 160a and 160b comprises a principal material, such as gold, not suitable for being processed using a reflow process. Alternatively, the bumps 160a and 160b may comprise a principal material, such as a tin-lead alloy, a tin-silver-copper alloy, a tin-silver alloy or other soldering materials, suitable for being processed using a reflow process. The chip structure 100 can be connected to an external circuit component via the bumps 160a and 160b. The external circuit component is, for example, a flexible or hard printed circuit board, a glass substrate, a thin film substrate or a TAB substrate. Via the bump 160a, the ground plane 152 can be connected to a power plane in the external circuit component. Via the bump 160b, the chip structure 100 can transmit or receive a signal to or from the external circuit component.

In FIG. 7, the metal circuit layer 150 is formed over and in touch with the passivation layer 140. Alternatively, the metal circuit layer 150 can be formed over and separate from the passivation layer 140, with a polymer layer 170 formed between the passivation layer 140 and the metal circuit layer 150, as showed in FIG. 8. Multiple openings 172, substantially aiming at the openings 142 in the passivation layer 140, are formed in the polymer layer 170. The metal circuit layer 150 formed over the polymer layer 170 is connected to the thin film fine line metal layer 136 through the openings 172 in the polymer layer 170 and the openings 142 in the passivation layer 140. The polymer layer 170 can be made of polyimide (PI), benzocyclobutene (BCB), parylene, porous dielectric material, or elastomer, for example.

Figure 9:
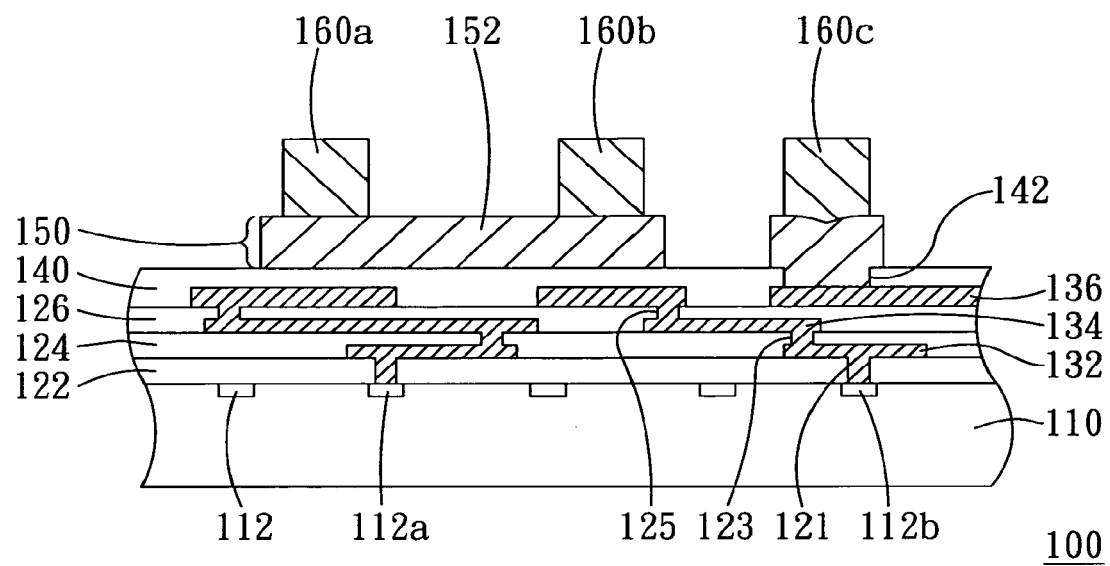
FIGS. 9 and 10 are schematic cross-sectional figures showing chip structures or wafer structures according to a first embodiment, wherein the metal circuit layer is used to transmit signals or provide a power plane or bus or a ground plane or bus only for an external circuitry component.
Figure 10:
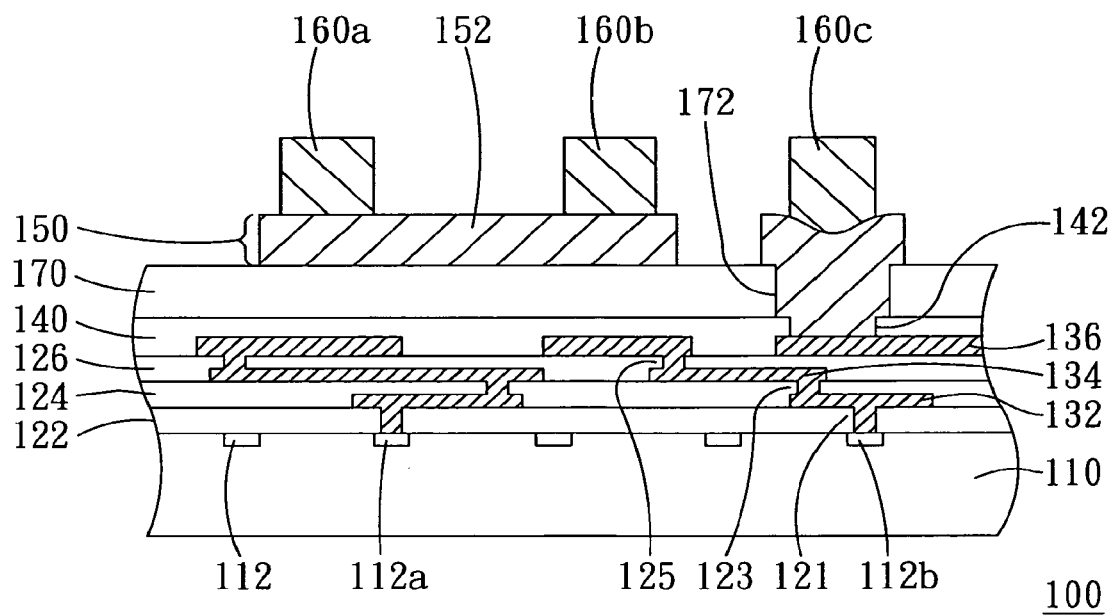

5. Application to Signal Transmission Line, Ground Plane or Bus and Power Plane or Bus Only for External Circuit Component FIGS. 9-10 are schematic cross-sectional figures showing the chip structures according to a first embodiment of the present invention, wherein a left portion 152 of the metal circuit layer 150 may be used to transmit signals or provide a power plane or bus or a ground plane or bus only for an external circuitry component. The components below the passivation layer 140 of the chip structure 100 in FIGS. 9-10 are similar to those in FIGS. 1-2. The identical reference numbers in FIGS. 1-10 represent same or similar elements. The elements shown in FIGS. 9-10 with the same reference numbers as those shown in FIGS. 1-2 can refer to the above explanation for the corresponding same ones in FIGS. 1-2. The left portion 152 of the metal circuit layer 150 is formed for transmitting a signal, such as address signal, data signal, clock signal, logic signal or analog signal, or providing a power or ground plane only for the layout of an external circuit component, different from the above-mentioned in FIGS. 1-2.

Referring to FIGS. 9-10, the metal circuit layer 150 disposed over the passivation layer 140 includes a portion 152 electrically disconnected to the thin film fine line metal layers 132, 134 and 136. The bumps 160a, 160b and 160c formed over the metal circuit layer 150 may comprise a principal material, such as gold, not suitable for being processed using a reflow process. Alternatively, the bumps 160a and 160b may comprise a principal material, such as a tin-lead alloy, a tin-silver-copper alloy or a tin-silver alloy, suitable for being processed using a reflow process. The left portion 152 of the metal circuit layer 150 can be connected to the external circuit component (unshown) via the bumps 160a and 160b. The external circuit component is, for example, a flexible or hard printed circuit board, a glass substrate, a thin film substrate, or a TAB substrate. The metal circuit 152 of the metal circuit layer 150 can be used for transmitting signals only for the external circuit component. A signal can be transmitted from the external circuit component to the portion 152 of the metal circuit layer 150 via the bump 160a, and then from the portion 152 of the metal circuit layer 150 back to the external circuit component via the bump 160b. Alternatively, the portion 152 of the metal circuit layer 150 can provide a power or ground plane only for the electrical circuit component, and can be connected to a power or ground plane in an external circuit component. Also, the portion 152 of the metal circuit layer 150 can provide a power or ground plane connected to an external circuit component without a power or ground plane. The chip structure 100 can transmit or receive signals to or from the external circuit component connected with the bump 160c.

In FIG. 9, the metal circuit layer 150 is formed over and in touch with the passivation layer 140. Alternatively, the metal circuit layer 150 can be formed over and separate from the passivation layer 140, with a polymer layer 170 formed between the passivation layer 140 and the metal circuit layer 150, as showed in FIG. 10. Multiple openings 172, substantially aiming at the openings 142 in the passivation layer 140, are formed in the polymer layer 170. The metal circuit layer 150 formed over the polymer layer 170 is connected to the thin film fine line metal layer 136 through the openings 172 in the polymer layer 170 and the openings 142 in the passivation layer 140. The polymer layer 170 can be made of polyimide (PI), benzocyclobutene (BCB), parylene, porous dielectric material, or elastomer, for example.

Second Embodiment

In the second embodiment, the metal circuit 250 is positioned over the passivation layer 140 and the bump 260 is positioned on the topmost thin film fine line metal layer 136. The components below the passivation layer 140 of the chip structure 200 in the second embodiment are similar to the above-mentioned in FIGS. 1-2.

This embodiment has several applications, as illustrated in the following.

1. Application to Intra-Chip Signal Transmission

FIGS. 11-23 are schematic cross-sectional figures showing the chip structures according to a second embodiment of the present invention. A circuit line at the left side of the metal circuit layer 250 is used for intra-chip signal transmission.

In FIGS. 11-23, a metal circuit layer 250 is formed over the passivation layer 140 and electrically connected to the thin film fine line metal layer 136 through openings 142 in the passivation layer 140. The metal circuit 250 connects multiple pads of the thin film fine line metal layer 136. A signal may be transmitted from one of the electronic devices, such as 112a, to the circuit line of the metal circuit layer 250 sequentially through the thin film fine line metal layers 132, 134 and 136 and then through the opening 142 in the passivation layer 140. Next, the signal may be transmitted from the circuit line of the metal circuit layer 250 back to the other one of the electronic devices, such as 112b, through the opening 142 in the passivation layer 140 and then sequentially through the thin film fine line metal layers 136, 134 and 132. As mentioned above, the circuit line of the metal circuit layer 250 can be used for intra-chip signal transmission.

In FIGS. 11-23, a bump 260 is formed on a contact point 135 of the topmost thin film fine line metal layer 136 exposed by an opening 142 in the passivation layer 140. The bump 260 is suitable for being bonded to a flexible or hard printed circuit board, a glass substrate, a thin film substrate, or a TAB substrate. The bump 160 may comprise a principal material, such as gold, not suitable for being processed using a reflow process. Alternatively, the bump 160 may comprise a principal material, such as a tin-lead alloy, a tin-silver-copper alloy, a tin-silver alloy or other soldering materials, suitable for being processed using a reflow process.

Figure 11:
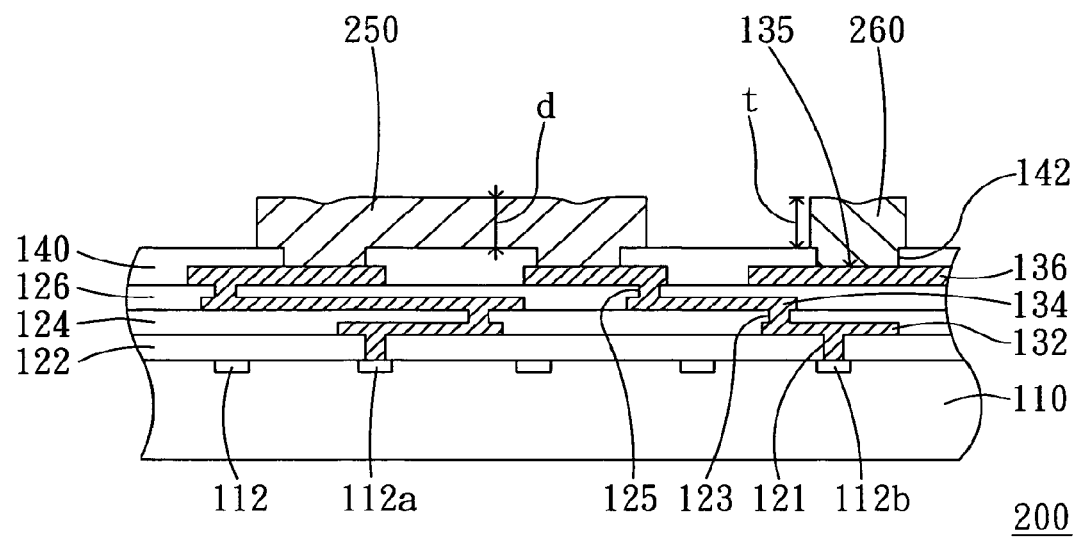
FIGS. 11-23 are schematic cross-sectional figures showing chip structures or wafer structures according to a second embodiment, wherein the metal circuit layer is used for intra-chip signal transmission.
Figure 12:
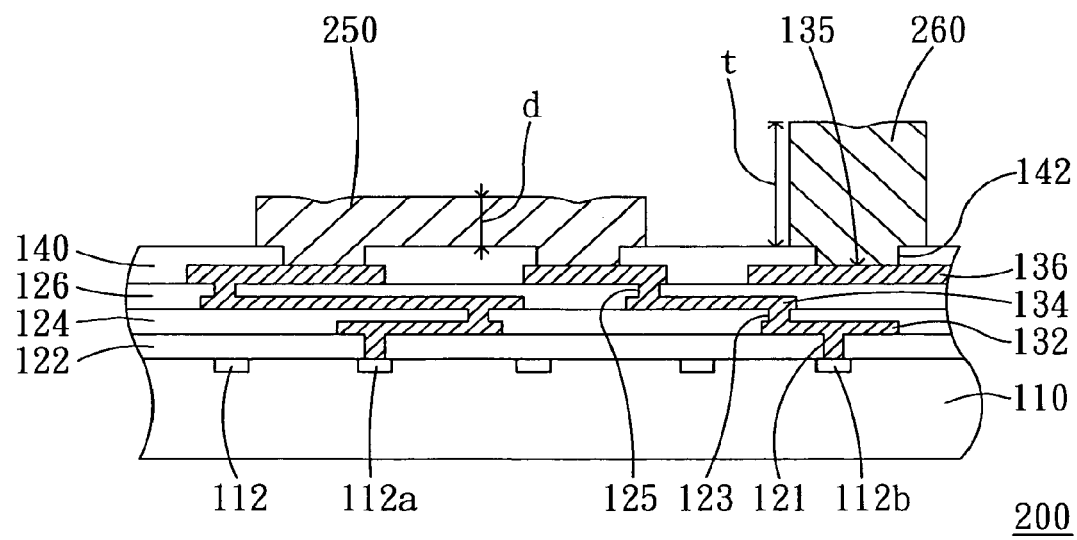

In FIGS. 11 and 12, the metal circuit line 250 is exposed to the outer environment and formed over and in touch with the passivation layer 140. The thickness t of the bump 260 may be roughly the same as the thickness d of the metal circuit line 250, as shown in FIG. 11. Alternatively, the thickness t of the bump 260 may be thicker than the thickness d of the metal circuit line 250, as shown in FIG. 12.

Figure 13:
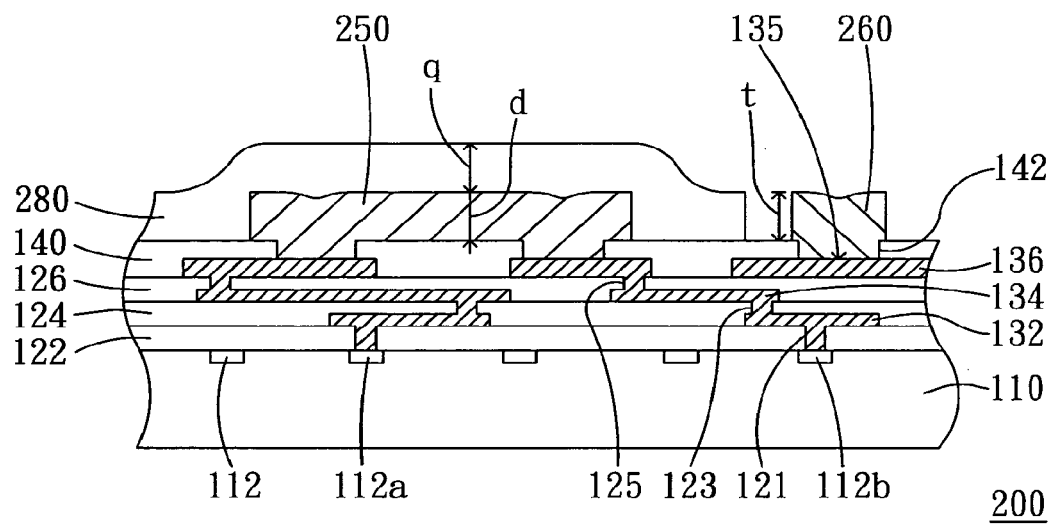
Figure 14:
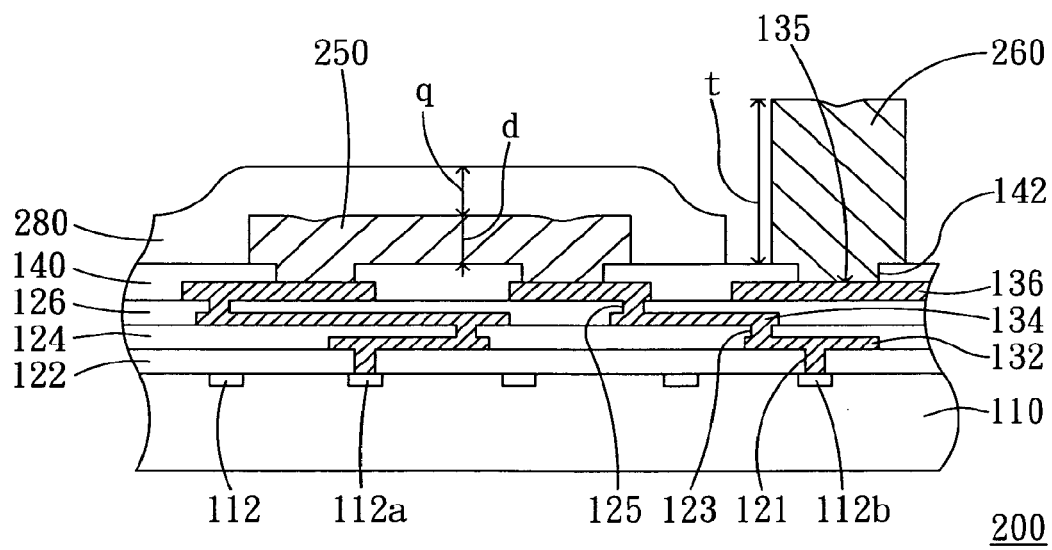

In FIGS. 13 and 14, the metal circuit line 250 is formed over and in touch with the passivation layer 140. The polymer layer 280 is formed over the metal circuit line 250 and is divided from the bump 260. The thickness t of the bump 260 may be roughly the same as the thickness d of the metal circuit line 250 and thinner than the total thickness (d+q) of the metal circuit line 250 plus the polymer layer 280, as shown in FIG. 13. Alternatively, the thickness t of the bump 260 may be thicker than the total thickness (d+q) of the metal circuit layer 250 plus the polymer layer 280, as shown in FIG. 14.

Figure 15:
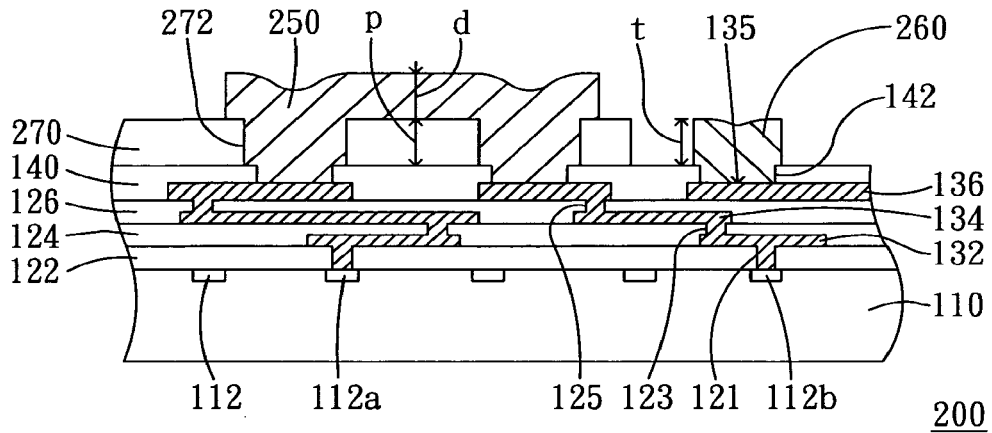
Figure 16:
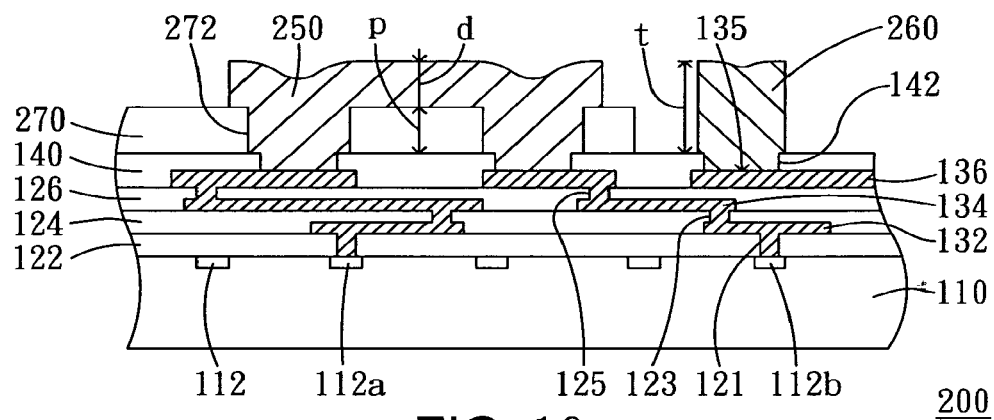
Figure 17:
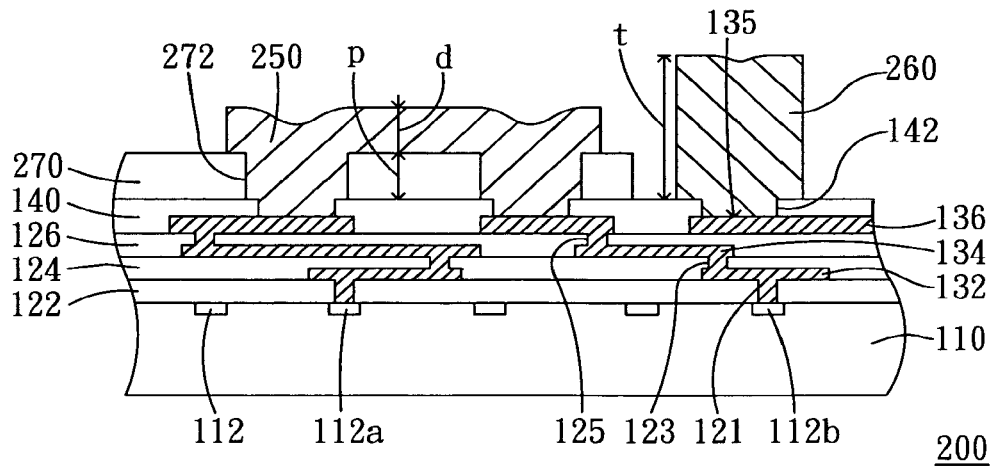

In FIGS. 15, 16 and 17, the metal circuit line 250 can be formed over and separate from the passivation layer 140, with a polymer layer 270 formed between the passivation layer 140 and the metal circuit line 250. Multiple openings 272, substantially aiming at the openings 142 in the passivation layer 140, are formed in the polymer layer 270. The metal circuit line 250 formed over the polymer layer 270 is connected to the thin film fine line metal layer 136 through the openings 272 in the polymer layer 170 and the openings 142 in the passivation layer 140. The bump 260 is formed on a contact point 135 of the topmost thin film fine line metal layer 136 and divided from the polymer layer 270. The thickness t of the bump 260 may be roughly the same as the thickness d of the metal circuit layer 250 and thinner than the total thickness (d+q) of the metal circuit line 250 plus the polymer layer 270, as shown in FIG. 15. Alternatively, the thickness t of the bump 260 may be roughly the same as the total thickness (d+q) of the metal circuit line 250 plus the polymer layer 270, as shown in FIG. 16. Alternatively, the thickness t of the bump 260 may be thicker than the total thickness (d+q) of the metal circuit line 250 plus the polymer layer 270, as shown in FIG. 17.

Figure 18:
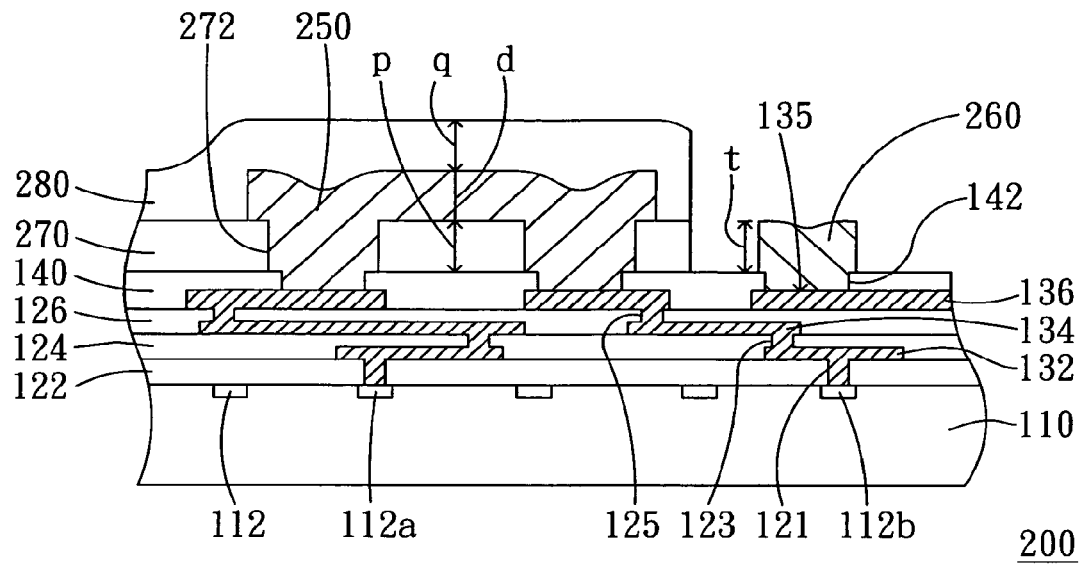
Figure 19:
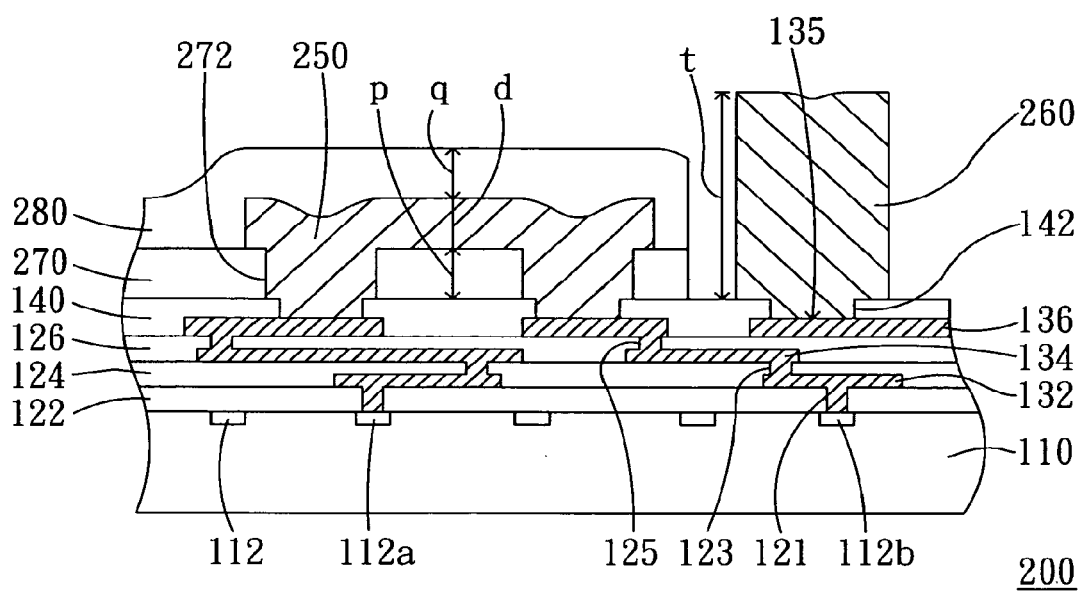

In FIGS. 18 and 19, the metal circuit line 250 can be formed over and separate from the passivation layer 140, with a polymer layer 270 formed between the passivation layer 140 and the metal circuit line 250. Multiple openings 272, substantially aiming at the openings 142 in the passivation layer 140, are formed in the polymer layer 270. The metal circuit line 250 formed over the polymer layer 270 is connected to the thin film fine line metal layer 136 through the openings 272 in the polymer layer 270 and the openings 142 in the passivation layer 140. Another polymer layer 280 is formed over the metal circuit line 250. A bump 160 is formed on a contact point 135 of the topmost thin film fine line metal layer 136 and divided from the polymer layers 270 and 280. The thickness t of the bump 260 may be roughly the same as the thickness d of the metal circuit line 250 and thinner than the total thickness (d+p+q) of the metal circuit line 250 plus the polymer layers 270 and 280, as shown in FIG. 18. Alternatively, the thickness t of the bump 260 may be thicker than the total thickness (d+p+q) of the metal circuit line 250 plus the polymer layers 270 and 280 as shown in FIG. 19.

Figure 20:
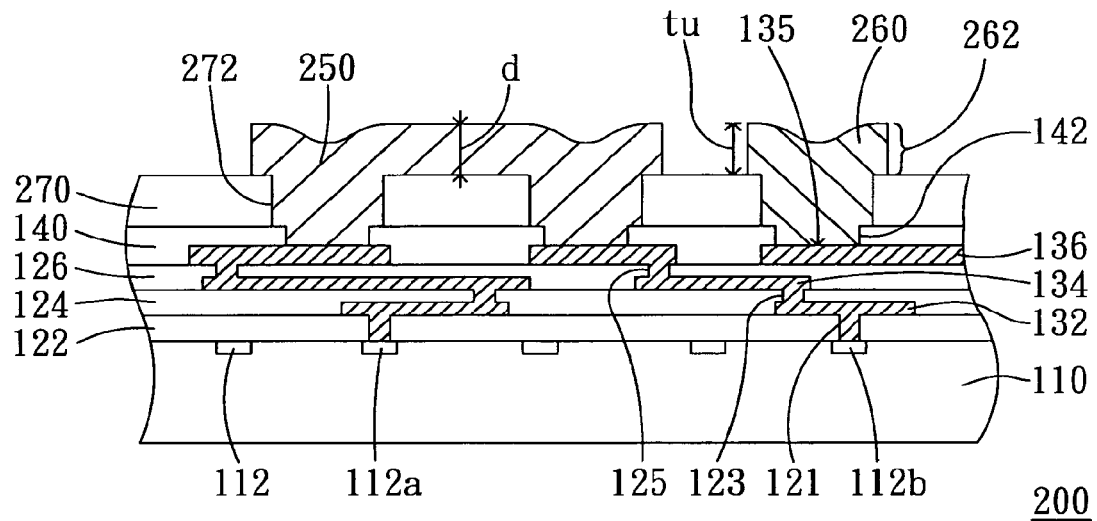
Figure 21:
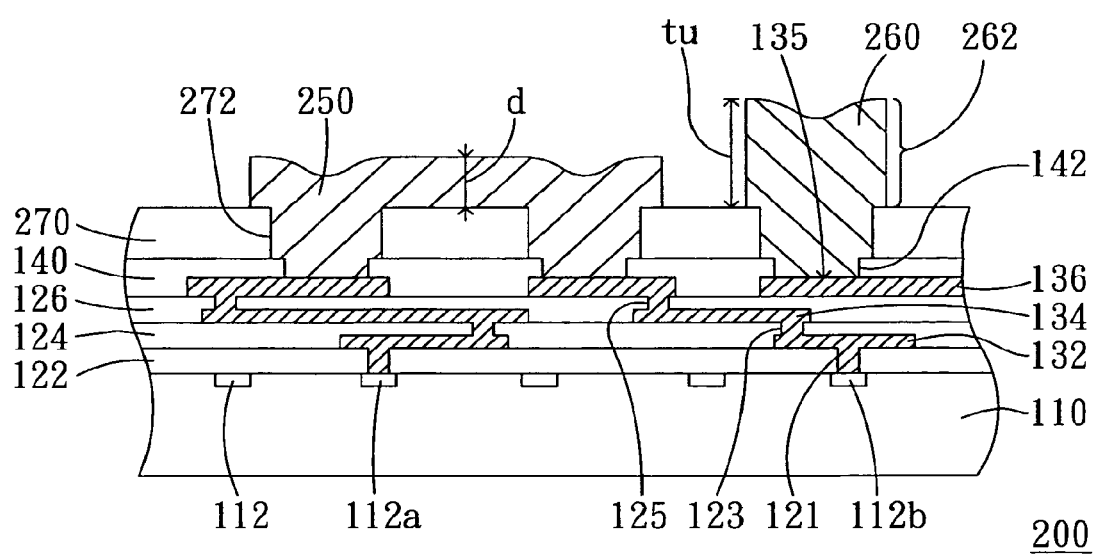

In FIGS. 20 and 21, the metal circuit line 250 can be formed over and separate from the passivation layer 140, with a polymer layer 270 formed between the passivation layer 140 and the metal circuit line 250. Multiple openings 272, substantially aiming at the openings 142 in the passivation layer 140, are formed in the polymer layer 270. The metal circuit line 250 formed over the polymer layer 270 is connected to the thin film fine line metal layer 136 through the openings 272 in the polymer layer 270 and the openings 142 in the passivation layer 140. The bump 260 is formed on a contact point 135 of the topmost thin film fine line metal layer 136. The bump 260 comprises a lower portion in an opening 272 in the polymer layer 270 and an upper portion 262 outside and over the opening 272 in the polymer layer 270. The thickness tu of the upper portion 262 of the bump 260 may be roughly the same as the thickness d of the metal circuit line 250, as shown in FIG. 20. Alternatively, the thickness tu of the upper layer portion 262 of the bump 260 may be thicker than the thickness d of the metal circuit layer 250, as shown in FIG. 21.

Figure 22:
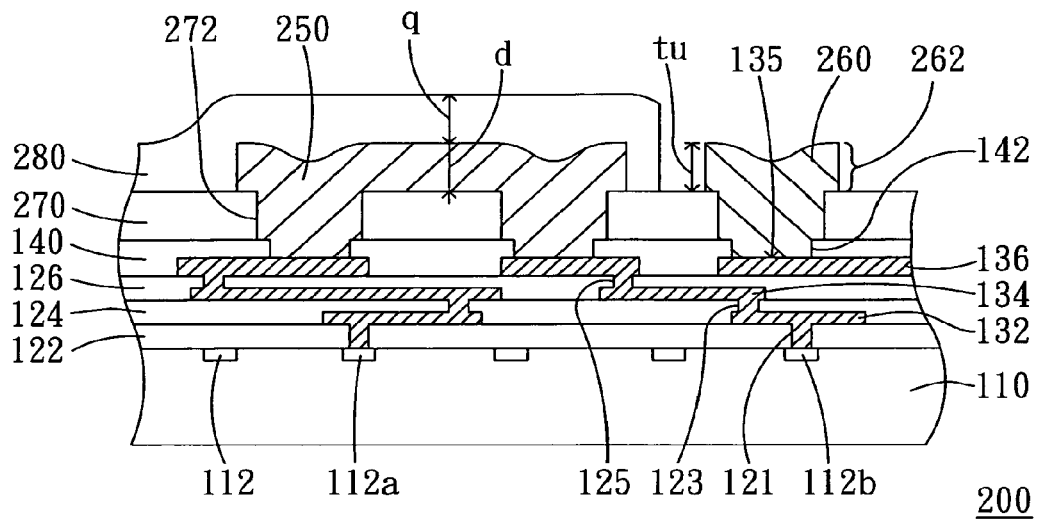
Figure 23:
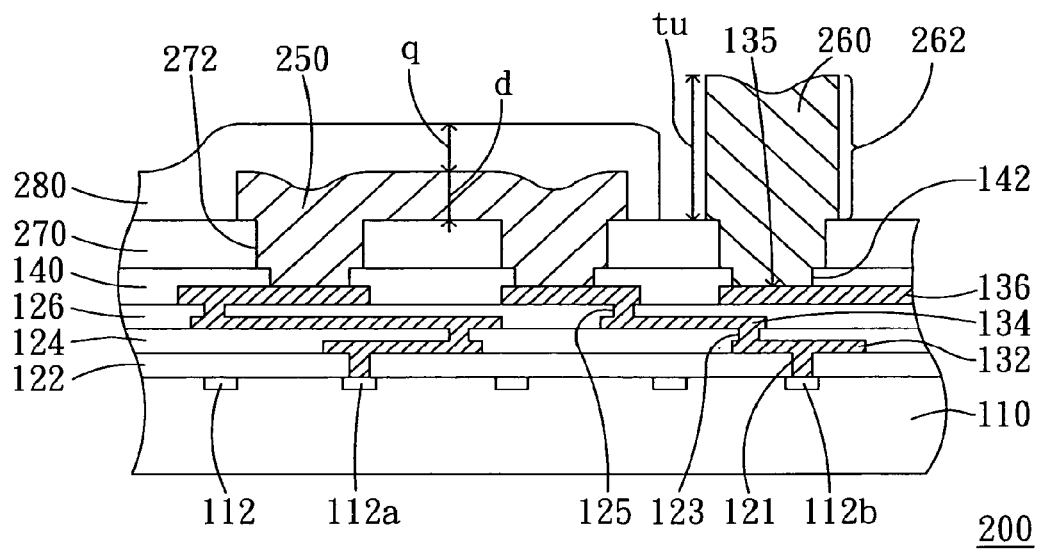

In FIGS. 22 and 23, the metal circuit line 250 can be formed over and separate from the passivation layer 140, with a polymer layer 270 formed between the passivation layer 140 and the metal circuit line 250. Multiple openings 272, substantially aiming at the openings 142 in the passivation layer 140, are formed in the polymer layer 270. The metal circuit line 250 formed over the polymer layer 270 is connected to the thin film fine line metal layer 136 through the openings 272 in the polymer layer 270 and the openings 142 in the passivation layer 140. Another polymer layer 280 is formed over the metal circuit line 250.

The bump 260 is formed on a contact point 135 of the topmost thin film fine line metal layer 136. The bump 260 comprises a lower portion in an opening 272 in the polymer layer 270 and an upper portion 262 outside and over the opening 272 therein. The thickness tu of the upper layer portion 262 of the bump 260 may be roughly the same as the thickness d of the metal circuit line 250 and thinner than the total thickness (d+q) of the metal circuit line 250 plus the polymer layer 280, as shown in FIG. 22. Alternatively, the thickness tu of the upper layer portion 262 of the bump 260 may be thicker than the total thickness (d+q) of the metal circuit line 250 plus the polymer layer 280, as shown in FIG. 23.

In the embodiment as shown in FIGS. 13-23, the polymer layers 270 and 280 can be made of polyimide (PI), benzocyclobutene (BCB), parylene, porous dielectric material, or elastomer, for example.

In the embodiment as shown in FIGS. 11-23, the bump 260 may comprise a principal material, such as gold, not suitable for being processed using a reflow process. Alternatively, the bump 260 may comprise a principal material, such as a tin-lead alloy, a tin-silver-copper alloy, a tin-silver alloy or other soldering materials, suitable for being processed using a reflow process.

2. Application to Power Plane or Bus

FIGS. 24-36 are schematic cross-sectional figures showing the chip structures according to a second embodiment of the present invention. The metal circuit 250, such as a power plane or a power bus, is used for providing power voltage, for example. Multiple openings 142 in the passivation layer 140 expose the topmost layer of the thin film fine line metal layer 136. A power plane or power bus 250 is connected to the topmost thin film fine line metal layer 136 via the openings 142 in the passivation layer 140. The power plane 250 is connected to a thin film power plane or power bus 134 that is one of the multiple thin film fine line metal layers under the passivation layer 140. A bump 260 formed on a contact point 135 of the thin film fine line metal layer 136 may comprise a principal material, such as gold, not suitable for being processed using a reflow process. Alternatively, the bump 260 may comprise a principal material, such as a tin-lead alloy, a tin-silver-copper alloy or a tin-silver alloy, suitable for being processed using a reflow process. The bump 260 can be connected to an external circuit component, such as a flexible or hard printed circuit board, a glass substrate, a thin film substrate or a TAB substrate.

Figure 24:
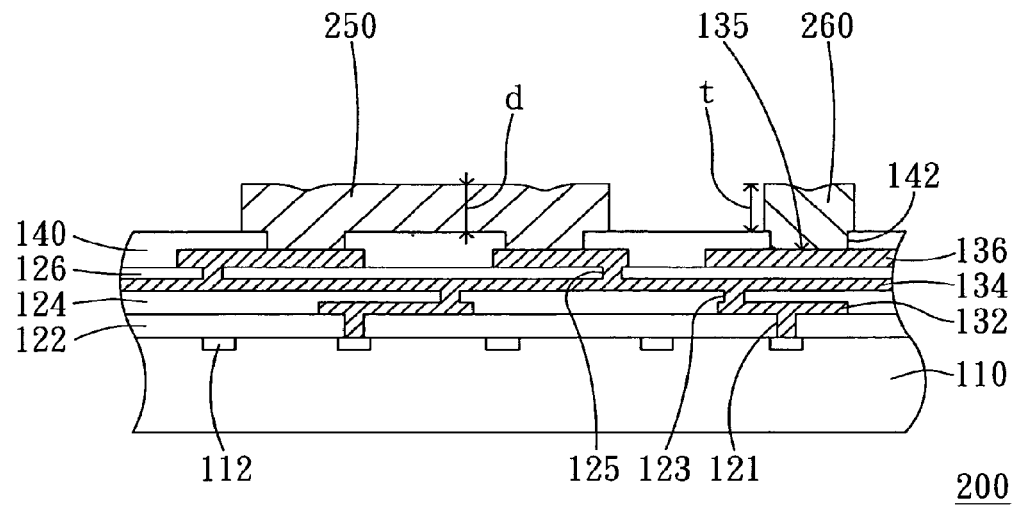
FIGS. 24-36 are schematic cross-sectional figures showing chip structures or wafer structures according to a second embodiment, wherein the metal circuit layer is used for a power plane
Figure 25:
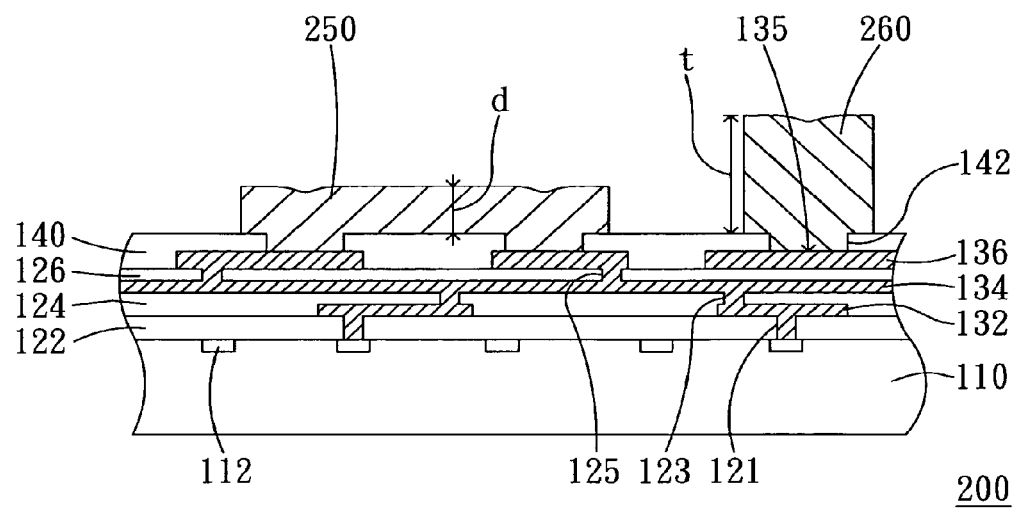

In FIGS. 24 and 25, the power plane or power bus 250 is exposed to the outer environment and formed over and in touch with the passivation layer 140. The thickness t of the bump 260 may be roughly the same as the thickness d of the power plane or power bus 250, as shown in FIG. 24. Alternatively, the thickness t of the bump 260 may be thicker than the thickness d of the power plane or power bus 250, as shown in FIG. 25.

Figure 26:
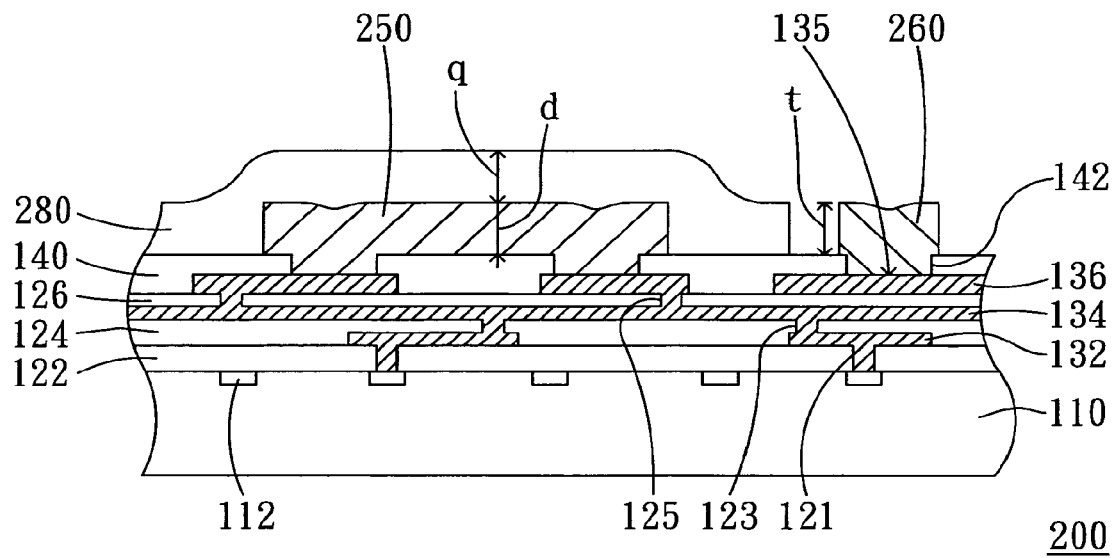
Figure 27:
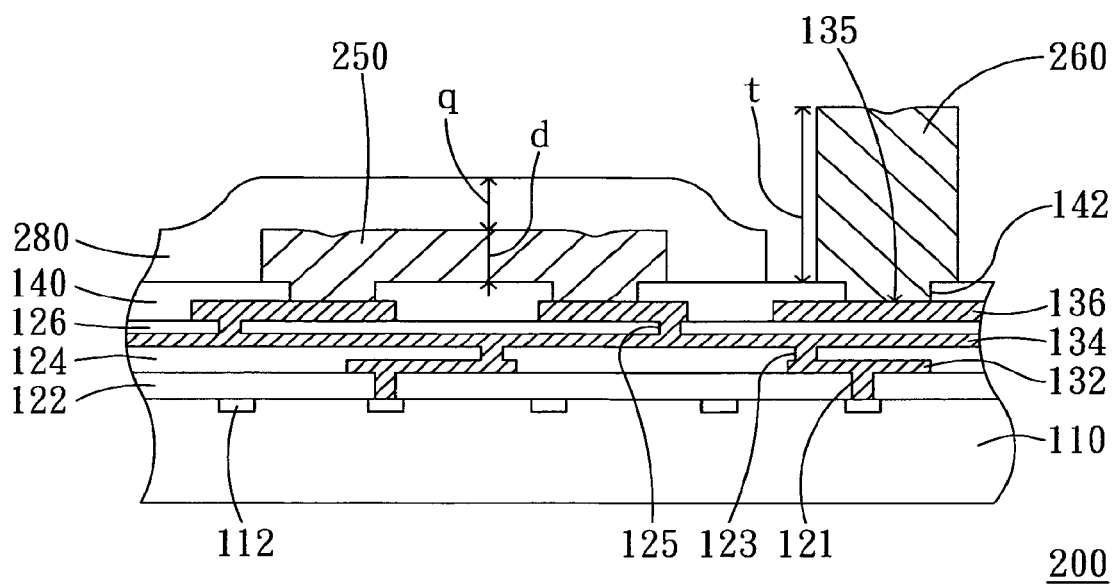

In FIGS. 26 and 27, the power plane 250 is formed over and in touch with the passivation layer 140. The polymer layer 280 is formed over the power plane or power bus 250 and divided from the bump 260. The thickness t of the bump 260 may be roughly the same as the thickness d of the power plane or power bus 250 and thinner than the total thickness (d+q) of the power plane or power bus 250 plus the polymer layer 280, as shown in FIG. 26. Alternatively, the thickness t of the bump 260 may be thicker than the total thickness (d+q) of the power plane or power bus 250 plus the polymer layer 280, as shown in FIG. 27.

Figure 28:
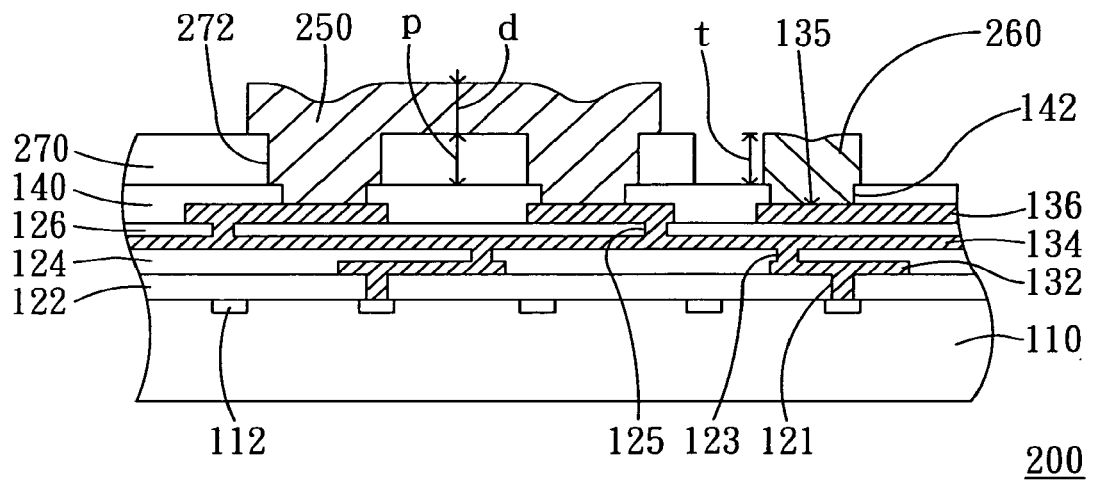
Figure 29:
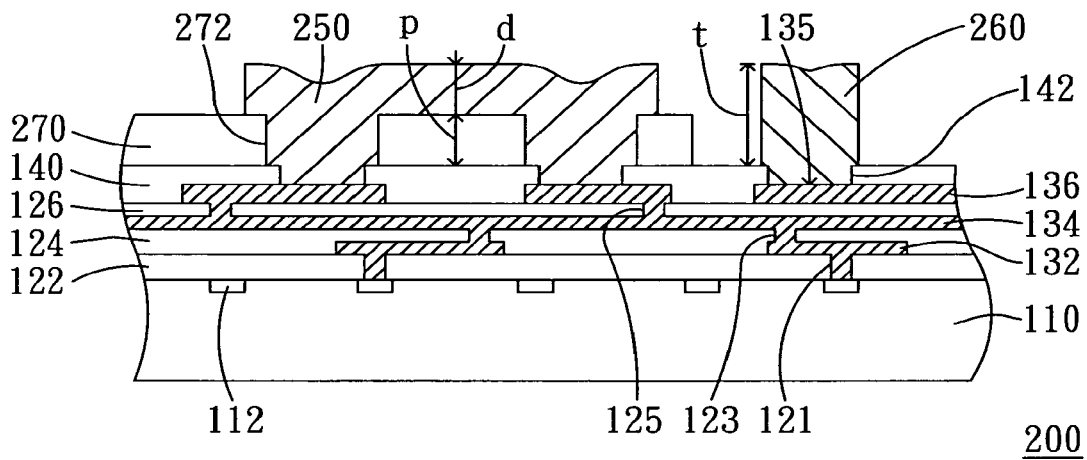
Figure 30:
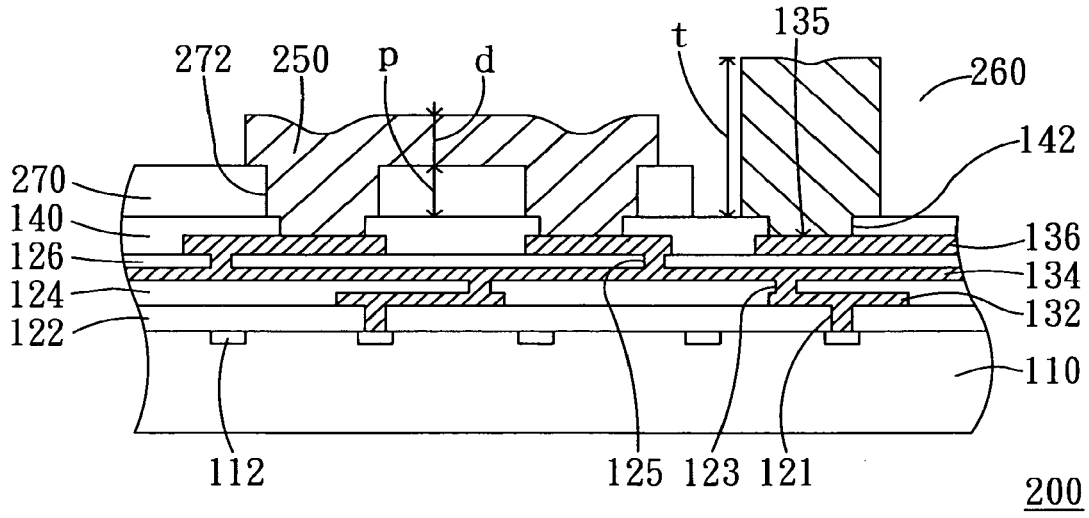

In FIGS. 28, 29 and 30, the power plane or power bus 250 can be formed over and separate from the passivation layer 140, with a polymer layer 270 formed between the passivation layer 140 and the power plane or power bus 250. Multiple openings 272, substantially aiming at the openings 142 in the passivation layer 140, are formed in the polymer layer 270. The power plane or power bus 250 formed over the polymer layer 270 is connected to the thin film fine line metal layer 136 through the openings 272 in the polymer layer 170 and the openings 142 in the passivation layer 140. The bump 260 is formed on the contact point 135 of the topmost thin film fine line metal layer 136 and divided from the polymer layer 270. The thickness t of the bump 260 may be roughly the same as the thickness d of the power plane or power bus 250 and thinner than the total thickness (d+q) of the power plane or power bus 250 plus the polymer layer 270, as shown in FIG. 28. Alternatively, the thickness t of the bump 260 may be roughly the same as the total thickness (d+q) of the power plane or power bus 250 plus the polymer layer 270, as shown in FIG. 29. Alternatively, the thickness t of the bump 260 may be thicker than the total thickness (d+q) of the power plane or power bus 250 plus the polymer layer 270, as shown in FIG. 30.

Figure 31:
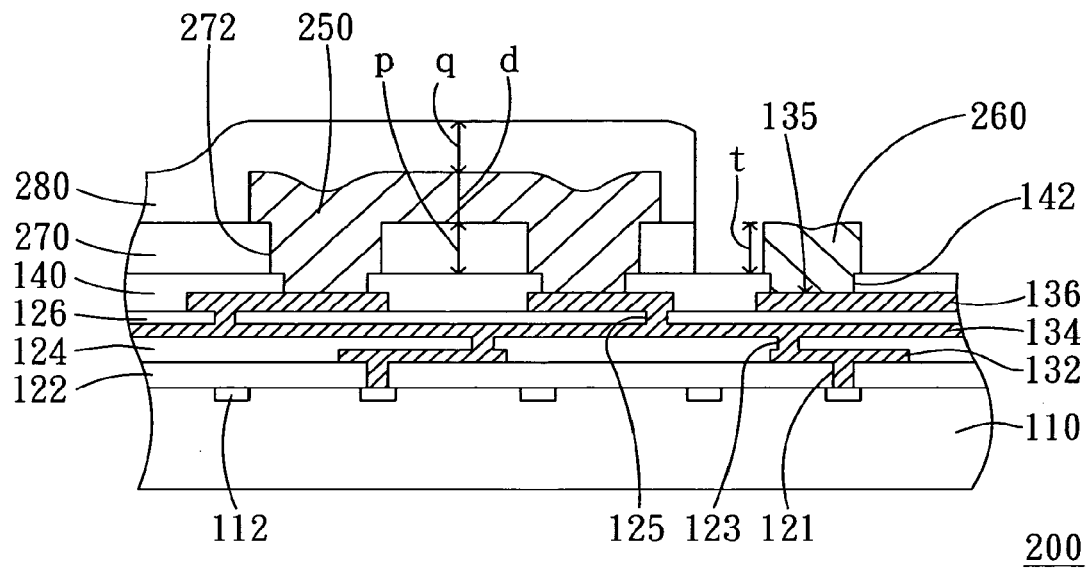
Figure 32:
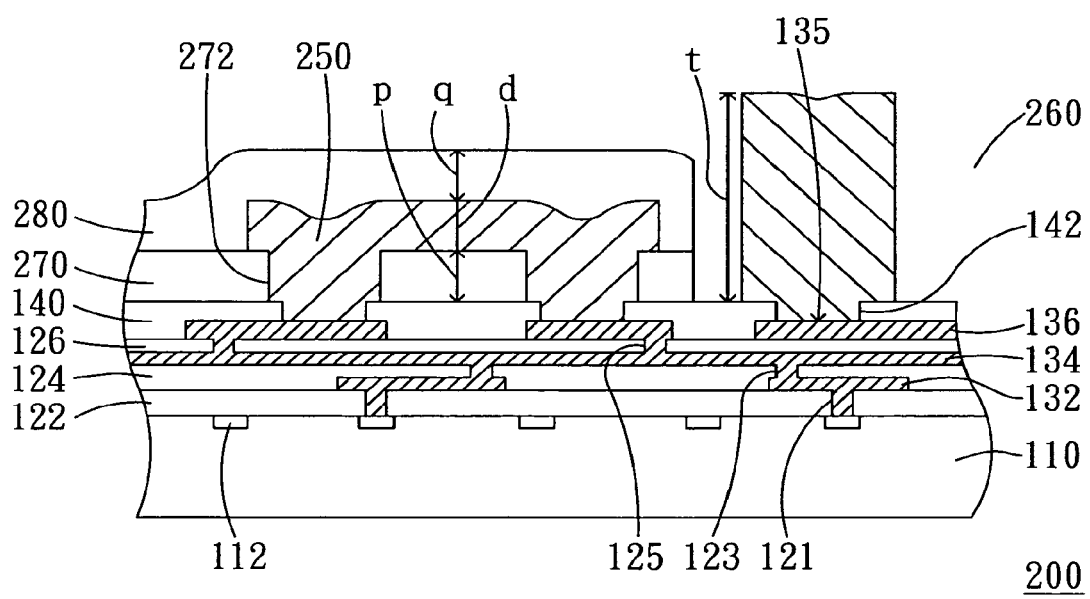

In FIGS. 31 and 32, the power plane or power bus 250 can be formed over and separate from the passivation layer 140, with a polymer layer 270 formed between the passivation layer 140 and the power plane or power bus 250. Multiple openings 272, substantially aiming at the openings 142 in the passivation layer 140, are formed in the polymer layer 270. The power plane or power bus 250 formed over the polymer layer 270 is connected to the thin film fine line metal layer 136 through the openings 272 in the polymer layer 270 and the openings 142 in the passivation layer 140. The polymer layer 280 is formed over the power plane or power bus 250. The bump 160 is formed on a contact point 135 of the topmost thin film fine line metal layer 136 and divided from the polymer layers 270 and 280. The thickness t of the bump 260 may be roughly the same as the thickness d of the power plane or power bus 250 and thinner than the total thickness (d+p+q) of the power plane or power bus 250 plus the polymer layers 270 and 280, as shown in FIG. 31. Alternatively, the thickness t of the bump 260 may be thicker than the total thickness (d+p+q) of the power plane or power bus 250 plus the polymer layers 270 and 280, as shown in FIG. 32.

Figure 33:
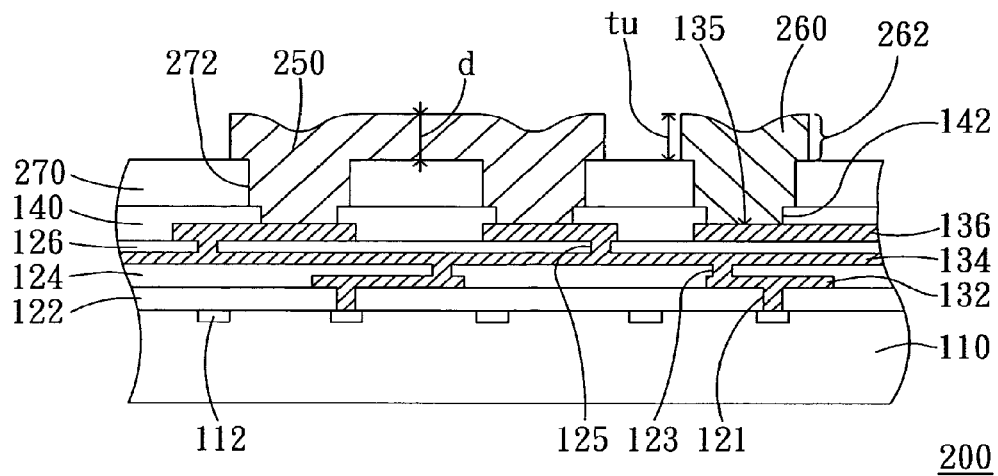
Figure 34:
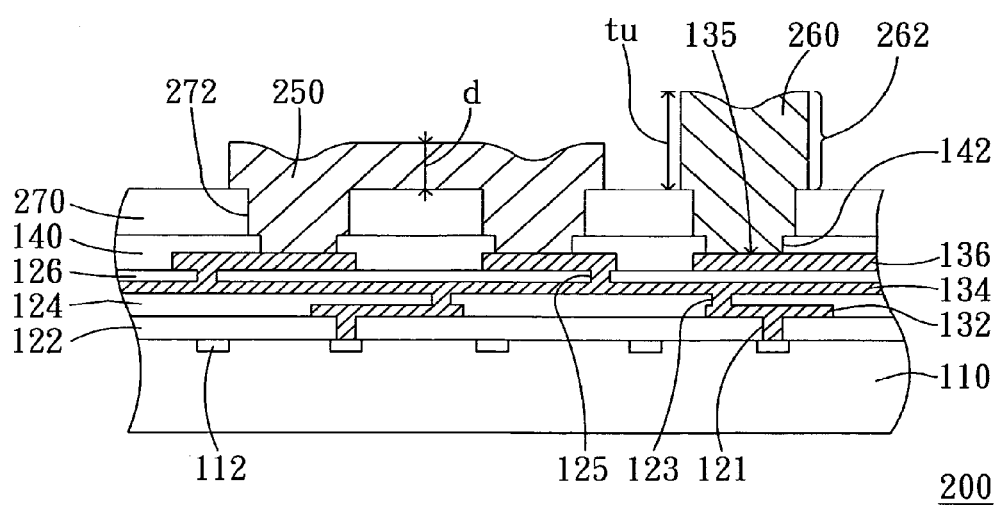

In FIGS. 33 and 34, the power plane or power bus 250 can be formed over and separate from the passivation layer 140, with a polymer layer 270 formed between the passivation layer 140 and the power plane or power bus 250. Multiple openings 272, substantially aiming at the openings 142 in the passivation layer 140, are formed in the polymer layer 270. The power plane or power bus 250 formed over the polymer layer 270 is connected to the thin film fine line metal layer 136 through the openings 272 in the polymer layer 270 and the openings 142 in the passivation layer 140. The polymer layer 280 is formed over the power plane or power bus 250. The bump 260 is formed on a contact point 135 of the topmost thin film fine line metal layer 136. The bump 260 comprises a lower portion in an opening 272 in the polymer layer 270 and an upper portion 262 outside and over the opening 272 in the polymer layer 270. The thickness tu of the upper portion 262 of the bump 260 may be roughly the same as the thickness d of the power plane or power bus 250, as shown in FIG. 33. Alternatively, the thickness tu of the upper layer portion 262 of the bump 260 may be thicker than the thickness d of the power plane or power bus 250, as shown in FIG. 34.

Figure 35:
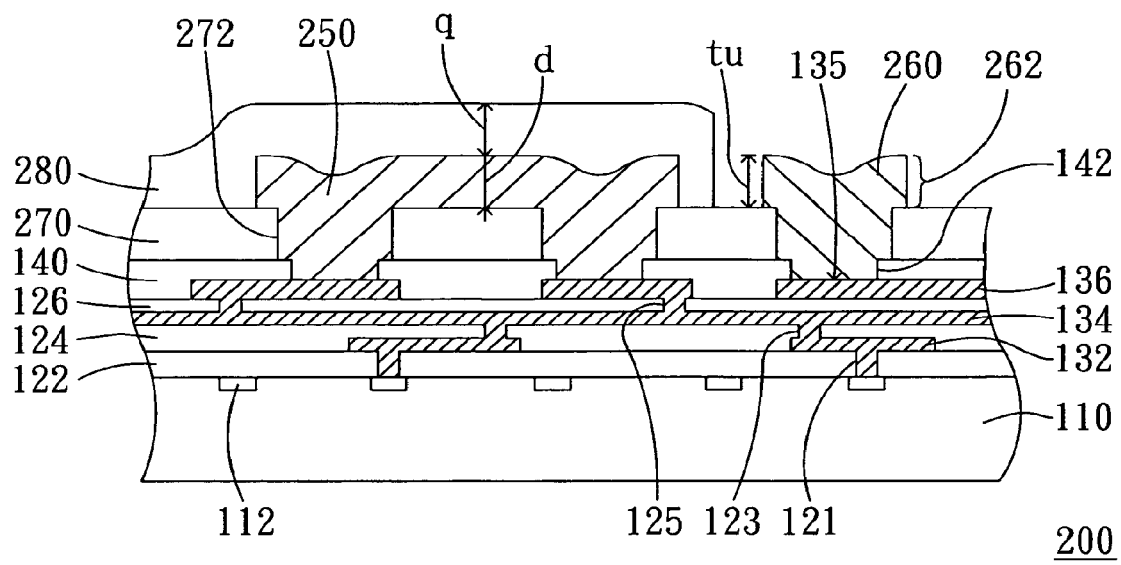
Figure 36:
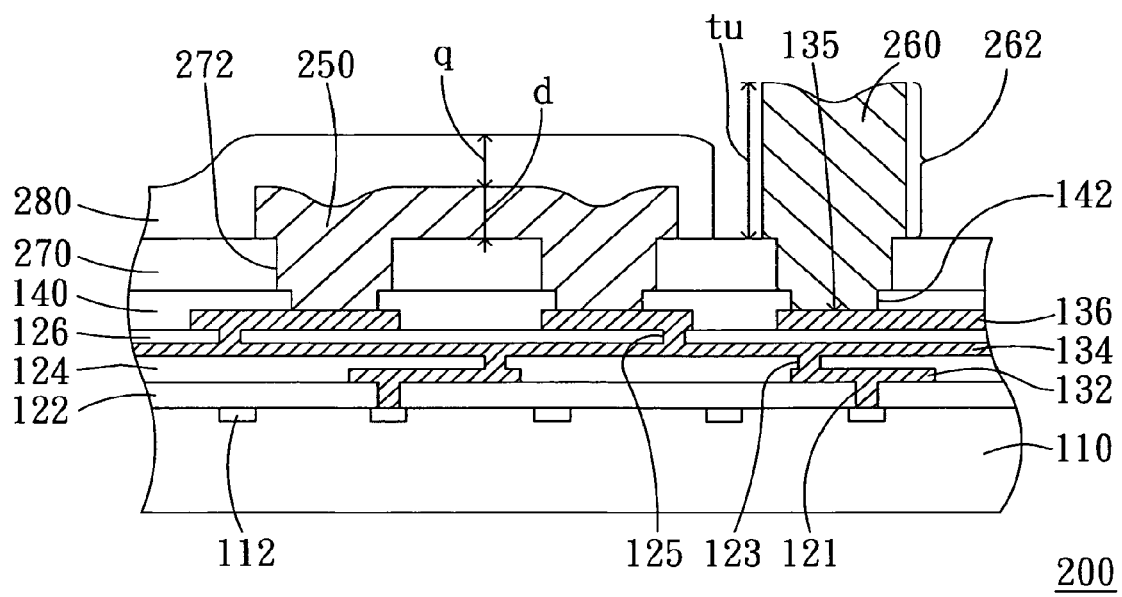

In FIGS. 35 and 36, the power plane or power bus 250 can be formed over and separate from the passivation layer 140, with a polymer layer 270 formed between the passivation layer 140 and the metal circuit line 250. Multiple openings 272, substantially aiming at the openings 142 in the passivation layer 140, are formed in the polymer layer 270. The power plane or power bus 250 formed over the polymer layer 270 is connected to the thin film fine line metal layer 136 through the openings 272 in the polymer layer 270 and the openings 142 in the passivation layer 140. Another polymer layer 280 is formed over the power plane or power bus 250. The bump 260 is formed on a contact point 135 of the topmost thin film fine line metal layer 136. The bump 260 comprises a lower portion in an opening 272 in the polymer layer 270 and an upper portion 262 outside and over the opening 272 in the polymer layer 270. The thickness tu of the upper layer portion 262 of the bump 260 may be roughly the same as the thickness d of the power plane or power bus 250 and thinner than the total thickness (d+q) of the power plane or power bus 250 plus the polymer layer 280, as shown in FIG. 35. Alternatively, the thickness to of the upper layer portion 262 of the bump 260 may be thicker than the total thickness (d+q) of the power plane or power bus 250 plus the polymer layer 280, as shown in FIG. 36.

In the embodiment as shown in FIGS. 26-36, the polymer layers 270 and 280 can be made of polyimide (PI), benzocyclobutene (BCB), parylene, porous dielectric material, or elastomer, for example. In the embodiment as shown in FIGS. 24-36, the bump 260 may comprise a principal material, such as gold, not suitable for being processed using a reflow process. Alternatively, the bump 260 may comprise a principal material, such as a tin-lead alloy, a tin-silver-copper alloy or a tin-silver alloy, suitable for being processed using a reflow process.

3. Application to Ground Plane or Bus

FIGS. 37-49 are schematic cross-sectional figures showing the chip structures according to a second embodiment of the present invention. The metal circuit 250, such as a ground plane or a ground bus, is used for providing ground voltage, for example. Multiple openings 142 in the passivation layer 140 expose the topmost layer of the thin film fine line metal layer 136. A ground plane or ground bus 250 is connected to the topmost thin film fine line metal layer 136 via the openings 142 in the passivation layer 140. The ground plane 250 is connected to a thin film ground plane or ground bus 134 that is one of the multiple thin film fine line metal layers under the passivation layer 140. A bump 260 formed on a contact point 135 of the thin film fine line metal layer 136 may comprise a principal material, such as gold, not suitable for being processed using a reflow process. Alternatively, the bump 260 may comprise a principal material, such as a tin-lead alloy, a tin-silver-copper alloy or a tin-silver alloy, suitable for being processed using a reflow process. The bump 260 can be connected to an external circuit component, such as a flexible or hard printed circuit board, a glass substrate, a thin film substrate or a TAB substrate.

Figure 37:
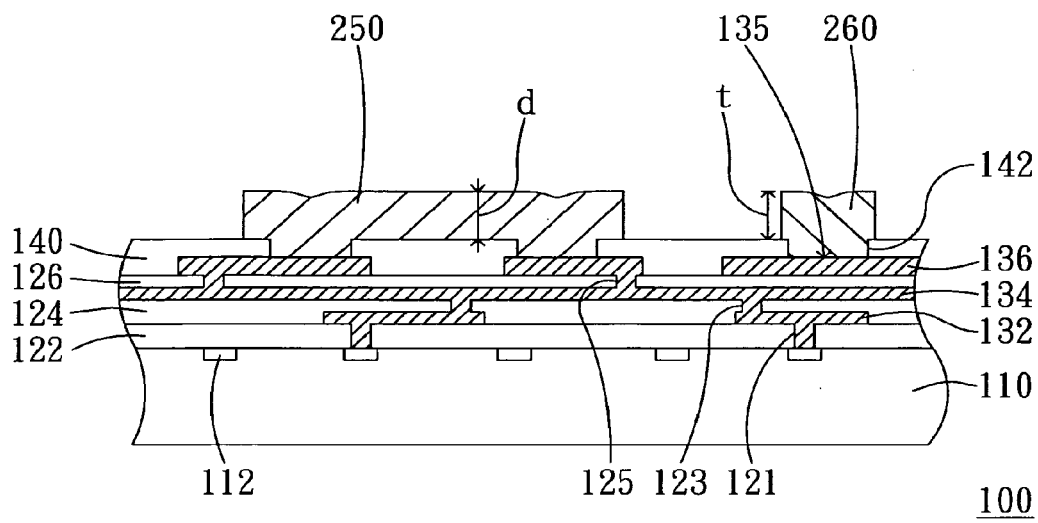
FIGS. 37-49 are schematic cross-sectional figures showing chip structures or wafer structures according to a second embodiment, wherein the metal circuit layer is used for a ground plane
Figure 38:
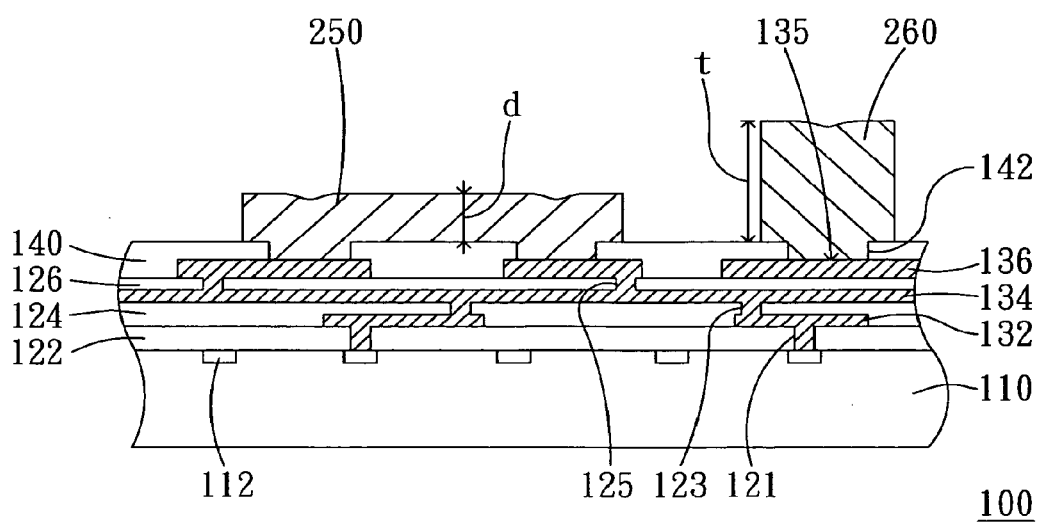

In FIGS. 37 and 38, the ground plane or bus 250 is exposed to the outer environment and formed over and in touch with the passivation layer 140. The thickness t of the bump 260 may be roughly the same as the thickness d of the ground plane or ground bus 250, as shown in FIG. 37. Alternatively, the thickness t of the bump 260 may be thicker than the thickness d of the ground plane or ground bus 250, as shown in FIG. 38.

Figure 39:
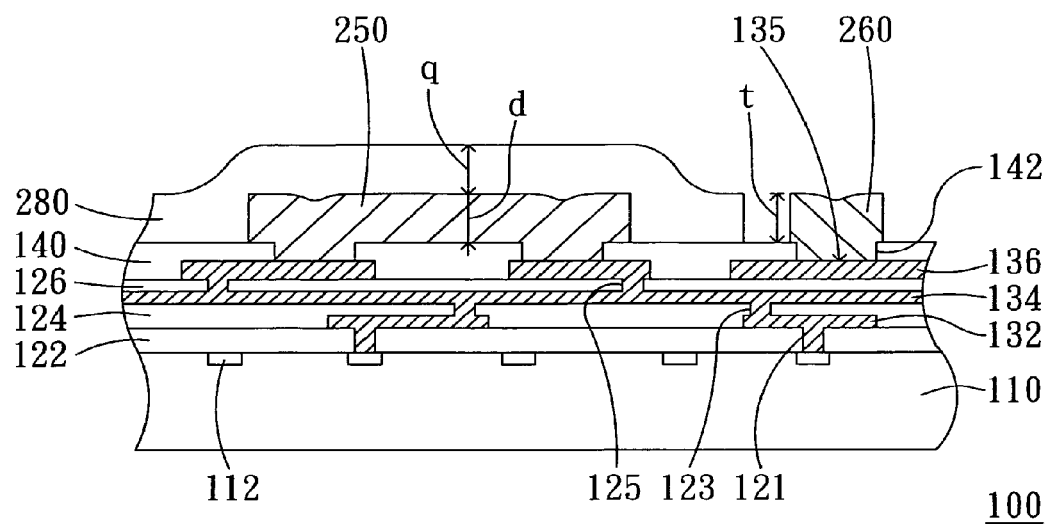
Figure 40:
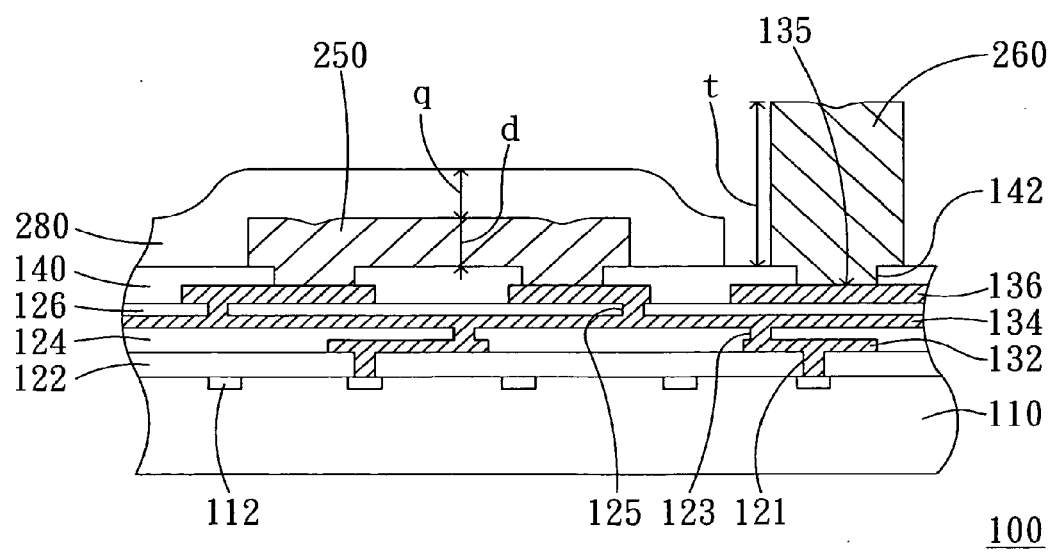

In FIGS. 39 and 40, the ground plane 250 is formed over and in touch with the passivation layer 140. The polymer layer 280 is formed over the ground plane or ground bus 250 and divided from the bump 260. The thickness t of the bump 260 may be roughly the same as the thickness d of the ground plane or ground bus 250 and thinner than the total thickness (d+q) of the ground plane or ground bus 250 plus the polymer layer 280, as shown in FIG. 39. Alternatively, the thickness t of the bump 260 may be thicker than the total thickness (d+q) of the ground plane or ground bus 250 plus the polymer layer 280, as shown in FIG. 40.

Figure 41:
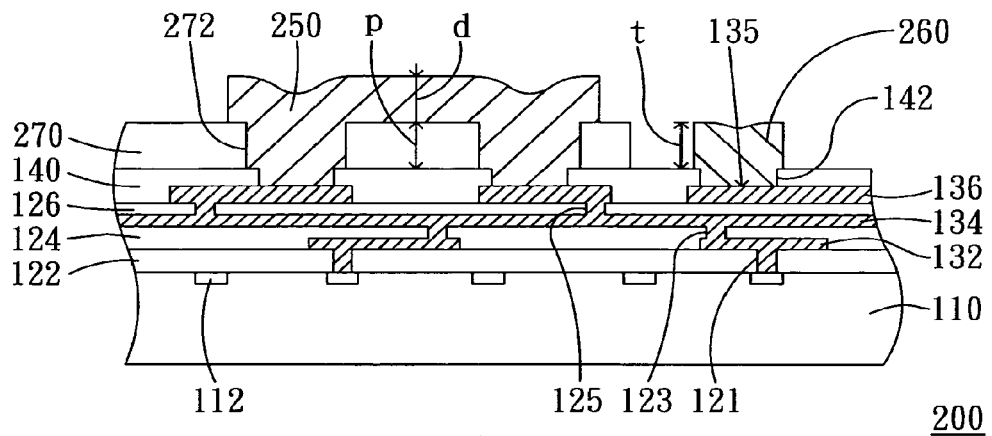
Figure 42:
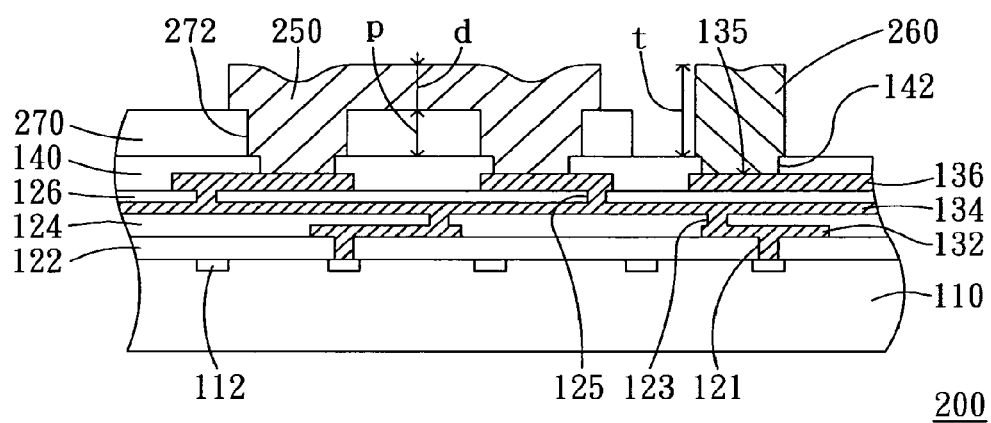
Figure 43:
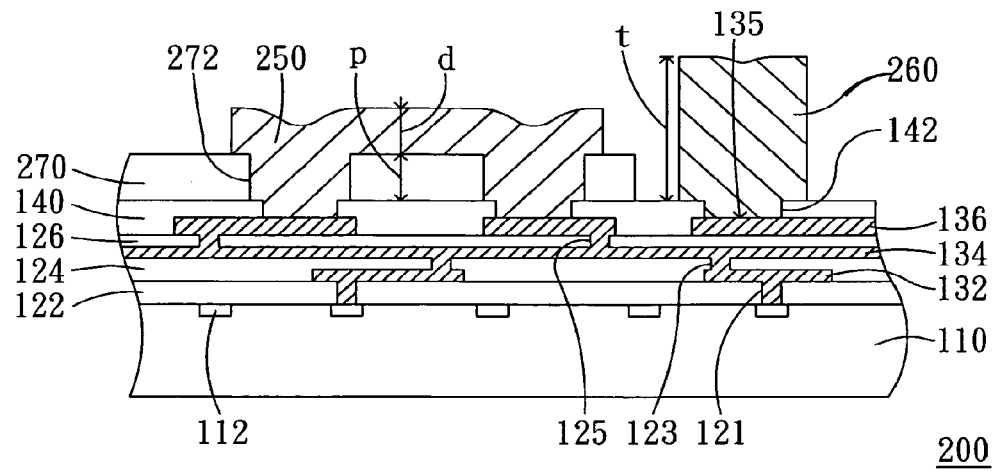

In FIGS. 41, 42 and 43, the ground plane or ground bus 250 can be formed over and separate from the passivation layer 140, with a polymer layer 270 formed between the passivation layer 140 and the ground plane or ground bus 250. Multiple openings 272, substantially aiming at the openings 142 in the passivation layer 140, are formed in the polymer layer 270. The ground plane or ground bus 250 formed over the polymer layer 270 is connected to the thin film fine line metal layer 136 through the openings 272 in the polymer layer 170 and the openings 142 in the passivation layer 140. The bump 260 is formed on the contact point 135 of the topmost thin film fine line metal layer 136 and divided from the polymer layer 270. The thickness t of the bump 260 may be roughly the same as the thickness d of the ground plane or ground bus 250 and thinner than the total thickness (d+q) of the ground plane or ground bus 250 plus the polymer layer 270, as shown in FIG. 41. Alternatively, the thickness t of the bump 260 may be roughly the same as the total thickness (d+q) of the ground plane or ground bus 250 plus the polymer layer 270, as shown in FIG. 42. Alternatively, the thickness t of the bump 260 may be thicker than the total thickness (d+q) of the ground plane or ground bus 250 plus the polymer layer 270, as shown in FIG. 43.

Figure 44:
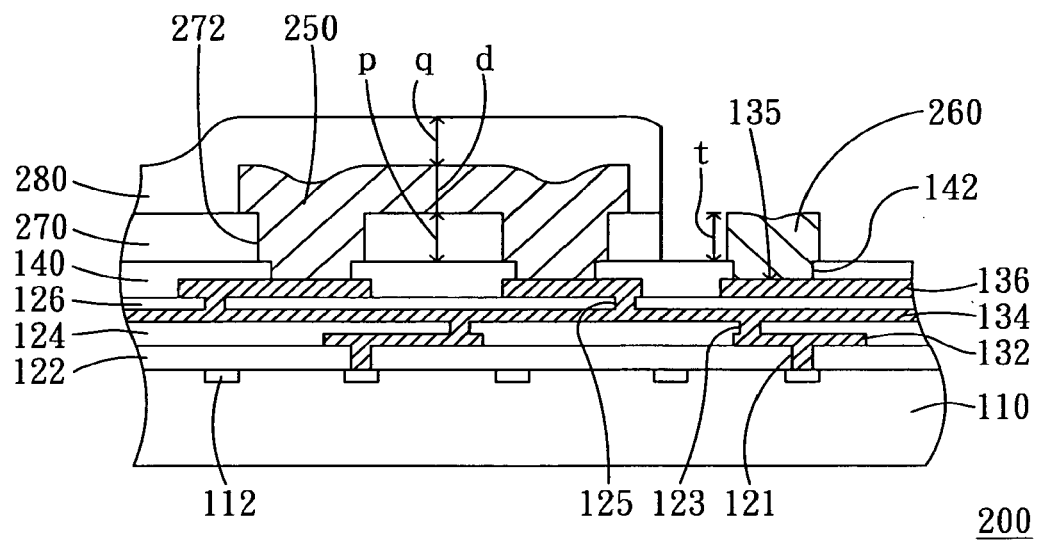
Figure 45:
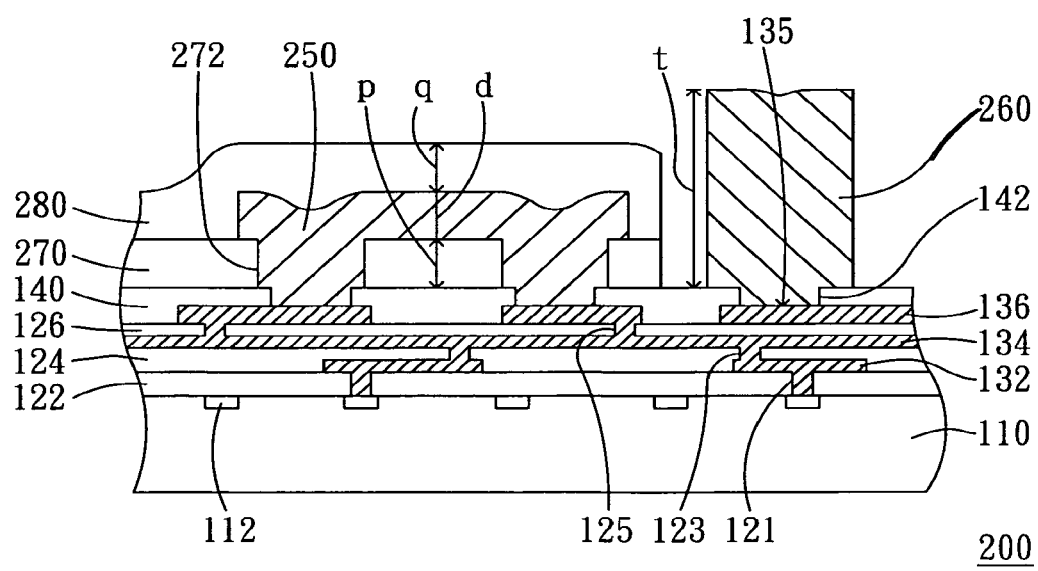

In FIGS. 44 and 45, the ground plane or ground bus 250 can be formed over and separate from the passivation layer 140, with a polymer layer 270 formed between the passivation layer 140 and the ground plane or ground bus 250. Multiple openings 272, substantially aiming at the openings 142 in the passivation layer 140, are formed in the polymer layer 270. The ground plane or ground bus 250 formed over the polymer layer 270 is connected to the thin film fine line metal layer 136 through the openings 272 in the polymer layer 270 and the openings 142 in the passivation layer 140. The polymer layer 280 is formed over the ground plane or ground bus 250. The bump 160 is formed on a contact point 135 of the topmost thin film fine line metal layer 136 and divided from the polymer layers 270 and 280. The thickness t of the bump 260 may be roughly the same as the thickness d of the ground plane or ground bus 250 and thinner than the total thickness (d+p+q) of the ground plane or ground bus 250 plus the polymer layers 270 and 280, as shown in FIG. 44. Alternatively, the thickness t of the bump 260 may be thicker than the total thickness (d+p+q) of the ground plane or ground bus 250 plus the polymer layers 270 and 280, as shown in FIG. 45.

Figure 46:
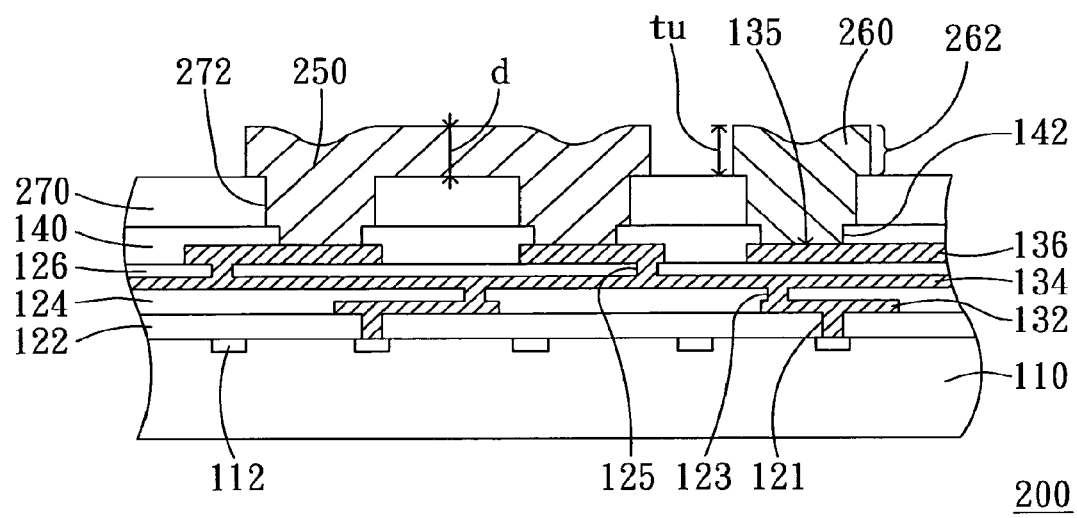
Figure 47:
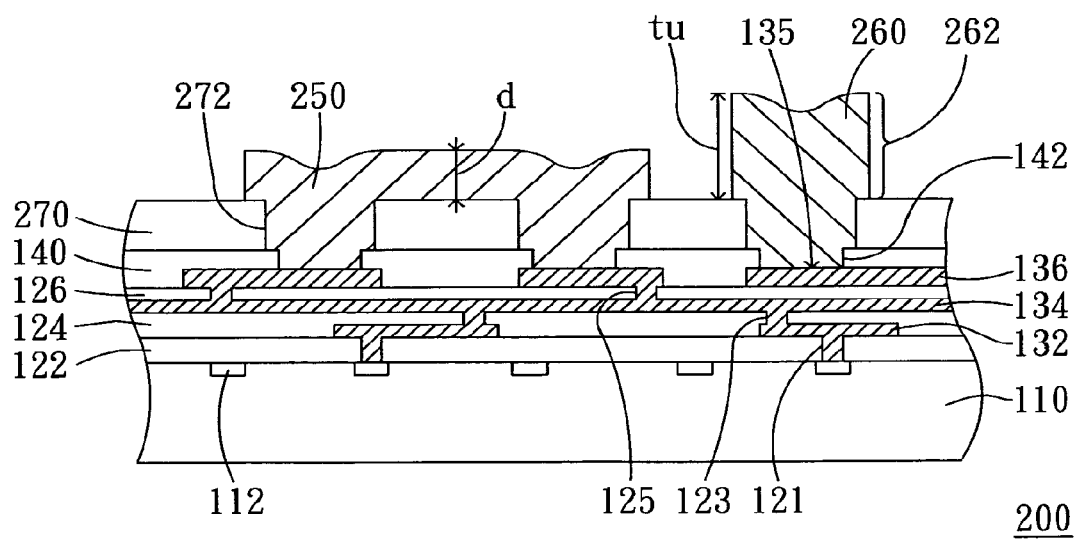

In FIGS. 46 and 47, the ground plane or ground bus 250 can be formed over and separate from the passivation layer 140, with a polymer layer 270 formed between the passivation layer 140 and the ground plane or ground bus 250. Multiple openings 272, substantially aiming at the openings 142 in the passivation layer 140, are formed in the polymer layer 270. The ground plane or ground bus 250 formed over the polymer layer 270 is connected to the thin film fine line metal layer 136 through the openings 272 in the polymer layer 270 and the openings 142 in the passivation layer 140. The polymer layer 280 is formed over the ground plane or ground bus 250. The bump 260 is formed on a contact point 135 of the topmost thin film fine line metal layer 136. The bump 260 comprises a lower portion in an opening 272 in the polymer layer 270 and an upper portion 262 outside and over the opening 272 in the polymer layer 270. The thickness tu of the upper portion 262 of the bump 260 may be roughly the same as the thickness d of the ground plane or ground bus 250, as shown in FIG. 46. Alternatively, the thickness tu of the upper layer portion 262 of the bump 260 may be thicker than the thickness d of the ground plane or ground bus 250, as shown in FIG. 47.

Figure 48:
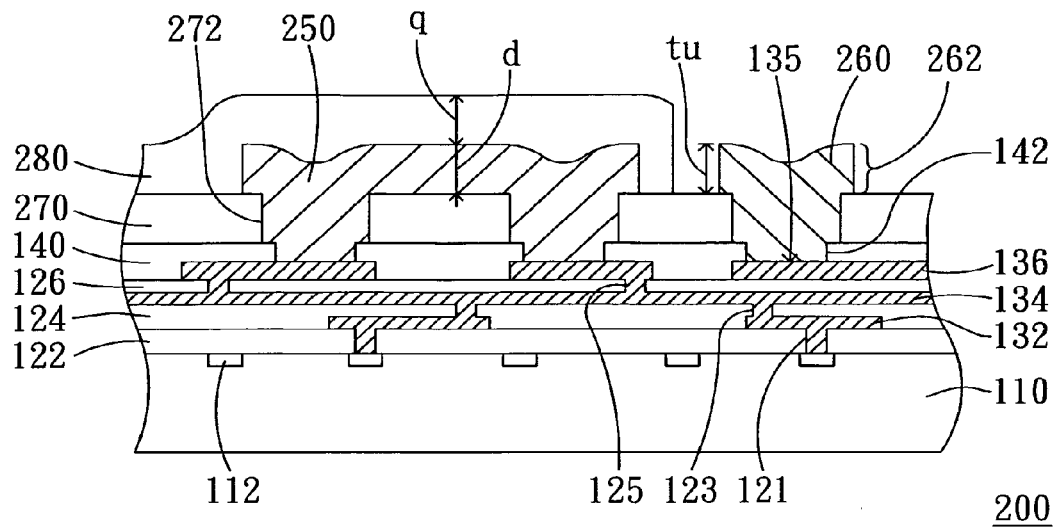
Figure 49:
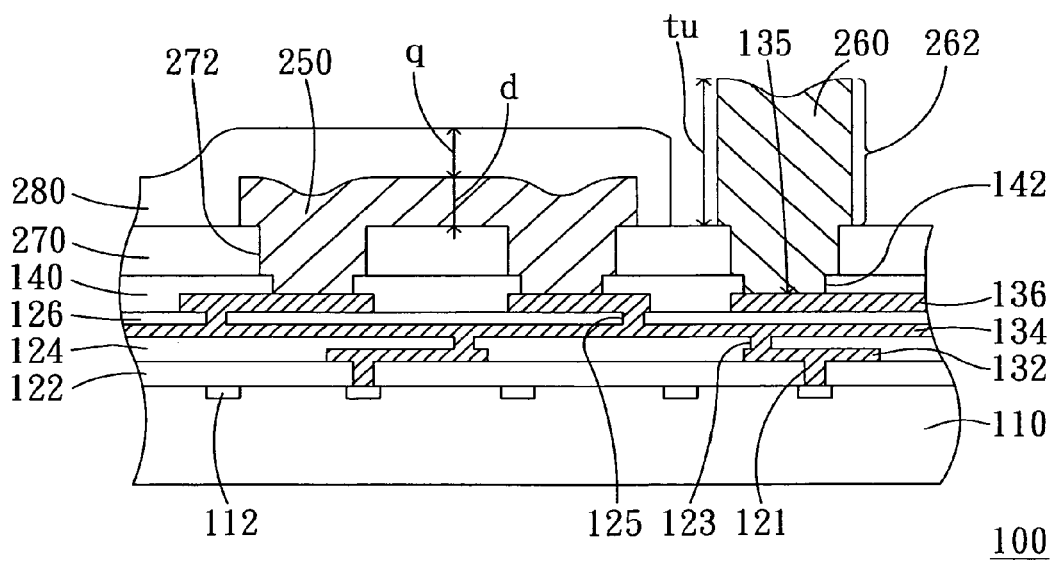

In FIGS. 48 and 49, the ground plane or ground bus 250 can be formed over and separate from the passivation layer 140, with a polymer layer 270 formed between the passivation layer 140 and the metal circuit line 250. Multiple openings 272, substantially aiming at the openings 142 in the passivation layer 140, are formed in the polymer layer 270. The ground plane or ground bus 250 formed over the polymer layer 270 is connected to the thin film fine line metal layer 136 through the openings 272 in the polymer layer 270 and the openings 142 in the passivation layer 140. Another polymer layer 280 is formed over the ground plane or ground bus 250. The bump 260 is formed on a contact point 135 of the topmost thin film fine line metal layer 136. The bump 260 comprises a lower portion in an opening 272 in the polymer layer 270 and an upper portion 262 outside and over the opening 272 in the polymer layer 270. The thickness tu of the upper layer portion 262 of the bump 260 may be roughly the same as the thickness d of the ground plane or ground bus 250 and thinner than the total thickness (d+q) of the ground plane or ground bus 250 plus the polymer layer 280, as shown in FIG. 48. Alternatively, the thickness tu of the upper layer portion 262 of the bump 260 may be thicker than the total thickness (d+q) of the ground plane or ground bus 250 plus the polymer layer 280, as shown in FIG. 49.

In the embodiment as shown in FIGS. 39-49, the polymer layers 270 and 280 can be made of polyimide (PI), benzocyclobutene (BCB), parylene, porous dielectric material, or elastomer, for example.

In the embodiment as shown in FIGS. 37-49, the bump 260 may comprise a principal material, such as gold, not suitable for being processed using a reflow process. Alternatively, the bump 260 may comprise a principal material, such as a tin-lead alloy, a tin-silver-copper alloy or a tin-silver alloy, suitable for being processed using a reflow process.

4. Application to Signal Transmission Line, Power Plane or Bus and Ground Plane or Bus Connected to Bump via Thin Film Fine Line Metal Layer FIGS. 50-62 are schematic cross-sectional figures showing the chip structures according to a second embodiment. A metal circuit 250 is connected to a bump 260 via the topmost thin film fine line metal layer 136. The metal circuit 250 may be a circuit trace for transmitting signals. Alternatively, the metal circuit 250 may be a power plane or power bus for providing a power voltage. Alternatively, the metal circuit 250 may be a ground plane or ground bus for providing a ground voltage.

The metal circuit 250 is deposited over and in touch with the passivation layer 140 and connected to the thin film fine line metal layer 136 through the openings 142 in the passivation layer 140. The bump 260 formed on a contact point 135 of the topmost thin film fine line metal layer 136 may be suitable for being bonded to a flexible or hard printed circuit board, a glass substrate, a thin film substrate or a TAB substrate, for example. The bump 260 may comprise a principal material, such as gold, not suitable for being processed using a reflow process. Alternatively, the bump 160 may comprise a principal material, such as a tin-lead alloy, a tin-silver-copper alloy or a tin-silver alloy, suitable for being processed using a reflow process. The bump 160 is connected to the metal circuit 250 through the topmost thin film layer 136. The minimum distance s between the bump 260 and the metal circuit 250 is, for example, between 1 μm and 500 μm. The metal circuit 250 is used for transmitting signals, for example.

A signal, such as address signal, data signal, clock signal, logic signal or analog signal, may be transmitted from one of the electronic devices 112 to the metal circuit 250 sequentially through the thin film fine line metal layers 132, 134 and 136 and then through the opening 142 in the passivation layer 140. Next, the signal may be transmitted from the metal circuit 250 to the bump 260 through the topmost thin film fine line metal layer 136. Alternatively, a signal may be transmitted from the bump 260 to the metal circuit 250 through the topmost thin film fine line metal layer 136. Next, the signal may be transmitted from the metal circuit 250 to one of the electronic devices 112 sequentially through the thin film fine line metal layers 136, 134 and 132. When serving as a power plane or power bus, the metal circuit layer 250 can be connected to a power end, bus or plane of a flexible or hard printed circuit board, a thin film substrate, a glass substrate, or a TAB substrate via the topmost thin film fine line metal layer 136 and the bump 260. When serving as a ground plane or ground bus, the metal circuit layer 250 can be connected to a ground end, bus or plane of a flexible or hard printed circuit board, a thin film substrate, a glass substrate, or a TAB substrate via the topmost thin film fine line metal layer 136 and the bump 260.

Figure 50:
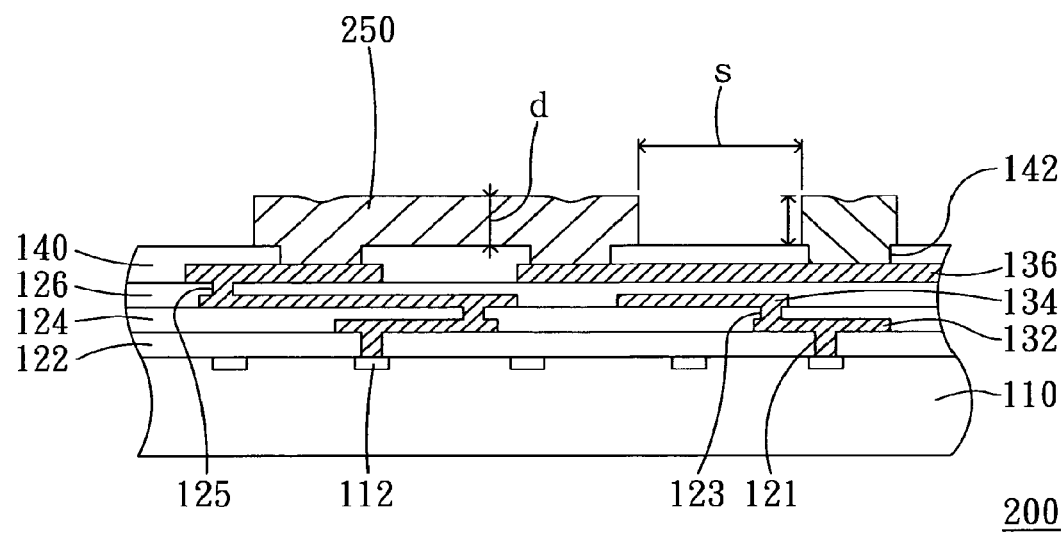
FIGS. 50-62 are schematic cross-sectional figures showing chip structures or wafer structures according to a second embodiment, wherein the metal circuit layer is used as a signal transmission line, a ground plane or a power plane, and is connected to the bump via the topmost thin film fine line metal layer.
Figure 51:
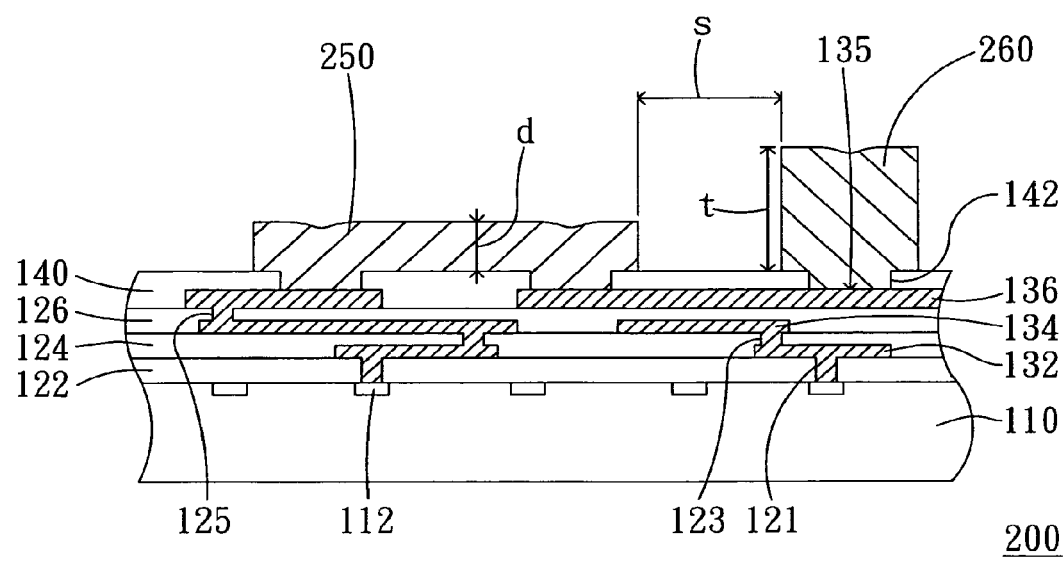
Figure 52:
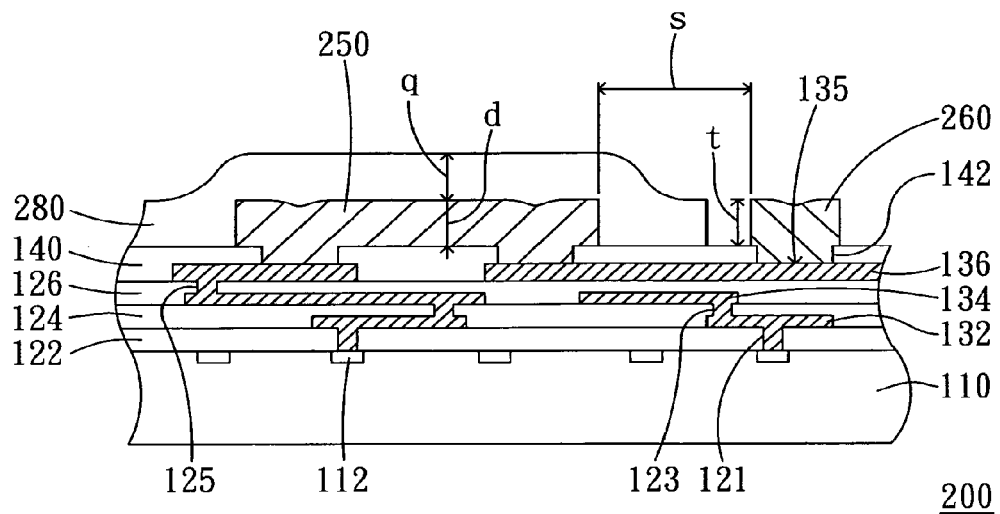

In FIGS. 50 and 51, the metal circuit 250 is exposed to the outer environment and formed over and in touch with the passivation layer 140. The thickness t of the bump 260 may be roughly the same as the thickness d of the metal circuit 250, as shown in FIG. 52. Alternatively, the thickness t of the bump 260 may be thicker than the thickness d of the metal circuit 250, as shown in FIG. 53.

Figure 53:
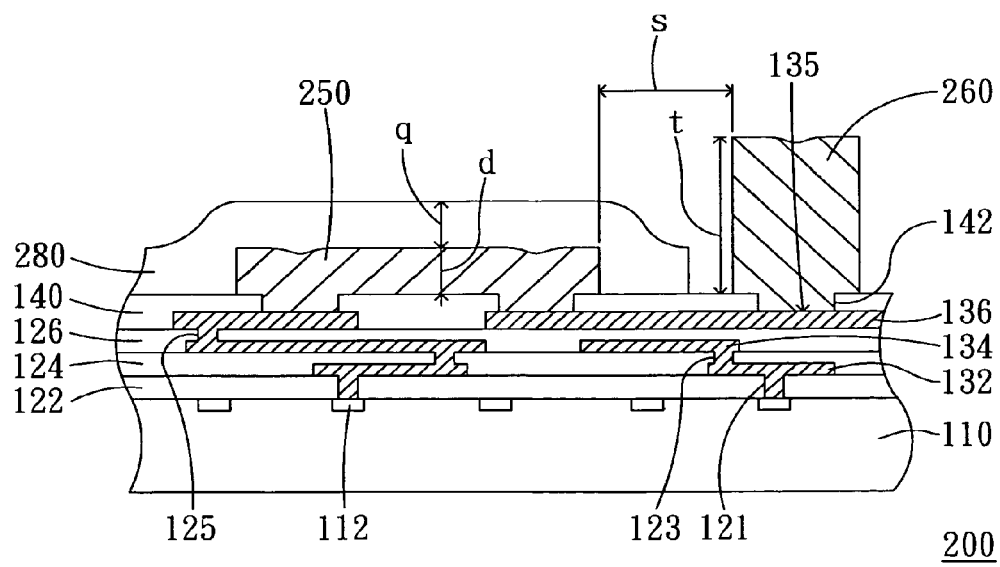

In FIGS. 52 and 53, the metal circuit layer 250 is formed over and in touch with the passivation layer 140. The polymer layer 280 is formed over the metal circuit 250 and is divided from the bump 260. The thickness t of the bump 260 may be roughly the same as the thickness d of the metal circuit 250 and thinner than the total thickness (d+q) of the metal circuit 250 plus the polymer layer 280, as shown in FIG. 52. Alternatively, the thickness t of the bump 260 may be thicker than the total thickness (d+q) of the metal circuit 250 plus the polymer layer 280, as shown in FIG. 53.

Figure 54:
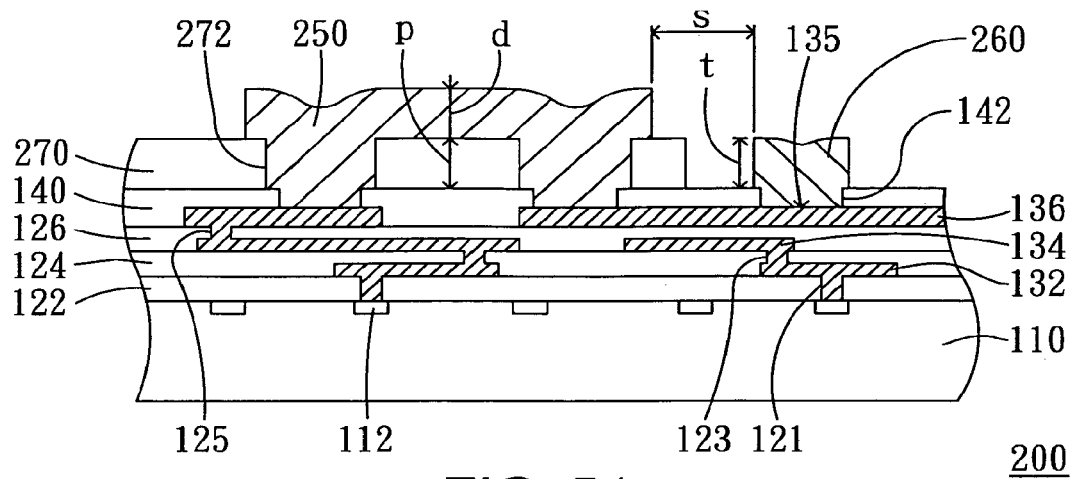
Figure 55:
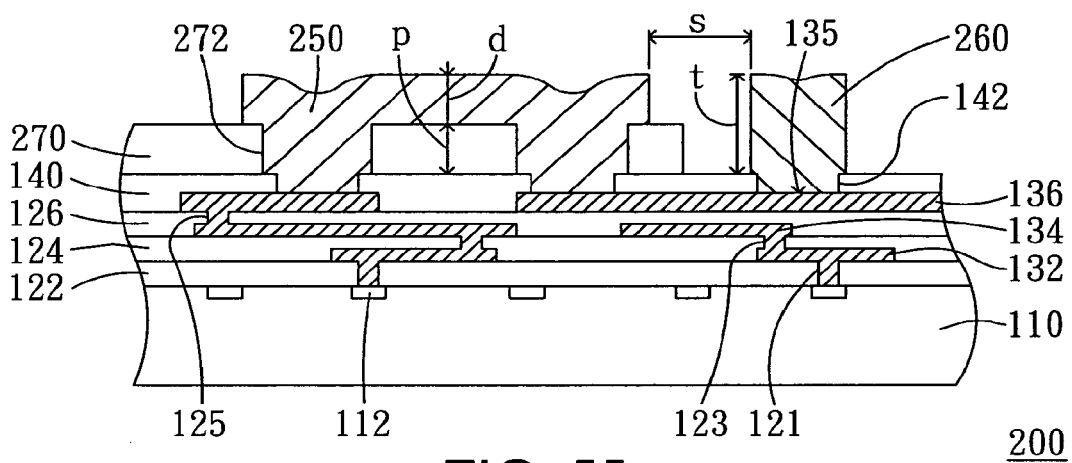
Figure 56:
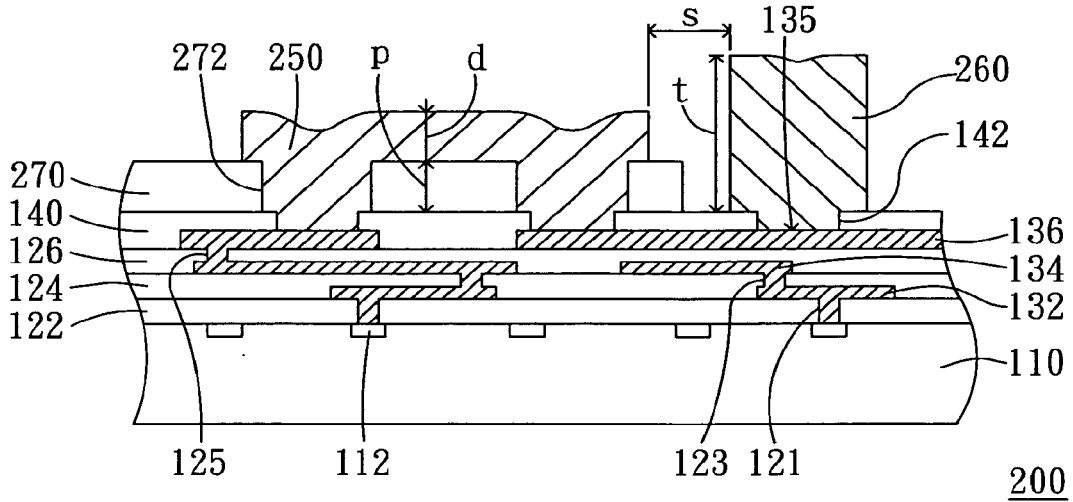

In FIGS. 54, 55 and 56, the metal circuit 250 can be formed over and separate from the passivation layer 140, with a polymer layer 270 formed between the passivation layer 140 and the metal circuit 250. Multiple openings 272, substantially aiming at the openings 142 in the passivation layer 140, are formed in the polymer layer 270. The metal circuit 250 formed over the polymer layer 270 is connected to the thin film fine line metal layer 136 through the openings 272 in the polymer layer 170 and the openings 142 in the passivation layer 140. The bump 260 is formed on a contact point 135 of the topmost thin film fine line metal layer 136 and divided from the polymer layer 270. The thickness t of the bump 260 may be roughly the same as the thickness d of the metal circuit layer 250 and thinner than the total thickness (d+q) of the metal circuit line 250 plus the polymer layer 270, as shown in FIG. 54. Alternatively, the thickness t of the bump 260 may be roughly the same as the total thickness (d+q) of the metal circuit line 250 plus the polymer layer 270, as shown in FIG. 55. Alternatively, the thickness t of the bump 260 may be thicker than the total thickness (d+q) of the metal circuit line 250 plus the polymer layer 270, as shown in FIG. 56.

Figure 57:
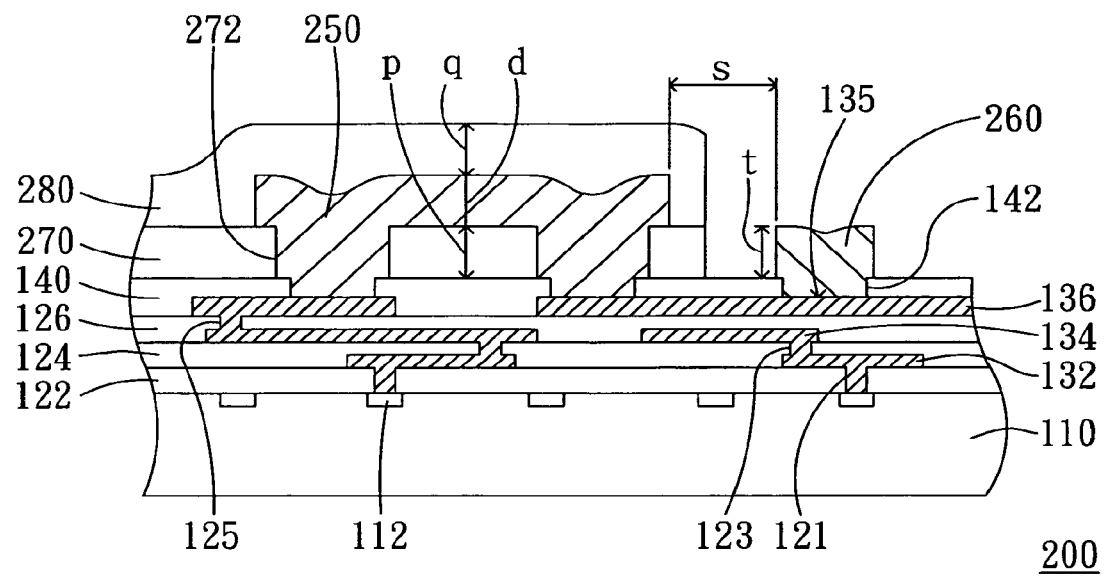
Figure 58:
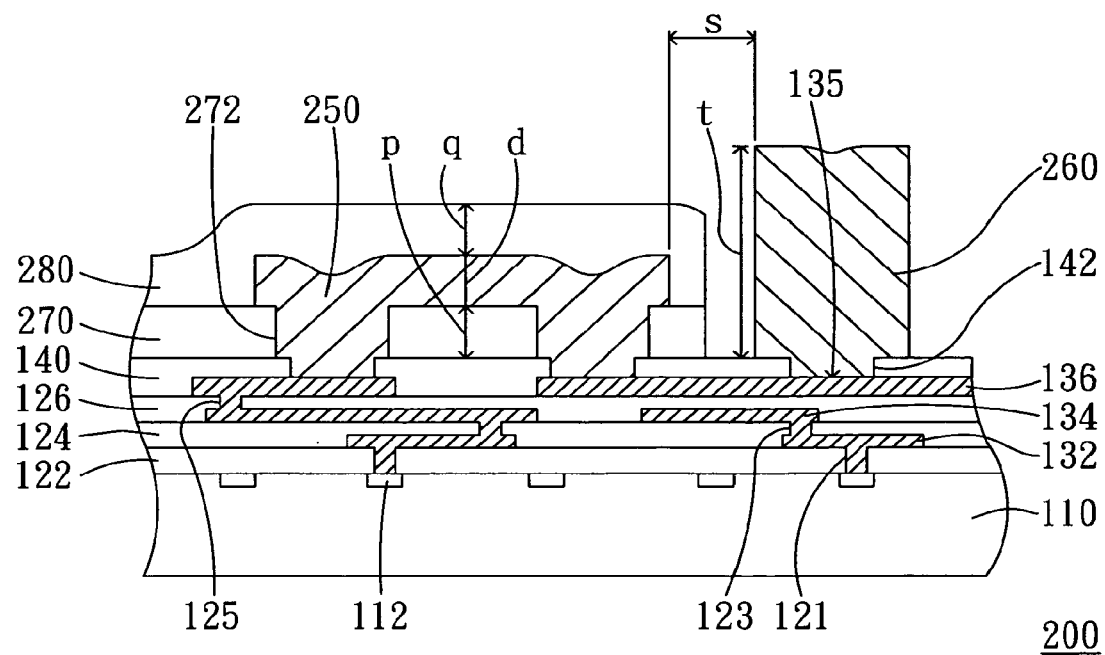

In FIGS. 57 and 58, the metal circuit 250 can be formed over and separate from the passivation layer 140, with a polymer layer 270 formed between the passivation layer 140 and the metal circuit 250. Multiple openings 272, substantially aiming at the openings 142 in the passivation layer 140, are formed in the polymer layer 270. The metal circuit 250 formed over the polymer layer 270 is connected to the thin film fine line metal layer 136 through the openings 272 in the polymer layer 270 and the openings 142 in the passivation layer 140. Another polymer layer 280 is formed over the metal circuit 250. A bump 160 is formed on a contact point 135 of the topmost thin film fine line metal layer 136 and divided from the polymer layers 270 and 280. The thickness t of the bump 260 may be roughly the same as the thickness d of the metal circuit 250 and thinner than the total thickness (d+p+q) of the metal circuit 250 plus the polymer layers 270 and 280, as shown in FIG. 57. Alternatively, the thickness t of the bump 260 may be thicker than the total thickness (d+p+q) of the metal circuit 250 plus the polymer layers 270 and 280, as shown in FIG. 58.

Figure 59:
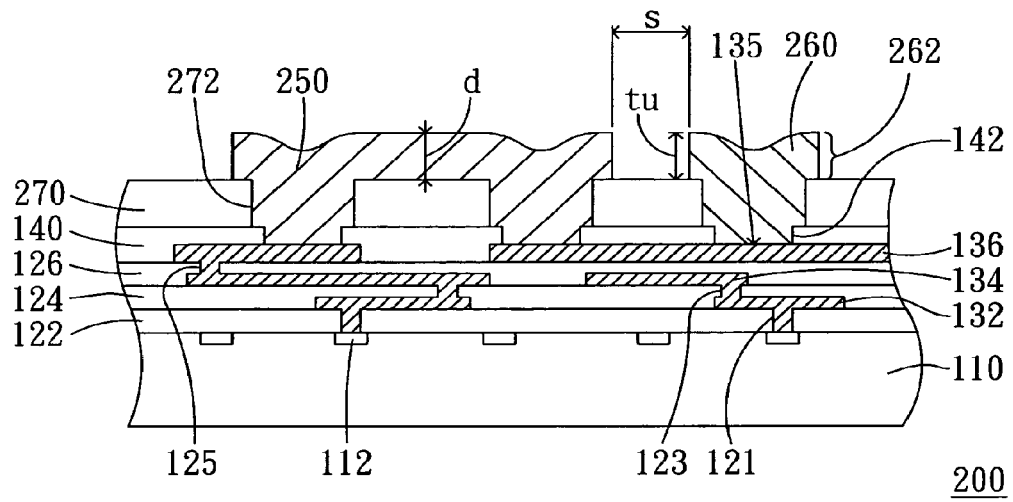
Figure 60:
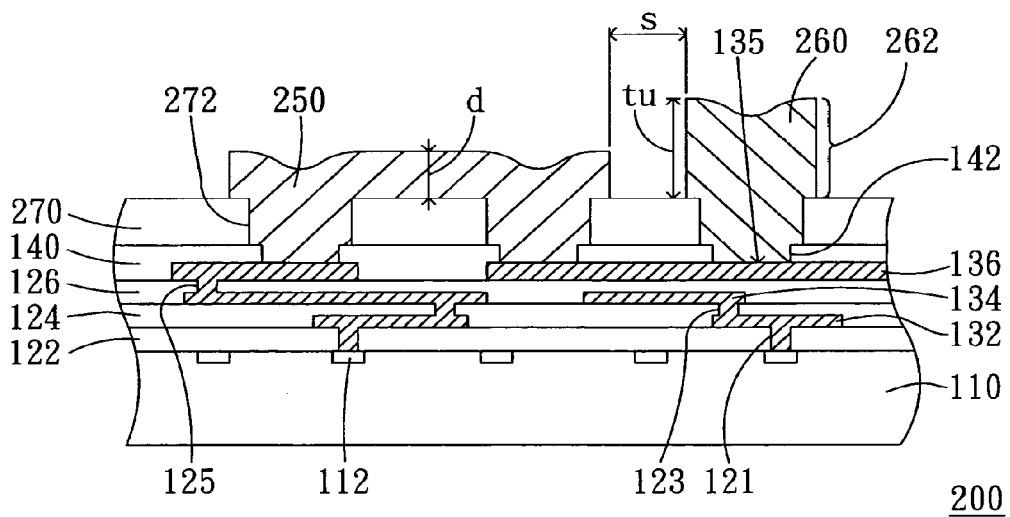

In FIGS. 59 and 60, the metal circuit 250 can be formed over and separate from the passivation layer 140, with a polymer layer 270 formed between the passivation layer 140 and the metal circuit 250. Multiple openings 272, substantially aiming at the openings 142 in the passivation layer 140, are formed in the polymer layer 270. The metal circuit 250 formed over the polymer layer 270 is connected to the thin film fine line metal layer 136 through the openings 272 in the polymer layer 270 and the openings 142 in the passivation layer 140. The bump 260 is formed on a contact point 135 of the topmost thin film fine line metal layer 136. The bump 260 comprises a lower portion in an opening 272 in the polymer layer 270 and an upper portion 262 outside and over the opening 272 in the polymer layer 270. The thickness tu of the upper portion 262 of the bump 260 may be roughly the same as the thickness d of the metal circuit 250, as shown in FIG. 59. Alternatively, the thickness tu of the upper layer portion 262 of the bump 260 may be thicker than the thickness d of the metal circuit 250, as shown in FIG. 60.

Figure 61:
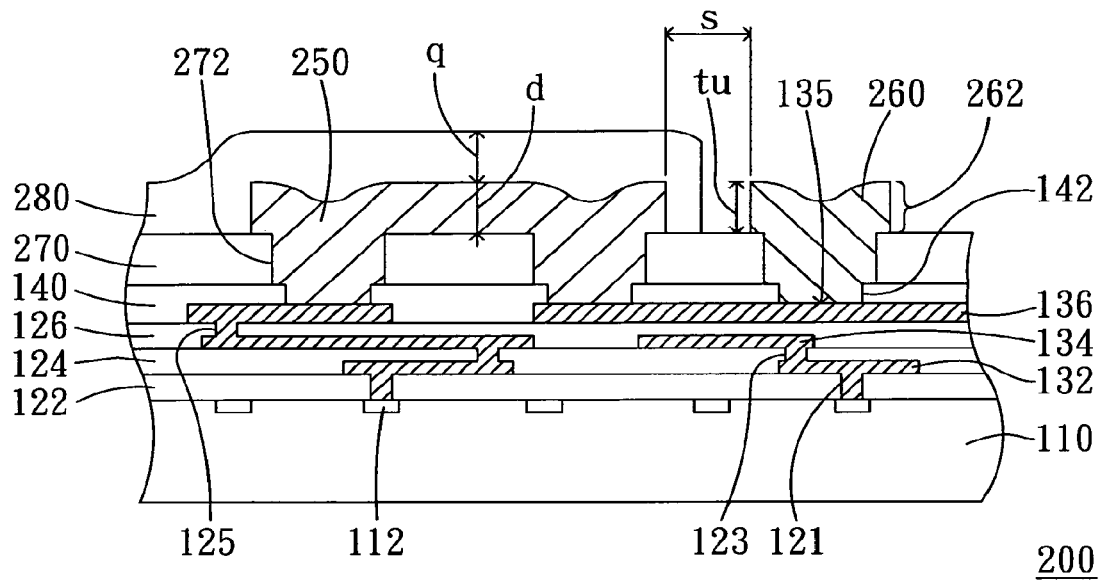
Figure 62:
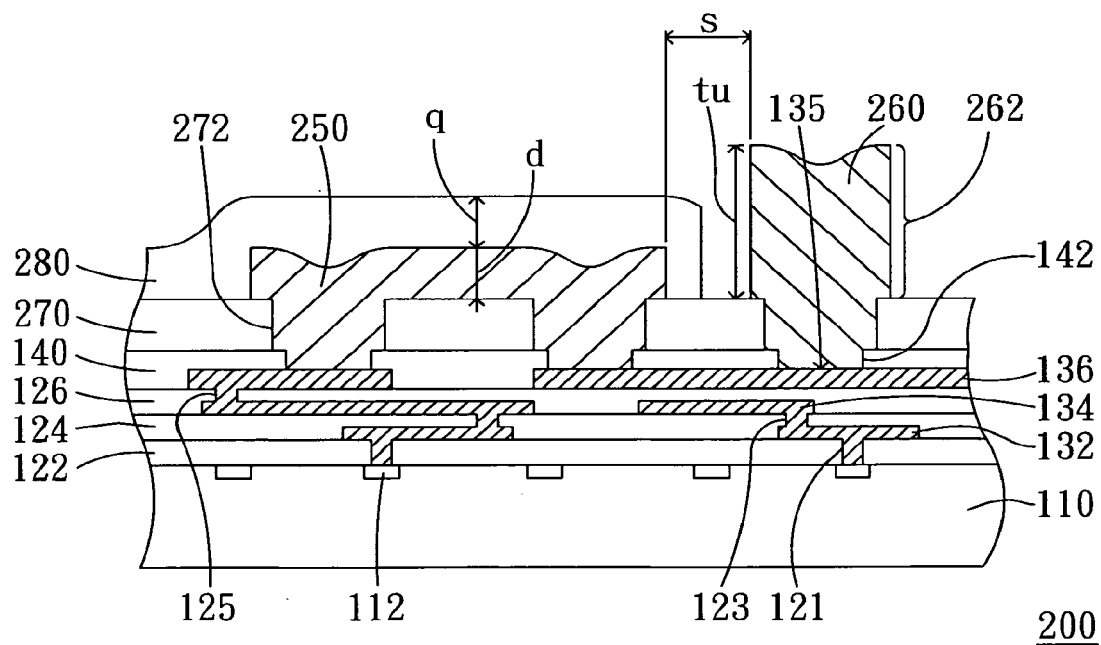

In FIGS. 61 and 62, the metal circuit 250 can be formed over and separate from the passivation layer 140, with a polymer layer 270 formed between the passivation layer 140 and the metal circuit 250. Multiple openings 272, substantially aiming at the openings 142 in the passivation layer 140, are formed in the polymer layer 270. The metal circuit 250 formed over the polymer layer 270 is connected to the thin film fine line metal layer 136 through the openings 272 in the polymer layer 270 and the openings 142 in the passivation layer 140. Another polymer layer 280 is formed over the metal circuit layer 250. The bump 260 is formed on a contact point 135 of the topmost thin film fine line metal layer 136. The bump 260 comprises a lower portion in an opening 272 in the polymer layer 270 and an upper portion 262 outside and over the opening 272 therein. The thickness tu of the upper layer portion 262 of the bump 260 may be roughly the same as the thickness d of the metal circuit line 250 and thinner than the total thickness (d+q) of the metal circuit line 250 plus the polymer layer 280, as shown in FIG. 61. Alternatively, the thickness tu of the upper layer portion 262 of the bump 260 may be thicker than the total thickness (d+q) of the metal circuit line 250 plus the polymer layer 280, as shown in FIG. 62.

In the embodiment as shown in FIGS. 52-62, the polymer layers 270 and 280 can be made of polyimide (PI), benzocyclobutene (BCB), parylene, porous dielectric material, or elastomer, for example.

In the embodiment as shown in FIGS. 50-62, the bump 260 may comprise a principal material, such as gold, not suitable for being processed using a reflow process. Alternatively, the bump 260 may comprise a principal material, such as a tin-lead alloy, a tin-silver-copper alloy or a tin-silver alloy, suitable for being processed using a reflow process.

5. Application to Signal Transmission Line, Ground Plane or Bus and Power Plane or Bus Only for External Circuit Component FIGS. 63-68 are schematic cross-sectional figures showing the chip structures according to a second embodiment of the present invention. The metal circuit 250 may be used to transmit signals or provide a power plane or bus or a ground plane or bus only for an external circuitry component.

The metal circuit 250 is formed over the passivation layer 140 and electrically disconnected to the thin film fine line metal layers 132, 134, and 136. The metal circuit 250 can be suitable for being connected to a flexible or hard printed circuit board, a glass substrate, a thin film substrate or a TAB substrate, for example.

The metal circuit 250 can be used to transmit signals only for an external circuit component. When the metal circuit 250 is connected to the external circuit component, a signal can be transmitted from an end of the external circuit component to the other end thereof through the metal circuit 250. Alternatively, the metal circuit 250 can be used to provide a power plane or bus only for an external circuit component. The power plane or bus 250 formed over the passivation layer 140 can be connected to another power plane or bus in the external circuit component. Alternatively, the metal circuit 250 can be used to provide a ground plane or bus only for an external circuit component. The ground plane or bus 250 formed over the passivation layer 140 can be connected to another ground plane or bus in the external circuit component. The external circuit component is, for example, a flexible or hard printed circuit board, a glass substrate, a thin film substrate, or a TAB substrate.

The bump 260 formed on a contact point 135 of the topmost thin film fine line metal layer 136 may be suitable for being bonded to a flexible or hard printed circuit board, a glass substrate, a thin film substrate or a TAB substrate, for example. The bump 260 may comprise a principal material, such as gold, not suitable for being processed using a reflow process. Alternatively, the bump 160 may comprise a principal material, such as a tin-lead alloy, a tin-silver-copper alloy or a tin-silver alloy, suitable for being processed using a reflow process.

Figure 63:
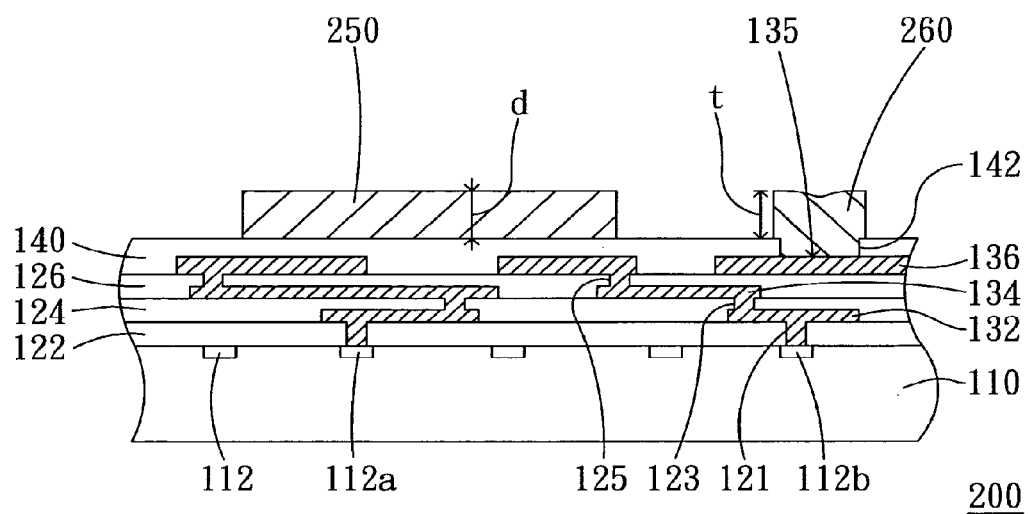
FIGS. 63-68 are schematic cross-sectional figures showing the chip structures or wafer structures according to a second embodiment, wherein the metal circuit layer is used to transmit signals or provide a power plane or bus or a ground plane or bus only for an external circuitry component.

In FIG. 63, the metal circuit 250 is exposed to the outer environment and formed over and in touch with the passivation layer 140. The bump 260 is formed on a contact point 135 of the topmost thin film fine line metal layer 136. The thickness t of the bump 260 may be roughly the same as the thickness d of the metal circuit 250.

Figure 64:
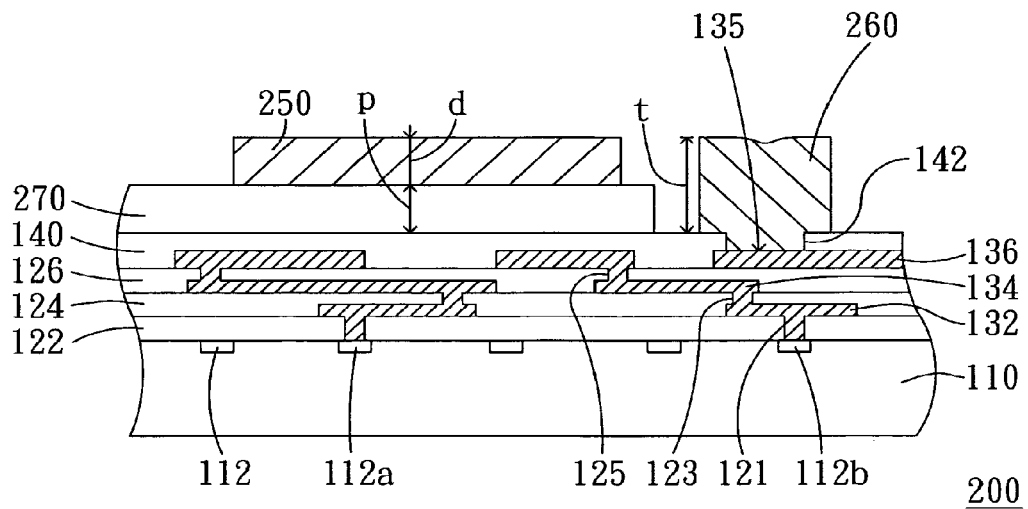

In FIG. 64, the metal circuit 250 can be formed over and separate from the passivation layer 140, with a polymer layer 270 formed between the passivation layer 140 and the metal circuit 250. The bump 260 is formed on a contact point 135 of the topmost thin film fine line metal layer 136 and divided from the polymer layer 270. The thickness t of the bump 260 may be roughly the same as the total thickness (d+q) of the metal circuit line 250 plus the polymer layer 270.

Figure 65:
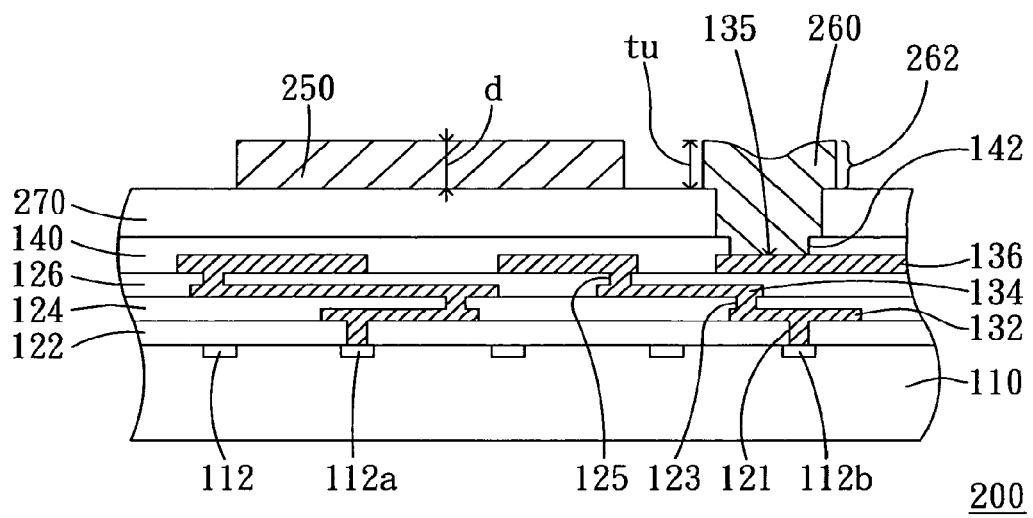

In FIG. 65, the metal circuit 250 can be formed over and separate from the passivation layer 140, with a polymer layer 270 formed between the passivation layer 140 and the metal circuit 250. An opening 272, substantially aiming at the opening 142 in the passivation layer 140, is formed in the polymer layer 270. The bump 260 is formed on a contact point 135 of the topmost thin film fine line metal layer 136. The bump 260 comprises a lower portion in an opening 272 in the polymer layer 270 and an upper portion 262 outside and over the opening 272 in the polymer layer 270. The thickness to of the upper portion 262 of the bump 260 may be roughly the same as the thickness d of the metal circuit 250.

Figure 66:
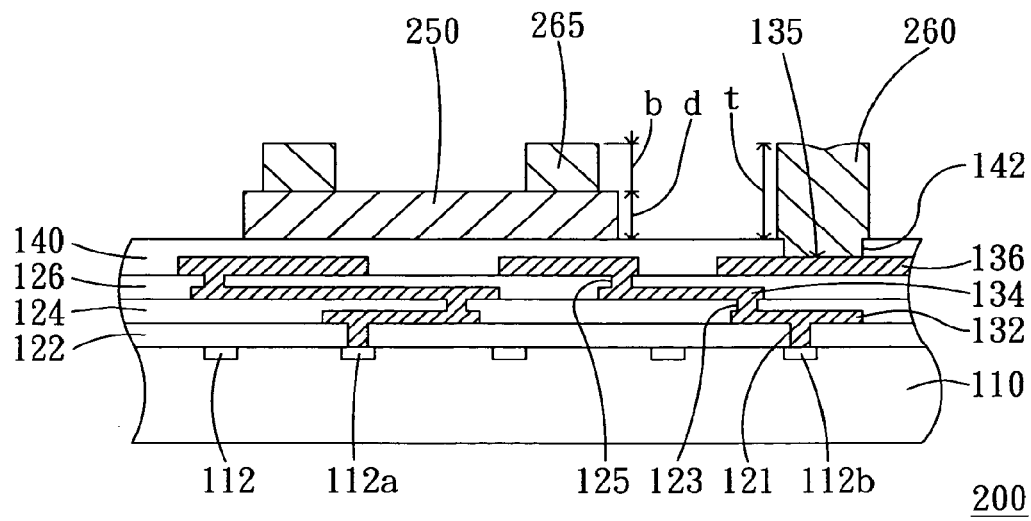

In FIG. 66, the metal circuit 250 is exposed to the outer environment and formed over and in touch with the passivation layer 140. The bumps 265 are formed on the metal circuit 250 and connect the metal circuit 250 to an external circuit component. The external circuit component is, for example, a flexible or hard printed circuit board, a glass substrate, a thin film substrate, or a TAB substrate. The bump 260 is formed on a contact point 135 of the topmost thin film fine line metal layer 136. The bumps 260 and 265 may comprise a principal material, such as gold, not suitable for being processed using a reflow process. Alternatively, the bumps 260 and 265 may comprise a principal material, such as a tin-lead alloy, a tin-silver-copper alloy or a tin-silver alloy, suitable for being processed using a reflow process. The bump 260 may have a principal material different from that of the bumps 265. While the bump 260 has a principal material comprising gold, the bumps 265 have a principal material comprising a tin-lead alloy. While the bump 260 has a principal material comprising a tin-lead alloy, the bumps 265 have a principal material comprising gold. The thickness t of the bump 260 may be roughly the same as the total thickness (d+b) of the metal circuit 250 plus the bumps 265.

Figure 67:
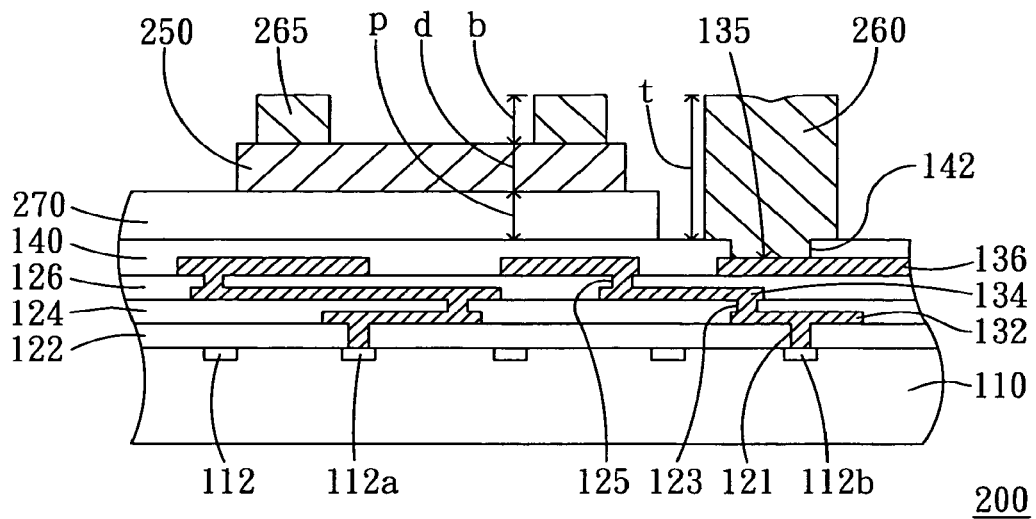

In FIG. 67, the metal circuit 250 is exposed to the outer environment and is formed over and separate from the passivation layer 140, with a polymer layer 270 formed between the passivation layer 140 and the metal circuit 250. The bumps 265 are formed on the metal circuit 250 and connect the metal circuit 250 to an external circuit component. The external circuit component is, for example, a flexible or hard printed circuit board, a glass substrate, a thin film substrate, or a TAB substrate. The bump 260 is formed on a contact point 135 of the topmost thin film fine line metal layer 136 and divided from the polymer layer 270. The bumps 260 and 265 may comprise a principal material, such as gold, not suitable for being processed using a reflow process. Alternatively, the bumps 260 and 265 may comprise a principal material, such as a tin-lead alloy, a tin-silver-copper alloy or a tin-silver alloy, suitable for being processed using a reflow process. The bump 260 may have a principal material different from that of the bumps 265. While the bump 260 has a principal material comprising gold, the bumps 265 have a principal material comprising a tin-lead alloy. While the bump 260 has a principal material comprising a tin-lead alloy, the bumps 265 have a principal material comprising gold. The thickness t of the bump 260 may be roughly the same as the total thickness (d+b+p) of the metal circuit 250 plus the bumps 265 plus the polymer layer 270.

Figure 68:
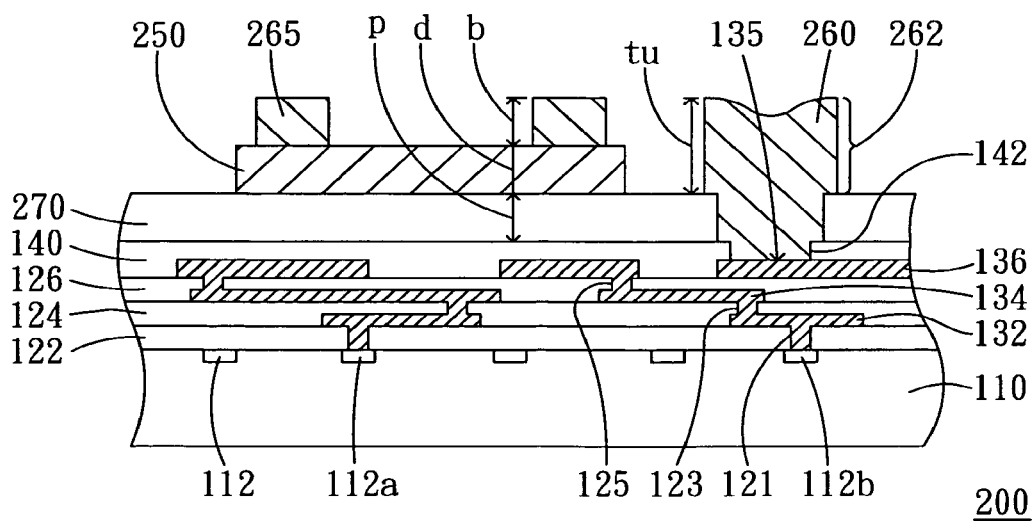

In FIG. 68, the metal circuit 250 is exposed to the outer environment and is formed over and separate from the passivation layer 140, with a polymer layer 270 formed between the passivation layer 140 and the metal circuit 250. An opening 272, substantially aiming at the opening 142 in the passivation layer 140, is formed in the polymer layer 270. The bumps 265 are formed on the metal circuit 250 and connect the metal circuit 250 to an external circuit component. The external circuit component is, for example, a flexible or hard printed circuit board, a glass substrate, a thin film substrate, or a TAB substrate. The bump 260 is formed on a contact point 135 of the topmost thin film fine line metal layer 136 and divided from the polymer layer 270. The bump 260 comprises a lower portion in the opening 272 in the polymer layer 270 and an upper portion 262 outside and over the opening 272 in the polymer layer 270. The bumps 260 and 265 may comprise a principal material, such as gold, not suitable for being processed using a reflow process. Alternatively, the bumps 260 and 265 may comprise a principal material, such as a tin-lead alloy, a tin-silver-copper alloy or a tin-silver alloy, suitable for being processed using a reflow process. The bump 260 may have a principal material different from that of the bumps 265. While the bump 260 has a principal material comprising gold, the bumps 265 have a principal material comprising a tin-lead alloy. While the bump 260 has a principal material comprising a tin-lead alloy, the bumps 265 have a principal material comprising gold. The thickness to of the top portion 262 of the bump 260 may be roughly the same as the total thickness (d+b) of the metal circuit 250 plus the bumps 265.

In the embodiment as shown in FIGS. 64, 65, 67 and 68, the polymer layer 270 can be made of polyimide (PI), benzocyclobutene (BCB), parylene, porous dielectric material, or elastomer, for example.

In the embodiment as shown in FIGS. 63-68, the bumps 260 and 265 may comprise a principal material, such as gold, not suitable for being processed using a reflow process. Alternatively, the bumps 260 and 265 may comprise a principal material, such as a tin-lead alloy, a tin-silver-copper alloy or a tin-silver alloy, suitable for being processed using a reflow process.

The Dimension and Material of the Metal Circuit Layer

The metal circuit layers 150 and 250 described in the first and second embodiment, for example, are formed by depositing an adhesion/barrier layer and at least one other metal layer. The structure of the metal circuit layers 150 and 250 is detailed as follows:

1. The First Structure of the Metal Circuit Layer

Figure 69:
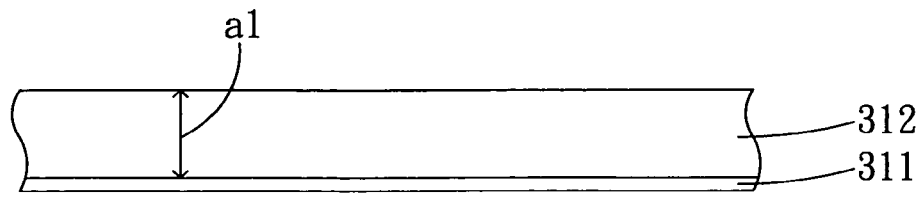
FIG. 69 is a schematic cross-sectional figure showing a detailed structure of a first type of the metal circuit layer.

FIG. 69 is schematic cross-sectional figure showing a first detailed structure of the metal circuit layers 150 and 250 in the first and second embodiments. The above-mentioned metal circuit layers 150 and 250 are composed of an adhesion/barrier layer 311 and a bulk metal layer 312, for example. The adhesion/barrier layer 311 is formed over and in touch with the above-mentioned passivation layer 140 or the polymer layer 170 or 270. The bulk metal layer 312 is formed over the adhesion/barrier layer 311. The adhesion/barrier layer 311 may comprise titanium, a titanium-tungsten alloy, titanium nitride, tantalum or tantalum nitride, for example. The bulk metal layer 312 may comprise gold, for example. The bulk metal layer 312 may have a thickness a1 thicker than 1 μm, and preferably between 2 μm and 30 μm, wherein the bulk metal layer 312 may comprise gold with greater than 90 weight percent, and, preferably, greater than 97 weight percent. Alternatively, a seed layer (unshown), such as gold, can be sputtered on the adhesion/barrier layer 311, and then the bulk metal layer 312 is electroplated on the seed layer.

2. The Second Structure of the Metal Circuit Layer

Figure 70:
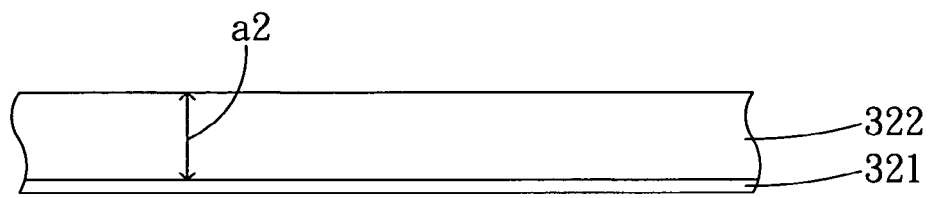
FIG. 70 is a schematic cross-sectional figure showing a detailed structure of a second type of the metal circuit layer.

FIG. 70 is schematic cross-sectional figure showing a first structure of the metal circuit layers 150 and 250 in the first and second embodiments. The above-mentioned metal circuit layers 150 and 250 are composed of an adhesion/barrier layer 321 and a bulk metal layer 322, for example. The adhesion/barrier layer 321 is formed over and in touch with the above-mentioned passivation layer 140 or the polymer layer 170 or 270. The bulk metal layer 322 is formed over the adhesion/barrier layer 321. The adhesion/barrier layer 321 may comprise titanium, a titanium-tungsten alloy, titanium nitride, tantalum or tantalum nitride, for example. Alternatively, the adhesion/barrier layer 321 may be formed by depositing a chromium layer and then depositing a chromium-copper layer on the chromium layer. The bulk metal layer 322 may have a thickness a2 thicker than 1 μm, and preferably between 2 μm and 30 μm, wherein the bulk metal layer 322 may comprise copper with greater than 90 weight percent, and, preferably, greater than 97 weight percent. Alternatively, a seed layer (unshown), such as copper, can be sputtered on the adhesion/barrier layer 321, and then the bulk metal layer 322 is electroplated on the seed layer.

3. The Third Structure of the Metal Circuit Layer

Figure 71:
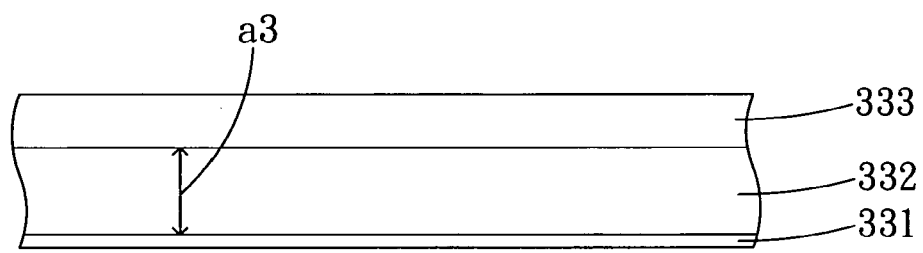
FIG. 71 is a schematic cross-sectional figure showing a detailed structure of a third type of the metal circuit layer.

FIG. 71 is schematic cross-sectional figure showing a first structure of the metal circuit layers 150 and 250 in the first and second embodiments. The above-mentioned metal circuit layers 150 and 250 are composed of an adhesion/barrier layer 331, a bulk metal layer 332 and a metal layer 333, for example. The adhesion/barrier layer 331 is formed over and in touch with the above-mentioned passivation layer 140 or the polymer layer 170 or 270. The bulk metal layer 332 is formed over the adhesion/barrier layer 331, and the metal layer 333 is formed on the bulk metal layer 332. The adhesion/barrier layer 331 may comprise titanium, a titanium-tungsten alloy, titanium nitride, tantalum or tantalum nitride, for example. Alternatively, the adhesion/barrier layer 331 may be formed by depositing a chromium layer and then depositing a chromium-copper layer on the chromium layer. The bulk metal layer 332 may have a thickness a2 thicker than 1 μm, and preferably between 2 μm and 30 μm, wherein the bulk metal layer 332 may comprise copper with greater than 90 weight percent, and, preferably, greater than 97 weight percent. The metal layer 333 comprises nickel, for example, and has a thickness thicker than 1 μm, and preferably between 2 μm and 5 μm. Alternatively, a seed layer (unshown), such as copper, can be sputtered on the adhesion/barrier layer 331, then the bulk metal layer 332 is electroplated on the seed layer, and then the metal layer 333 is electroplated on the bulk metal layer 332.

4. The Fourth Structure of the Metal Circuit Layer

Figure 72:
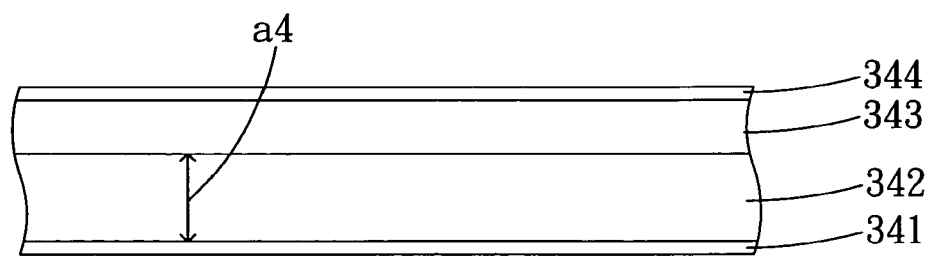
FIG. 72 is a schematic cross-sectional figure showing a detailed structure of a fourth type of the metal circuit layer.

FIG. 72 is schematic cross-sectional figure showing a first structure of the metal circuit layers 150 and 250 in the first and second embodiments. The above-mentioned metal circuit layers 150 and 250 are composed of an adhesion/barrier layer 341, a bulk metal layer 342, a metal layer 343 and a metal layer 344, for example. The adhesion/barrier layer 341 is formed over and in touch with the above-mentioned passivation layer 140 or the polymer layer 170 or 270. The bulk metal layer 342 is formed over the adhesion/barrier layer 341, the metal layer 343 is formed on the bulk metal layer 342, and the metal layer 344 is formed on the metal layer 343. The adhesion/barrier layer 341 may comprise titanium, a titanium-tungsten alloy, titanium nitride, tantalum or tantalum nitride, for example. Alternatively, the adhesion/barrier layer 341 may be formed by depositing a chromium layer and then depositing a chromium-copper layer on the chromium layer. The bulk metal layer 342 may have a thickness a4 thicker than 1 μm, and preferably between 2 μm and 30 μm, wherein the bulk metal layer 342 may comprise copper with greater than 90 weight percent, and, preferably, greater than 97 weight percent. The metal layer 343 comprises nickel, for example, and has a thickness thicker than 1 μm, and preferably between 2 μm and 5 μm. The metal layer 344 is made of gold, for example, and has a thickness thicker than 100 angstroms, and preferably between 1 μm and 1000 angstroms. Alternatively, a seed layer (unshown), such as copper, can be sputtered on the adhesion/barrier layer 341, then the bulk metal layer 342 is electroplated on the seed layer, then the metal layer 343 is electroplated on the bulk metal layer 342, and then the metal layer 344 is electroplated on the metal layer 343.

The Dimension and Material of the Bump

The bump 160a, 160b, 160c, 260 or 265 in the above-mentioned embodiment can be divided into two groups. One group is reflowable or solder bump that comprises solder or other reflowable metals or metal alloys at the topmost of the reflowable or solder bump. The reflowable bumps are usually reflowed with a certain reflow temperature profile, typically ramping up from a starting temperature to a peak temperature, and then cooled down to a final temperature. The peak temperature is roughly set at the melting temperature of solder, or metals or metal alloys used for reflow or bonding purpose. The reflowable bump starts to reflow when temperature reaches the melting temperature of solder, or reflowable metal, or reflowable metal alloys (i.e. is roughly the peak temperature) for over 20 seconds. The period of the whole temperature profile takes over 2 minutes, typically 5 to 45 minutes. In summary, the bumps are reflowed at the temperature of between 150 and 350 centigrade degrees for more than 20 seconds or for more than 2 minutes. The reflowable bump comprises solder or other metals or alloys with melting point between 150 and 350 centigrade degrees. The reflowable bump comprises a lead-containing solder material, such as tin-lead alloy, or a lead-free solder material, such as tin-silver alloy or tin-silver-copper alloy at the topmost of the reflowable bump. Typically, the lead-free material may have a melting point greater than 185 centigrade degrees, or greater than 200 centigrade degrees, or greater than 250 centigrade degrees. The other group is non-reflowable or non-solder bump that can not be reflowed at the temperature of greater than 350 centigrade degrees for more than 20 seconds or for more than 2 minutes. Each component of the non-reflowable or the non-solder bump does not reflow at the temperature of more than 350 centigrade degrees for more than 20 seconds or for more than 2 minutes. The non-reflowable bump comprises metals or metal alloys with a melting point greater than 350 centigrade degrees or greater than 400 centigrade degrees, or greater than 600 centigrade degrees. Moreover, the non-reflowable bump do not comprise any metals or metal alloys with melting temperature lower than 350 centigrade degrees. The non-reflowable bump may have a topmost metal layer comprising gold with greater than 90 weight percent and, preferably, greater than 97 weight percent. Alternatively, the non-reflowable bump may have a topmost metal layer with gold ranging from 0 weight percent to 90 weight percent, or ranging from 0 weight percent to 50 weight percent, or ranging from 0 weight percent to 10 weight percent.

Figure 73:
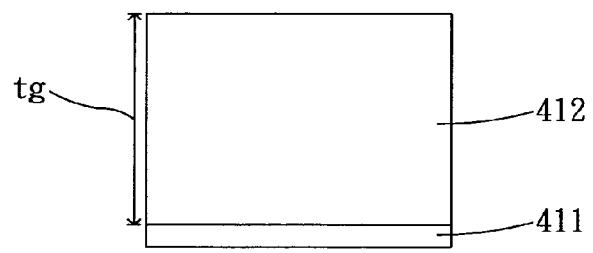
FIG. 73 is a schematic cross-sectional figure showing a detailed structure of a bump.

In this paragraph, the detailed non-reflowable or non-solder bump used for the bumps 160a, 160b, 160c and 265 as shown in FIGS. 1-10 and 66-68 is discussed. The bumps 160a, 160b, 160c and 265 may only have a single metal layer having a thickness thicker than 5 μm, and preferably between 7 μm and 30 μm, for example. The single metal layer may comprise gold with greater than 90 weight percent, and, preferably, greater than 97 weight percent. Alternatively, the single metal layer may comprise copper with greater than 90 weight percent, and, preferably, greater than 97 weight percent. Alternatively, the single metal layer may comprise platinum with greater than 90 weight percent, and, preferably, greater than 97 weight percent. Alternatively, the single metal layer may comprise silver with greater than 90 weight percent, and, preferably, greater than 97 weight percent. Alternatively, the single metal layer may comprise palladium with greater than 90 weight percent, and, preferably, greater than 97 weight percent. Alternatively, the single metal layer may comprise rhodium with greater than 90 weight percent, and, preferably, greater than 97 weight percent. Alternatively, the bumps 160a, 160b, 160c and 265 may only have a single solder layer having a thickness thicker than 10 μm, and preferably between 25 μm and 300 μm, and comprising a lead-containing solder material, such as a tin-lead alloy, or a lead-free solder material, such as a tin-silver alloy or a tin-silver-copper alloy. Alternatively, the bumps 160a, 160b, 160c and 265 may be formed by depositing an adhesion/barrier layer 411 and a bulk metal layer 412, as shown in FIG. 73. The adhesion/barrier layer 411 may be formed by electroplating a nickel layer on the metal circuit layer 150. The bulk metal layer 412 may be electroplated with a thickness tg greater than 5 μm, preferably between 12 μm and 30 μm, on the adhesion/barrier layer 411 made of nickel, wherein the bulk metal layer 412 may comprise gold with greater than 90 weight percent, and, preferably, greater than 97 weight percent. Alternatively, the bulk metal layer 412 may be electroplated with a thickness tg greater than 5 μm and, preferably, between 7 μm and 30 μm on the adhesion/barrier layer 411 made of nickel, wherein the bulk metal layer 412 may comprise copper with greater than 90 weight percent, and, preferably, greater than 97 weight percent. Alternatively, the bulk metal layer 412 may be electroplated with a thickness tg greater than 5 μm and, preferably, between 7 μm and 30 μm on the adhesion/barrier layer 411 made of nickel, wherein the bulk metal layer 412 may comprise silver with greater than 90 weight percent, and, preferably, greater than 97 weight percent. Alternatively, the bulk metal layer 412 may be electroplated with a thickness tg greater than 5 μm and, preferably, between 7 μm and 30 μm on the adhesion/barrier layer 411 made of nickel, wherein the bulk metal layer 412 may comprise platinum with greater than 90 weight percent, and, preferably, greater than 97 weight percent. Alternatively, the bulk metal layer 412 may be electroplated with a thickness tg greater than 5 μm and, preferably, between 7 μm and 30 μm on the adhesion/barrier layer 411 made of nickel, wherein the bulk metal layer 412 may comprise palladium with greater than 90 weight percent, and, preferably, greater than 97 weight percent. Alternatively, the bulk metal layer 412 may be electroplated with a thickness tg greater than 5 μm and, preferably, between 7 μm and 30 μm on the adhesion/barrier layer 411 made of nickel, wherein the bulk metal layer 412 may comprise rhodium with greater than 90 weight percent, and, preferably, greater than 97 weight percent. The above-mentioned various bumps 160a, 160b, 160c and 265 can be formed on the metal circuit layer 150 or 250 with any one of the structures shown in FIGS. 69-72.

In this paragraph, the detailed reflowable or solder bump used for the bumps 160a, 160b, 160c and 265 as shown in FIGS. 1-10 and 66-68 is discussed. The bumps 160a, 160b, 160c and 265 may be formed by depositing an adhesion/barrier layer 411 and a bulk metal layer 412, as shown in FIG. 73. The adhesion/barrier layer 411 may be formed by electroplating a nickel layer on the metal circuit layer 150. The bulk metal layer 412 may be formed by electroplating a solder layer with a thickness tg between 25 μm and 300 μm on the adhesion/barrier layer 411 made of nickel, wherein the solder layer may be a tin-lead alloy, a tin-silver-copper alloy, a tin-silver alloy or other solder material. The above-mentioned various bumps 160a, 160b, 160c and 265 can be formed on the metal circuit layer 150 or 250 with any one of the structures shown in FIGS. 69-72.

In this paragraph, the detailed non-reflowable or non-solder bump used for the bump 260 as shown in FIGS. 11-68 is discussed. The bump 260 may be formed by sputtering an adhesion/barrier layer 411 on a contact point 135 and then electroplating a bulk metal layer 412 on the adhesion/barrier layer 411, as shown in FIG. 73. The bump 260 may be formed by sputtering a titanium-tungsten alloy, functioning as a adhesion/barrier layer 411, on a contact point 135, and then electroplating a bulk metal layer 412 with a thickness tg greater than 5 μm, and preferably between 7 μm and 100 μm, on the adhesion/barrier layer, wherein the bulk metal layer 412 may comprise gold with greater than 90 weight percent, and, preferably, greater than 97 weight percent, or the bulk metal layer 412 may comprise copper with greater than 90 weight percent, and, preferably, greater than 97 weight percent, or the bulk metal layer 412 may comprise silver with greater than 90 weight percent, and, preferably, greater than 97 weight percent, or the bulk metal layer 412 may comprise platinum with greater than 90 weight percent, and, preferably, greater than 97 weight percent, or the bulk metal layer 412 may comprise palladium with greater than 90 weight percent, and, preferably, greater than 97 weight percent, or the bulk metal layer 412 may comprise rhodium with greater than 90 weight percent, and, preferably, greater than 97 weight percent. The above-mentioned various bumps 260 can be formed with the metal circuit 250 having any one of the structures shown in FIGS. 69-72 and the bumps 265 having any one of the above-mentioned structures.

In this paragraph, the detailed reflowable or solder bump used for the bump 260 as shown in FIGS. 11-68 is discussed. The bump 260 may be formed by sputtering an adhesion/barrier layer 411 on a contact point 135 and then electroplating a bulk metal layer 412 on the adhesion/barrier layer 411, as shown in FIG. 73. The bump 260 may be formed by sputtering titanium, a titanium-tungsten alloy, chromium or a chromium-copper alloy, functioning as an adhesion/barrier layer, on a contact point 135, sputtering a copper layer, functioning as a seed layer, on the adhesion/barrier layer, electroplating another copper layer on the seed layer, electroplating a nickel layer on the top copper layer, and then electroplating a solder layer with a thickness tg between 25 μm and 300 μm, wherein the solder layer may be a tin-lead alloy, a tin-silver-copper alloy, a tin-silver alloy or other solder materials. The above-mentioned various bumps can be formed with the metal circuit 250 having any one of the structures shown in FIGS. 69-72 and the bumps 265 having any one of the above-mentioned structures.

The Package Application

The above-mentioned chip structures in the first and second embodiment is feasible for various package structures. For example, the chip structure can be connected to a flexible printed circuit board or a TAB substrate using a tape automated bonding (TAB) technology. The method for bonding gold bumps to inner leads is Gold-to-Gold eutectic bonding or Gold-to-Tin solder bonding. The inner leads have a gold layer or a tin layer electroplated thereon, which makes the bonding between the inner leads and the gold bumps easily.

The chip structure can be bonded to a glass substrate via an anisotropic conductive paste (ACP) or an anisotropic conductive film (ACF) using a chip-on-glass (COG) package technology. The gold bump of the chip structure can be connected to the thin film substrate using Gold-to-Gold eutectic bonding or Gold-to-Tin solder bonding, which is called chip on film (COF) technology.

The following statements with the associated figures illustrate the chip structures of the first and second embodiments are applied to the above-mentioned package technology.

1. Application to the Tape Automated Bonding (TAB) Package

Figure 74:
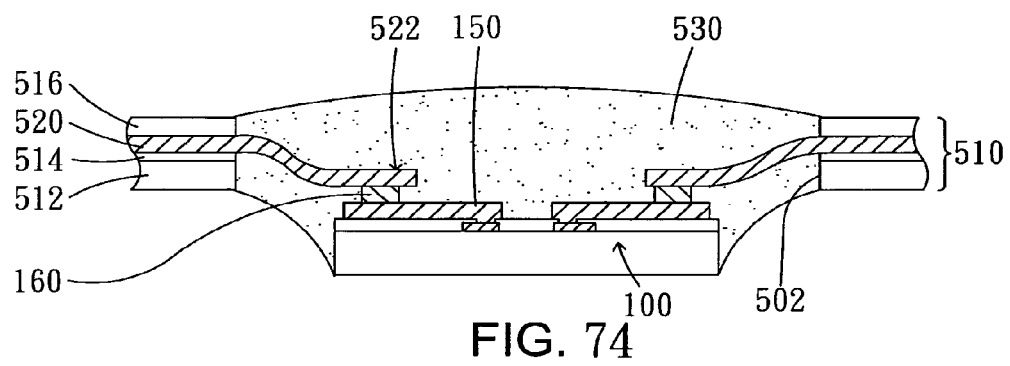
FIGS. 74 and 75 are schematic cross-sectional figures showing a chip structures are applied to the tape automated bonding (TAB) package.
Figure 75:
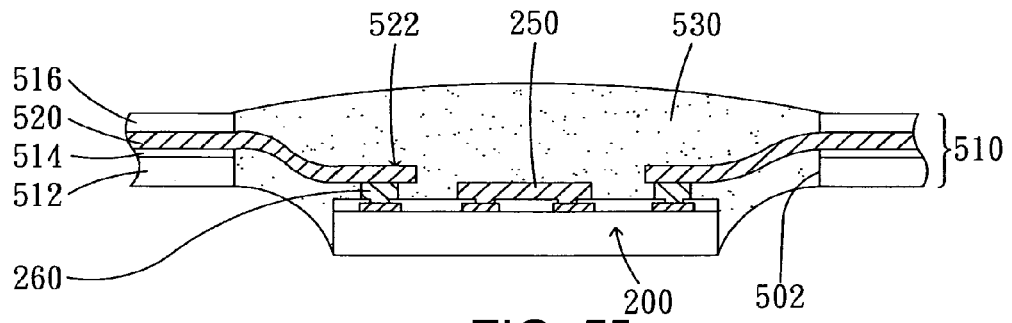

FIGS. 74 and 75 are schematic cross-sectional figures showing the chip structures of the first embodiment and second embodiment are applied to the tape automated bonding (TAB) package. The layout of the metal circuit layers 150 and 250 and the bumps 160 and 260 of the first embodiment and second embodiment can be referred to the above-mentioned. All chip structures 100 and 200 of the first and second embodiments can be applied to the tape automated bonding package technology. The flexible substrate 510 comprises polymer layers 512 and 516, an adhesive layer 514 and multiple connecting circuit lines 520. The connecting circuit lines 520 are attached to the polymer layer 512 via the adhesive layer 514. The polymer layer 516 covers the connecting circuit line 520. The polymer layer 512 is made of polyimide, for example. The connecting circuit lines 520 have multiple inner leads 522 extending in an opening 502 in the flexible substrate 510 and bonded to the bumps 160 or 260 by Gold-to-Gold eutectic bonding, Gold-to-Tin solder bonding or other types of solder bonding. All of the inner leads 522 are simultaneously pressed onto the bumps 160 or 260 after all of the inner leads are respectively aligned with the bumps 160 and 260. After the inner leads 522 of the flexible substrate 510 are bonded to the bumps 160 or 260, a polymer protector 530 covers the inner leads 522 and bumps 160 or 260 to protect the electrical portion between the chip 100 or 200 and the flexible substrate 510.

2. Application to the Chip-On-Glass (COG) Package

Figure 76:
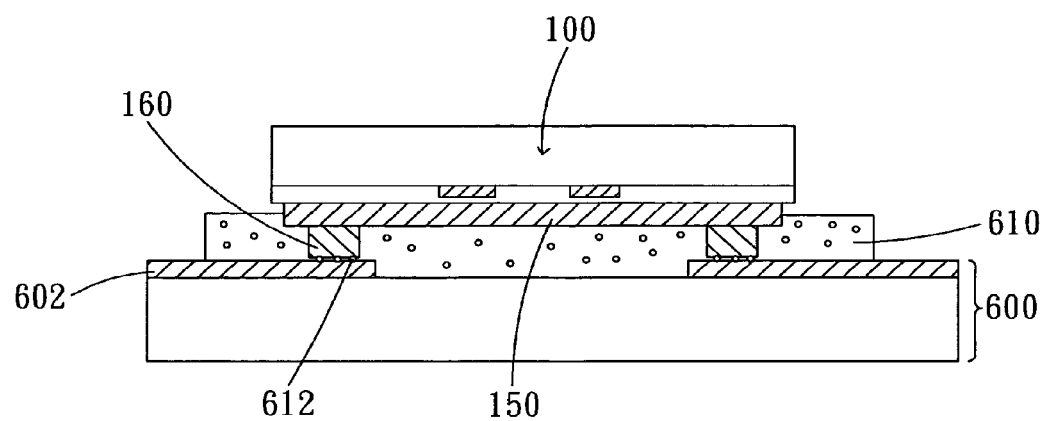
FIGS. 76 and 77 are schematic cross-sectional figures showing a chip structures are applied to the Chip-On-Glass (COG) package.
Figure 77:
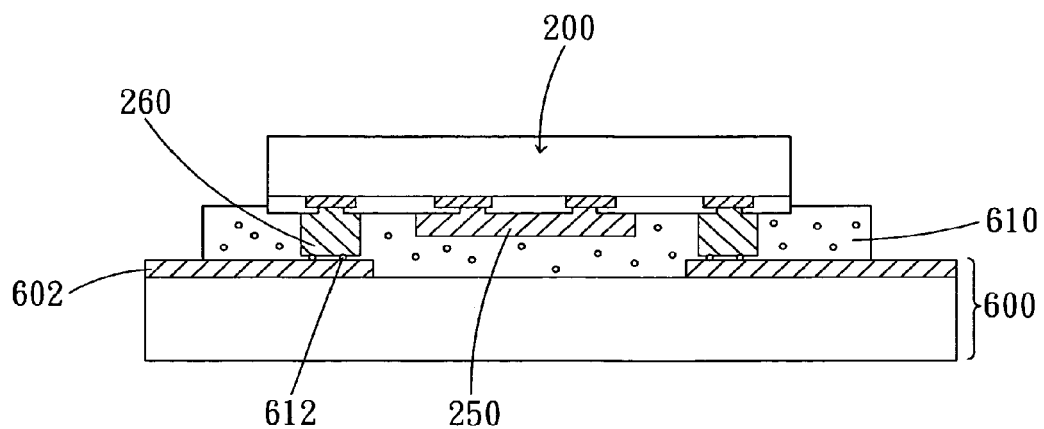

FIGS. 76 and 77 are schematic cross-sectional figures showing the chip structures of the first and second embodiments are applied to the Chip-on-Glass (COG) package. The layout of the metal circuit layers 150 and 250 and the bumps 160 and 260 of the first embodiment and second embodiment can be referred to the above-mentioned. All chip structures 100 and 200 of the first and second embodiments can be applied to the Chip-On-Glass (COG) bonding package technology.

After an anisotropic conductive paste 610 (ACP) or anisotropic conductive film 610 (ACF) is formed on a glass substrate 600, the chip structure 100 or 200 is bonded to the glass substrate 600. The bumps 160 or 260 can be electrically connected to a circuit layer 602 on the glass substrate 600 via the metal particle 612 gathered in the anisotropic conductive paste or film 610 (ACP) or (ACF).

3. Application to the Chip-On-Film (COF) Package

Figure 78:
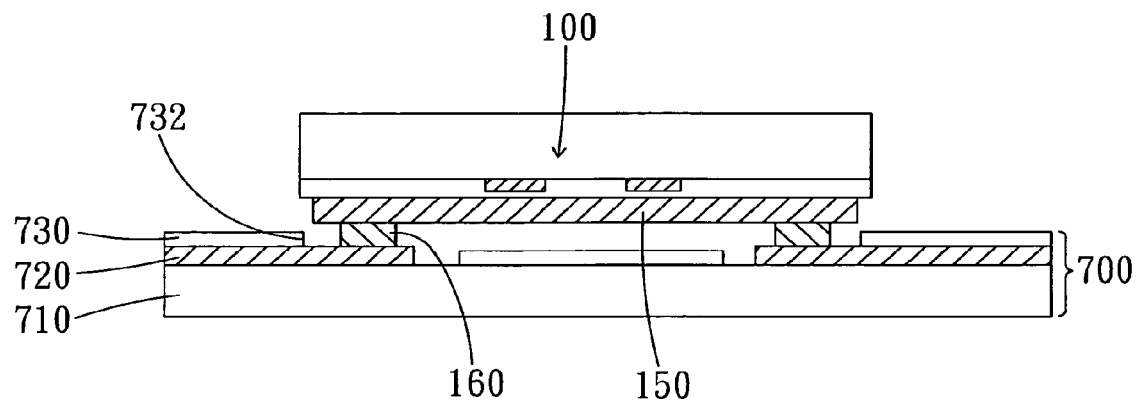
FIGS. 78 and 79 are schematic cross-sectional figures showing chip structures are applied to the Chip-On-Film (COF) package.
Figure 79:
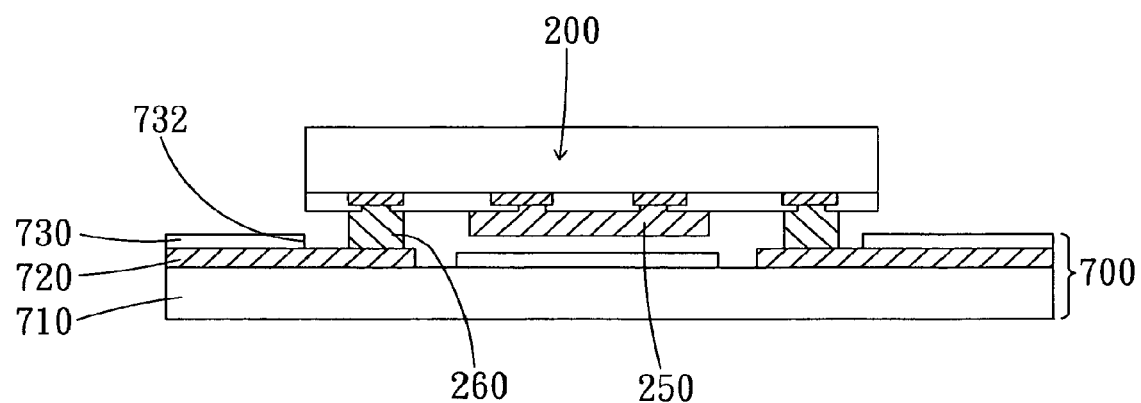

FIGS. 78 and 79 are schematic cross-sectional figures showing the chip structures of the first and second embodiments are applied to the Chip-on-Film (COF) package. The layout of the metal circuit layers 150 and 250 and the bumps 160 and 260 of the first embodiment and second embodiment can be referred to the above-mentioned. All chip structures 100 and 200 of the first and second embodiments can be applied to the Chip-On-Film (COF) bonding package technology.

The thin film substrate 700 comprises polymer layers 710 and 730 and a circuit layer 720. The circuit layer 720 is formed on the polymer layer 710. The polymer layer 730 covers the circuit layer 720. The polymer layer 710 is polyimide, for example. At least an opening 732 in the polymer layer 730 exposes the circuit layer 720. The bumps 160 or 260 formed on the chip structure 100 or 200 can be bonded to the circuit layer 720 exposed by the openings 732 in the polymer layer 730. The bumps 160 or 260 are bonded to the circuit layer 720 by Gold-to-Gold eutectic bonding, Gold-to-Tin solder bonding or other types of solder bonding.

Conclusion

The objective of the invention is to provide a chip structure with a metal circuit layer formed over the passivation layer and functioning as signal transmission, power plane or ground plane, which makes the space over the passivation layer more efficiently.

It will be apparent to those skilled in the art that various modifications and variations can be made to the structure of the present invention without departing from the scope or spirit of the invention. For example, it is possible that the wire-bonding pad is not electrically connected to the testing pad or to the bump pad. In view of the foregoing, it is intended that the present invention cover modifications and variations of this invention provided they fall within the scope of the following claims and their equivalents.

What is claimed is:

1. A circuit component comprising:
a semiconductor chip comprising a semiconductor substrate, a transistor in or on said semiconductor substrate, a first metal interconnect over said semiconductor substrate, a second metal interconnect over said semiconductor substrate, a third metal interconnect over said semiconductor substrate, wherein said first metal interconnect comprises a damascene copper layer, a first insulating layer over said semiconductor substrate, wherein a first opening in said first insulating layer is over a first contact point of said first metal interconnect, and said first contact point is at a bottom of said first opening, wherein a second opening in said first insulating layer is over a second contact point of said second metal interconnect, and said second contact point is at a bottom of said second opening, and wherein a third opening in said first insulating layer is over a third contact point of said third metal interconnect, and said third contact point is at a bottom of said third opening, a fourth metal interconnect on said first and second contact points and over said first insulating layer, wherein said first contact point is connected to said second contact point through said fourth metal interconnect, a second insulating layer over said fourth metal interconnect and said first insulating layer, wherein said second insulating layer contacts a top surface and a sidewall of said fourth metal interconnect, and a metal bump connected to said third contact point through said third opening; and
a glass substrate over said semiconductor chip and said metal bump.

2. The circuit component of claim 1, wherein said metal bump comprises a copper layer.

3. The circuit component of claim 1, wherein said first insulating layer comprises an oxide layer having a thickness between 0.1 and 0.8 micrometers.

4. The circuit component of claim 1, wherein a material of said fourth metal interconnect is different from that of said first metal interconnect.

5. The circuit component of claim 1, wherein said first insulating layer comprises an oxide layer.

6. The circuit component of claim 1, wherein said first insulating layer comprises a nitride layer.

7. The circuit component of claim 1, wherein said first insulating layer comprises an oxide layer and a nitride layer over said oxide layer.

8. The circuit component of claim 1, wherein said second insulating layer comprises a polymer layer.

9. The circuit component of claim 1, wherein said second insulating layer has a top surface lower than that of said metal bump.

10. The circuit component of claim 1, wherein said fourth metal interconnect has a top surface lower than that of said metal bump.

11. The circuit component of claim 1, further comprising a circuit layer under said glass substrate and over said metal bump, wherein said metal bump is connected to said circuit layer.

12. The circuit component of claim 11, further comprising multiple metal particles between said metal bump and said circuit layer.

13. The circuit component of claim 1, further comprising an anisotropic conductive film (ACF) between said semiconductor chip and said glass substrate.

14. The circuit component of claim 1, wherein said metal bump comprises a tin-and-silver-containing alloy.

15. The circuit component of claim 1, wherein said metal bump comprises a gold layer having a thickness between 7 and 100 micrometers.

16. The circuit component of claim 1, wherein said metal bump comprises a copper layer having a thickness between 7 and 100 micrometers.

17. The circuit component of claim 1, wherein said metal bump comprises a tin-containing alloy having a thickness between 25 and 300 micrometers.

18. The circuit component of claim 1, wherein said metal bump comprises a titanium-containing layer and a metal layer on said titanium-containing layer.

19. The circuit component of claim 1, wherein said fourth metal interconnect comprises a gold layer having a thickness between 2 and 30 micrometers.

20. The circuit component of claim 1, wherein said fourth metal interconnect comprises a copper layer having a thickness between 2 and 30 micrometers.

21. The circuit component of claim 1, wherein said fourth metal interconnect comprises a titanium-containing layer and a metal layer on said titanium-containing layer.

* * * * *